US011683038B1

(12) United States Patent
Ahmad et al.

(10) Patent No.: US 11,683,038 B1
(45) Date of Patent: Jun. 20, 2023

(54) ADAPTIVE INTEGRATED PROGRAMMABLE DEVICE PLATFORM

(71) Applicant: Xilinx, Inc., San Jose, CA (US)

(72) Inventors: Sagheer Ahmad, Cupertino, CA (US); Jaideep Dastidar, San Jose, CA (US); Brian C. Gaide, Erie, CO (US); Juan J. Noguera Serra, San Jose, CA (US); Ian A. Swarbrick, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 68 days.

(21) Appl. No.: 17/350,639

(22) Filed: Jun. 17, 2021

Related U.S. Application Data

(63) Continuation of application No. 16/872,009, filed on May 11, 2020, now Pat. No. 11,063,594, which is a continuation of application No. 16/367,108, filed on Mar. 27, 2019, now Pat. No. 10,673,439.

(51) Int. Cl.
*H03K 19/17728* (2020.01)
*H03K 19/17736* (2020.01)
*H03K 19/17704* (2020.01)

(52) U.S. Cl.
CPC . *H03K 19/17728* (2013.01); *H03K 19/17736* (2013.01); *H03K 19/17712* (2013.01)

(58) Field of Classification Search
CPC ....... H03K 19/17728; H03K 19/17736; H03K 19/17712
See application file for complete search history.

(56) References Cited

U.S. PATENT DOCUMENTS

| 10,747,690 B2 | 8/2020 | Bilski |
| 10,838,908 B2 | 11/2020 | Swarbrick et al. |
| 10,853,134 B2 | 12/2020 | Javre |
| 10,893,005 B2 | 1/2021 | Schultz et al. |
| 2003/0102495 A1* | 6/2003 | Huppenthal ........ G06F 15/7867 257/209 |
| 2014/0181458 A1* | 6/2014 | Loh ..................... G06F 12/1027 711/206 |
| 2015/0268982 A1 | 9/2015 | Eisenmann |
| 2018/0088992 A1 | 3/2018 | Davis |
| 2018/0217942 A1 | 8/2018 | Fons |
| 2018/0367147 A1 | 12/2018 | Khor |

(Continued)

FOREIGN PATENT DOCUMENTS

| EP | 2 778 946 A2 | 9/2014 |
| EP | 2 985 914 A2 | 2/2016 |
| EP | 2985914 A2 | 2/2016 |

OTHER PUBLICATIONS

Xilinx AI Engines and Their Applications, Xilinx, Inc., White Paper WP506 (v1 .0.2), Oct. 3, 2018, 13 pg.

(Continued)

*Primary Examiner* — Daniel D Chang
(74) *Attorney, Agent, or Firm* — Kevin T. Cuenot

(57) ABSTRACT

A System-on-Chip includes a first partition configured to implement a first application using of at least a first portion of one or more of a plurality of subsystems of the System-on-Chip and a second partition configured to implement a second application concurrently with the first partition. The second application uses at least a second portion of one or more of the plurality of subsystems. The first partition is isolated from the second partition.

16 Claims, 28 Drawing Sheets

(56) References Cited

U.S. PATENT DOCUMENTS

| | | |
|---|---|---|
| 2019/0044927 A1 | 2/2019 | Sood |
| 2019/0096813 A1 | 3/2019 | Lesea |
| 2019/0196901 A1 | 6/2019 | Arbel |
| 2019/0303323 A1 | 10/2019 | Swarbrick et al. |
| 2019/0303328 A1 | 10/2019 | Balski |
| 2019/0311126 A1 | 10/2019 | Arena |
| 2020/0127981 A1 | 4/2020 | Yang |
| 2021/0081215 A1 | 3/2021 | Schultz |

OTHER PUBLICATIONS

Versal: The First Adaptive Compute Acceleration Platform (ACAP), Xilinx, Inc. White Paper WP505 (v1 .0), Oct. 2, 2018, 21 pg.
Versal Architecture and Product Data Sheet: Overview, Xilinx, Inc., Datasheet DS950 (v1.0), Oct. 2, 2018, 23 pg.

* cited by examiner

1700

| | ID1 | ID2 | ID3 | ID4 | ID5 | ID6 | ID7 | ooo |
|---|---|---|---|---|---|---|---|---|
| 0-0 | xx | xx | xx | xx | xx | xx | xx | ooo |
| 0-1 | xx | xx | xx | xx | xx | xx | xx | ooo |
| 0-2 | xx | xx | xx | xx | xx | xx | xx | ooo |
| 0-3 | xx | xx | xx | xx | xx | xx | xx | ooo |
| 0-4 | xx | xx | xx | xx | xx | xx | xx | ooo |
| 0-5 | xx | xx | xx | xx | xx | xx | xx | ooo |
| 0-6 | xx | xx | xx | xx | xx | xx | xx | ooo |
| 0-7 | xx | xx | xx | xx | xx | xx | xx | ooo |
| 1-0 | xx | xx | xx | xx | xx | xx | xx | ooo |
| 1-1 | xx | xx | xx | xx | xx | xx | xx | ooo |
| 1-2 | xx | xx | xx | xx | xx | xx | xx | ooo |
| 1-3 | xx | xx | xx | xx | xx | xx | xx | ooo |
| 1-4 | xx | xx | xx | xx | xx | xx | xx | ooo |
| 1-5 | xx | xx | xx | xx | xx | xx | xx | ooo |
| 1-6 | xx | xx | xx | xx | xx | xx | xx | ooo |
| ooo | ooo | ooo | ooo | ooo | ooo | ooo | ooo | ooo |

FIG. 17

ADAPTIVE INTEGRATED PROGRAMMABLE DEVICE PLATFORM

TECHNICAL FIELD

This disclosure relates to integrated circuits (ICs) and, more particularly, to an integrated programmable device platform that provides different heterogeneous subsystems.

BACKGROUND

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs).

Modern programmable ICs have evolved to include programmable logic in combination with one or more other subsystems. For example, some programmable ICs have evolved into System-on-Chips or "SoCs" that include both programmable logic and a hardwired processor. Other varieties of programmable ICs include additional and/or different subsystems.

SUMMARY

A device can include programmable logic circuitry, a processor system coupled to the programmable logic circuitry, and a network-on-chip. The network-on-chip is coupled to the programmable logic circuitry and the processor system. The network-on-chip is programmable to establish user specified data paths communicatively linking a circuit block implemented in the programmable logic circuitry and the processor system. The device can include a platform management controller that configures the programmable logic circuitry, the network-on-chip, and the processor system.

A method can include providing a device including programmable logic circuitry, a processor system coupled to the programmable logic circuitry, and a network-on-chip coupled to the programmable logic circuitry and the processor system. The network-on-chip is programmable to establish user specified data paths communicatively linking a circuit block implemented in the programmable logic circuitry and the processor system. The method can include configuring the programmable logic circuitry, the network-on-chip, and the processor system using a platform management controller disposed in the device.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 17 illustrates an example table used by the NoC.

DETAILED DESCRIPTION

Figure 1:
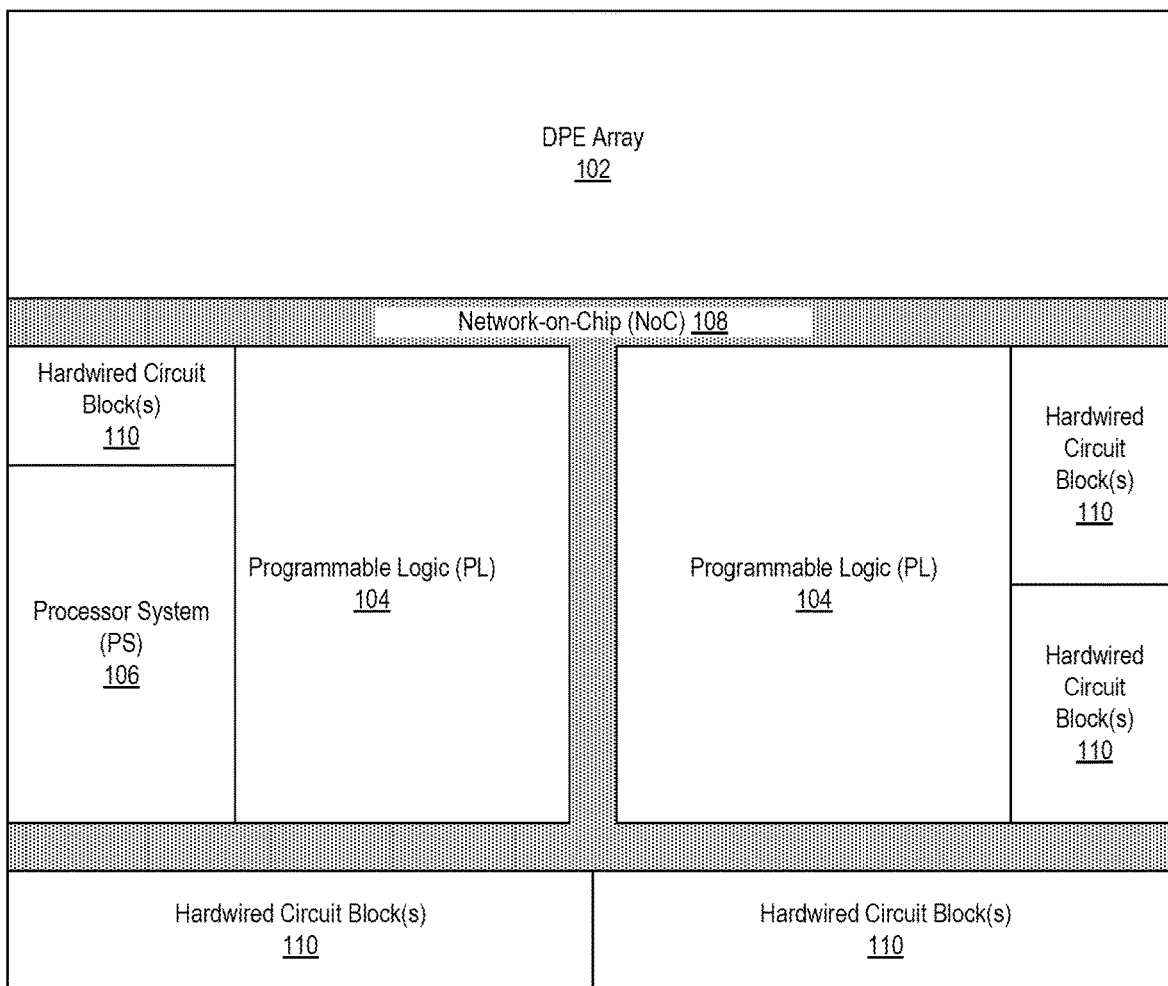
FIG. 1 illustrates an example architecture for a System-on-Chip (SoC) type of integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to an integrated programmable device platform (platform) that provides different heterogeneous subsystems. The platform leverages the various subsystems described to provide numerous benefits. For example, the platform is capable of leveraging the area and power efficiency of fixed-function components (e.g., application-specific integrated circuits or "ASICs"), the flexibility and functionality of programmable logic, extends that flexibility to the fixed-function components, and provides services that are common to both the fixed-function components and the programmable logic.

The platform is capable of extending the flexibility of the fixed-function components by providing a common infrastructure within the device that may be shared and used among the different subsystems. This common infrastructure is capable of providing functions including, but not limited to, data pathways, firewalling, interrupts and doorbell pathways, performance monitors, and configuration. The different subsystems can be implemented so that circuit blocks within these different subsystems, when implemented as part of a user application, are capable of using a standard interface that is configured to connect to and leverage the common infrastructure.

The common infrastructure increases flexibility, functionality, area efficiency, power efficiency, and performance of the device despite the heterogeneity of the various subsystems included therein. Unused platform resources of the common infrastructure for one component may be applied to another component in the platform. As an example, unused Network-on-Chip (NoC) buffers, virtual channels, and physical pathways allocated to a set of unused components of the platform may be allocated to another set of components that are used by the use's application in the platform. Further, the platform allows any of the various components of the device to utilize the common infrastructure to access subsystems such as the programmable logic.

In another aspect, a particular function may be rapidly remapped from one component of the platform to another component or subsystem in the platform. As an example, a standard cryptography acceleration function, e.g., Advanced Encryption Standard Galois/Counter mode (AES-GCM), may be implemented using programmable logic. The function may be remapped, e.g., or moved, to another device such as a hardwired or hardened cryptography accelerator block. This remapping frees up resources in the programmable logic and adds to flexibility in the device. The terms "hardwired" and "hardened" are used interchangeably within this disclosure.

The remapping is facilitated, at least in part, by the common infrastructure. The common infrastructure may include common interfaces to both the circuit blocks implemented in the programmable logic and the hardwired circuit blocks. The common infrastructure allows attributes of the function such as communication pathways, data pathways, and interrupt pathways to be maintained despite the remapping of the function from one subsystem to another. Any other components within the platform that interact with the cryptography acceleration function, despite where implemented, are prevented from unauthorized access to components through firewalling. As an example, the other components are not able to access or view unencrypted data or the encryption keys used by the cryptography acceleration function. Firewalling may also be used to prevent unauthorized components from accessing or viewing encrypted data. The other components in the platform may continue operating in the same manner despite any remapping of the cryptographic acceleration function. The remapping of one function of an application to be implemented in the platform does not require remapping of all components and/or functions of the application across the platform.

The platform also supports the creation of a plurality of different partitions in the device concurrently. Each partition may implement a different application therein. Each partition, and the application executing therein, may be isolated from each other partition in the platform. The term "application", as used herein in reference to the platform and example SoC(s) described herein, refers to any data, whether executable program code, configuration bitstreams, register programming data, or other images used to configure the SoC or a portion thereof (e.g., the entire device or a partition thereof). The partitioning described also supports multi-client or multi-tenant use cases where different applications corresponding to the same end user or different end users may execute in the device concurrently each in a different partition. The platform allows any of the various components of the device to utilize the common infrastructure to access subsystems such as the programmable logic.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example architecture for a System-on-Chip (SoC) 100. SoC 100 is an example of a programmable IC and an integrated programmable device platform. In the example of FIG. 1, the various, different subsystems or regions of the SoC 100 illustrated may be implemented on a single die provided within a single integrated package. In other examples, the different subsystems may be implemented on a plurality of interconnected dies provided as a single, integrated package.

In the example, the SoC 100 includes a plurality of regions having circuitry with different functionalities. In the example, the SoC 100 optionally includes a data processing engine (DPE) array 102. SoC 100 includes programmable logic (PL) regions 104 (hereafter PL region(s) or PL), a processing system (PS) 106, a Network-on-Chip (NoC) 108, and one or more hardwired circuit blocks 110. DPE array 102 is implemented as a plurality of interconnected, hardwired, and programmable processors having an interface to the other regions of the SoC 100.

PL 104 is circuitry that may be programmed to perform specified functions. As an example, PL 104 may be implemented as field programmable gate array type of circuitry. PL 104 can include an array of programmable circuit blocks. Examples of programmable circuit blocks within PL 104 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 104 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 106 is implemented as hardwired circuitry that is fabricated as part of the SoC 100. The PS 106 may be implemented as, or include, any of a variety of different processor types each capable of executing program code. For example, PS 106 may be implemented as an individual processor, e.g., a single core capable of executing program code. In another example, PS 106 may be implemented as a multi-core processor. In still another example, PS 106 may include one or more cores, modules, co-processors, interfaces, and/or other resources. PS 106 may be implemented using any of a variety of different types of architectures. Example architectures that may be used to implement PS 106 may include, but are not limited to, an ARM processor architecture, an x86 processor architecture, a GPU architecture, a mobile processor architecture, a DSP architecture, or other suitable architecture that is capable of executing computer-readable instructions or program code.

NoC 108 includes an interconnecting network for sharing data between endpoint circuits in SoC 100. The endpoint circuits can be disposed in DPE array 102, PL regions 104, PS 106, and/or in hardwired circuit blocks 110-118. NoC 108 can include high-speed data paths with dedicated switching. In an example, NoC 108 includes horizontal paths, vertical paths, or both horizontal and vertical paths. The arrangement and number of regions shown in FIG. 1 is merely an example. The NoC 108 is an example of the common infrastructure that is available within the SoC 100 to connect selected components and/or subsystems.

NoC 108 provides connectivity to PL 104, PS 106, and to selected ones of the hardwired circuit blocks 110. NoC 108 is programmable. In the case of a programmable NoC used with other programmable circuitry, the nets that are to be routed through NoC 108 are unknown until a user circuit design is created for implementation within the SoC 100. NoC 108 may be programmed by loading configuration data into internal configuration registers that define how elements within NoC 108 such as switches and interfaces are configured and operate to pass data from switch to switch and among the NoC interfaces.

NoC 108 is fabricated as part of the SoC 100 and while not physically modifiable, may be programmed to establish connectivity between different master circuits and different slave circuits of a user circuit design. NoC 108, for example, may include a plurality of programmable switches that are capable of establishing packet switched network connecting user specified master circuits and slave circuits. In this regard, NoC 108 is capable of adapting to different circuit designs, where each different circuit design has different combinations of master circuits and slave circuits implemented at different locations in the SoC 100 that may be coupled by NoC 108. NoC 108 may be programmed to route data, e.g., application data and/or configuration data, among the master and slave circuits of the user circuit design. For example, NoC 108 may be programmed to couple different user-specified circuitry implemented within PL 104 with PS 106, and/or DPE array 102, with different hardwired circuit blocks, and/or with different circuits and/or systems external to the SoC 100.

The hardwired circuit blocks 110 may include input/output (I/O) blocks, and/or transceivers for sending and receiving signals to circuits and/or systems external to SoC 100, memory controllers, or the like. Examples of different I/O blocks may include single-ended and pseudo differential I/Os and high-speed differentially clocked transceivers. Further, the hardwired circuit blocks 110 may be implemented to perform specific functions. Examples of hardwired circuit blocks 110 include, but are not limited to, cryptographic engines, digital-to-analog converters, analog-to-digital converters, and the like. The hardwired circuit blocks 110 within the SoC 100 may be referred to herein from time-to-time as application-specific blocks.

In the example of FIG. 1, PL 104 is shown in two separate regions. In another example, PL 104 may be implemented as a unified region of programmable circuitry. In still another example, PL 104 may be implemented as more than two different regions of programmable circuitry. The particular organization of PL 104 is not intended as a limitation. In this regard, SoC 100 includes one or more PL regions 104, PS 106, and NoC 108. DPE array 102 may be optionally included.

In other example implementations, the SoC 100 may include two or more DPE arrays 102 located in different regions of the IC. In still other examples, the SoC 100 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

Figure 2:
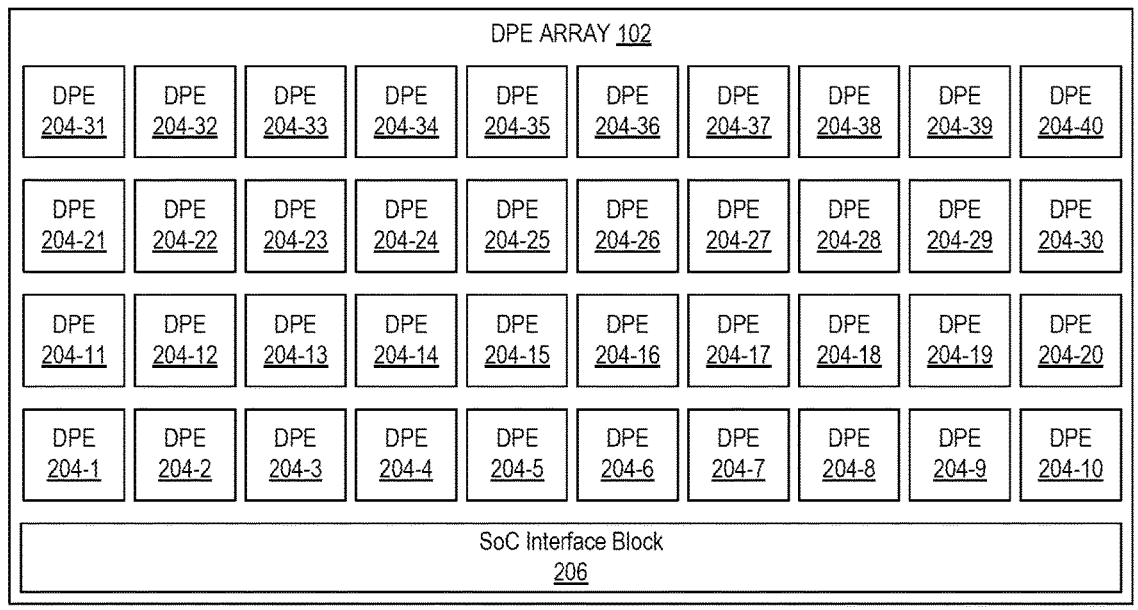
FIG. 2 illustrates an example implementation of a data processing engine (DPE) array for the SoC of FIG. 1.

FIG. 2 illustrates an example implementation of DPE array 102. In the example of FIG. 2, DPE array 102 is implemented as a two-dimensional array of DPEs 204 that includes SoC interface block 206, DPE array 102 may be implemented using any of a variety of different architectures to be described herein in greater detail below. For purposes of illustration and not limitation, FIG. 2 illustrates DPEs 204 arranged in aligned rows and aligned columns. In other embodiments, however, DPEs 204 may be arranged where DPEs in selected rows and/or columns are horizontally inverted or flipped relative to DPEs in adjacent rows and/or columns. In one or more other embodiments, rows and/or columns of DPEs may be offset relative to adjacent rows and/or columns. One or more or all DPEs 204 may be implemented to include a one or more cores each capable of executing program code. The number of DPEs 204, particular arrangement of DPEs 204, and/or orientation of DPEs 204 is not intended to be limiting.

SoC interface block 206 is capable of coupling DPEs 204 to one or more other subsystems of device IC 200. In one or more embodiments, SoC interface block 206 is coupled to adjacent DPEs 204. For example, SoC interface block 206 may be directly coupled to each DPE 204 in the bottom row of DPEs in DPE array 202. In illustration, SoC interface block 206 may be directly connected to DPE 204-1, 204-2, 204-3, 2044, 204-5, 204-6, 204-7, 204-8, 204-9, and 204-10.

FIG. 2 is provided for purposes of illustration. In other embodiments, SoC interface block 206 may be located at the top of DPE array 202, to the left of DPE array 202 (e.g., as a column), to the right of DPE array 202 (e.g., as a column), or at multiple locations in and around DPE array 202 (e.g., as one or more intervening rows and/or columns within DPE array 202). Depending on the layout and location of SoC interface block 206, the particular DPEs coupled to SoC interface block 206 may vary.

For purposes of illustration, if SoC interface block 206 is located to the left of DPEs 204, SoC interface block 206 may be directly coupled to the left column of DPEs including DPE 204-1, DPE 204-11, DPE 204-21, and DPE 204-31. If SoC interface block 206 is located to the right of DPEs 204, SoC interface block 206 may be directly coupled to the right column of DPEs including DPE 204-10, DPE 204-20, DPE 204-30, and DPE 204-40. If SoC interface block 206 is located at the top of DPEs 204, SoC interface block 206 may be coupled to the top row of DPEs including DPE 204-31, DPE 204-32, DPE 204-33, DPE 204-34, DPE 204-36, DPE 204-36, DPE 204-37, DPE 204-38, DPE 204-39, and DPE 204.40. If SoC interface block 206 is located at multiple locations, the particular DPEs that are directly connected to SoC interface block 206 may vary, For example, if SoC interface block is implemented as a row and/or column within DPE array 202, the DPEs that are directly coupled to SoC interface block 206 may be those that are adjacent to SoC interface block 206 on one or more or each side of SoC interface block 206.

DPEs 204 are interconnected by DPE interconnects (not shown), which, when taken collectively, form a DPE interconnect network. As such, SoC interface block 206 is capable of communicating with any DPE 204 of DPE array 102 by communicating with one or more selected DPEs 204 of DPE array 102 directly connected to SoC interface block 206 and utilizing the DPE interconnect network formed of DPE interconnects implemented within each respective DPE 204.

SoC interface block 206 is capable of coupling each DPE 204 within DPE array 102 with one or more other subsystems of SoC 100. For example, SoC interface block 206 is capable of coupling to DPE array 102 to the NoC 108 and PL 104. As such, the DPE array 102 is capable of communicating with circuit blocks implemented in PL 104, the PS 106, and/or any of the hardwired circuit blocks 110. For example, SoC interface block 206 is capable of establishing connections between selected DPEs 204 and PL 104. SoC interface block 206 is also capable of establishing connections between selected DPEs 204 and NoC 108. Through NoC 108, the selected DPEs 204 are capable of communicating with PS 106 and/or hardwired circuit blocks 110. Selected DPEs 204 are capable of communicating with hardwired circuit blocks 110 via SoC interface block 206 and PL 104. In particular embodiments. SoC interface block 206 may be coupled directly to one or more subsystems of SoC 100. For example, SoC interface block 206 may be coupled directly to PS 106 and/or to other hardwired circuit blocks 110. In particular embodiments, hardwired circuit blocks 110 may be considered examples of ASICs.

In one or more embodiments, DPE array 102 includes a single clock domain. Other subsystems such as NoC 108, PL 104, PS 106, and the various hardwired circuit blocks 110 may be in one or more separate or different clock domain(s). Still, DPE array 102 may include additional clocks that may be used for interfacing with other ones of the subsystems. In particular embodiments, SoC interface block 206 includes a clock signal generator that is capable of generating one or more clock signals that may be provided or distributed to DPEs 204 of DPE array 102.

DPE array 102 may be programmed by loading configuration data into internal configuration memory cells (also referred to herein as "configuration registers") that define connectivity among DPEs 204 and SoC interface block 206 and how DPEs 204 and SoC interface block 206 operate. For example, for a particular DPE 204 or group of DPEs 204 to communicate with a subsystem, the DPE(s) 204 and SoC interface block 206 are programmed to do so. Similarly, for one or more particular DPEs 204 to communicate with one or more other DPEs 204, the DPEs are programmed to do so. DPE(s) 204 and SoC interface block 206 may be programmed by loading configuration data into configuration registers within DPE(s) 204 and SoC interface block 206, respectively. In another example, the clock signal generator, being part of SoC interface block 206, may be programmable using configuration data to vary the clock frequencies provided to DPE array 102.

Figure 3:
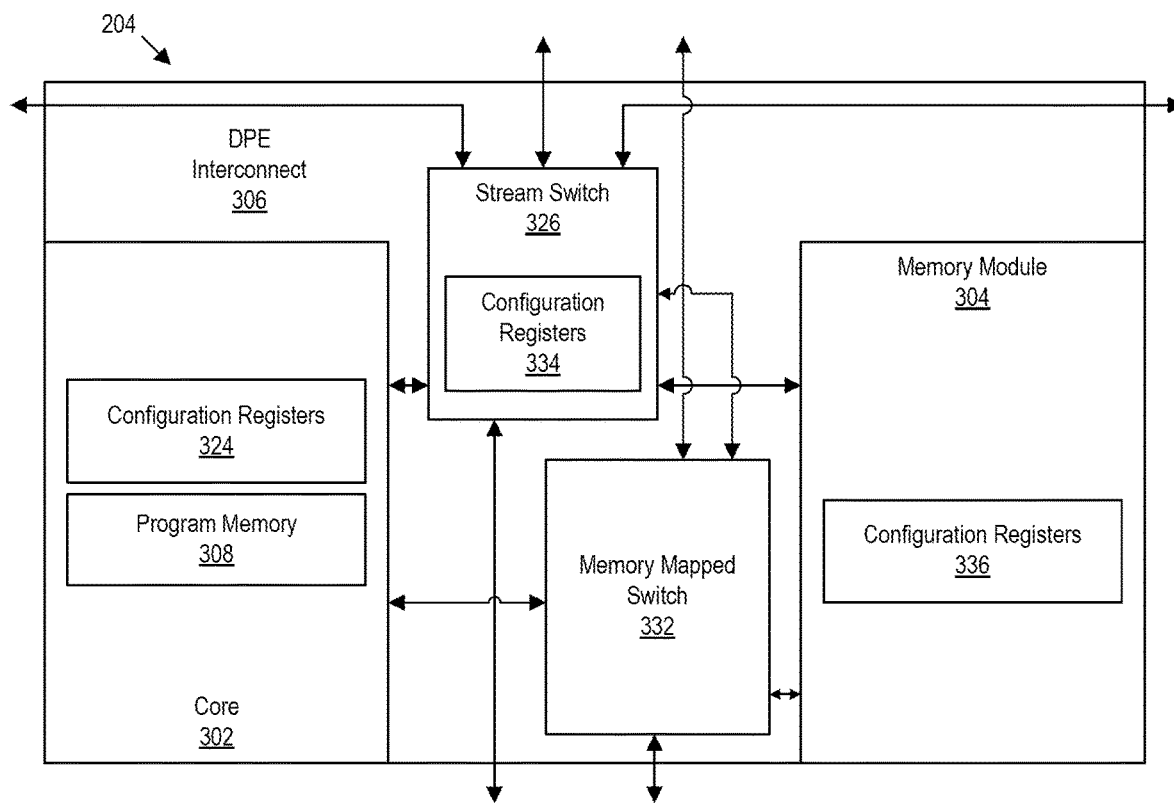
FIG. 3 illustrates an example architecture for a DPE of the DPE array of FIG. 2.

FIG. 3 illustrates an example architecture for a DPE 204 of DPE array 102 of FIG. 2. In the example of FIG. 3, DPE 204 includes a core 302, a memory module 304, and DPE interconnect 306. Each DPE 204 is Implemented as a hardwired and programmable circuit block on the SoC 100.

Core 302 provides the data processing capabilities of DPE 204. Core 302 may be implemented as any of a variety of different processing circuits. In the example of FIG. 3, core 302 includes an optional program memory 308. In an example implementation, core 302 is implemented as a processor that is capable of executing program code, e.g., computer readable instructions. In that case, program memory 308 is included and is capable of storing instructions that are executed by core 302. Core 302, for example, may be implemented as a CPU, a GPU, a DSP, a vector processor, or other type of processor that is capable of executing instructions. Core 302 may be implemented using any of the various CPU and/or processor architectures described herein. In another example, core 302 is implemented as a very long instruction word (VLIW) vector processor or DSP.

In particular implementations, program memory 308 is implemented as a dedicated program memory that is private to core 302 (e.g., accessed exclusively by core 302). Program memory 308 may only be used by the core of the same DPE 204. Thus, program memory 308 may only be accessed by core 302 and is not shared with any other DPE or component of another DPE. Program memory 308 may include a single port for read and write operations. Program memory 308 may support program compression and is addressable using the memory mapped network portion of DPE interconnect 306 described in greater detail below. Via the memory mapped network of DPE interconnect 306, for example, program memory 308 may be loaded with program code that may be executed by core 302.

Core 302 may include configuration registers 324. Configuration registers 324 may be loaded with configuration data to control operation of core 302. In one or more embodiments, core 302 may be activated and/or deactivated based upon configuration data loaded into configuration registers 324. In the example of FIG. 3, configuration registers 324 are addressable (e.g., may be read and/or written) via the memory mapped network of DPE interconnect 306 described in greater detail below.

In one or more embodiments, memory module 304 is capable of storing data that is used by and/or generated by core 302. For example, memory module 304 is capable of storing application data. Memory module 304 may include a read/write memory such as a random-access memory (RAM). Accordingly, memory module 304 is capable of storing data that may be read and consumed by core 302. Memory module 304 is also capable of storing data (e.g., results) that are written by core 302.

In one or more other embodiments, memory module 304 is capable of storing data, e.g., application data, that may be used by and/or generated by one or more other cores of other DPEs within the DPE array. One or more other cores of DPEs may also read from and/or write to memory module 304. In particular embodiments, the other cores that may read from and/or write to memory module 304 may be cores of one or more neighboring DPEs. Another DPE that shares a border or boundary with DPE 204 (e.g., that is adjacent) is said to be a "neighboring" DPE relative to DPE 204. By allowing core 302 and one or more other cores from neighboring DPEs to read and/or write to memory module 304, memory module 304 implements a shared memory that supports communication among the different DPEs and/or cores capable of accessing memory module 304.

Referring to FIG. 2, for example, DPEs 204-14, 204-16, 204-5, and 204-25 are considered neighboring DPEs of DPE 204-15. In one example, the core within each of DPEs 204-16, 204-5, and 204-25 is capable of reading and writing to the memory module within DPE 204-15. In particular embodiments, only those neighboring DPEs that are adjacent to the memory module may access the memory module of DPE 204-15. For example, DPE 204-14, while adjacent to DPE 204-15, may not be adjacent to the memory module of DPE 204-15 since the core of DPE 204-15 may be located between the core of DPE 204-14 and the memory module of DPE 204-15. As such, in particular embodiments, the core of DPE 204-14 may not access the memory module of DPE 204-15.

In particular embodiments, whether a core of a DPE is able to access the memory module of another DPE depends upon the number of memory interfaces included in the memory module and whether such cores are connected to an available one of the memory interfaces of the memory module. In the example above, the memory module of DPE 204.15 includes four memory interfaces, where the core of each of DPEs 204-16, 204-5, and 204-25 is connected to such a memory interface. Core 302 within DPE 204-15 itself is connected to the fourth memory interface. Each memory interface may include one or more read and/or write channels. In particular embodiments, each memory interface includes multiple read channels and multiple write channels so that the particular core attached thereto is capable of reading and/or writing to multiple banks within memory module 304 concurrently.

In other examples, more than four memory interfaces may be available. Such other memory interfaces may be used to allow DPEs on a diagonal to DPE 204-15 to access the memory module of DPE 204-15. For example, if the cores in DPEs such as DPEs 204-14, 204-24, 204-26, 204-4, and/or 204-6 are also coupled to an available memory interface of the memory module in DPE 204-15, such other DPEs would also be capable of accessing the memory module of DPE 204-15.

Memory module 304 may include configuration registers 336. Configuration registers 336 may be loaded with configuration data to control operation of memory module 304. In the example of FIG. 3, configuration registers 336 (and 324) are addressable (e.g., may be read and/or written) via the memory mapped network of DPE interconnect 306 described in greater detail below.

In the example of FIG. 3, DPE interconnect 306 is specific to DPE 204. DPE interconnect 306 facilitates various operations including communication between DPE 204 and one or more other DPEs of DPE array 102 and/or communication with other subsystems of the SoC 100. DPE interconnect 306 further enables configuration, control, and debugging of DPE 204.

In particular embodiments, DPE interconnect 306 is implemented as an on-chip interconnect. An example of an on-chip interconnect is an Advanced Microcontroller Bus Architecture (AMBA) eXtensible Interface (AXI) bus (e.g., or switch). An AMBA AXI bus is an embedded microcontroller bus interface for use in establishing on-chip connections between circuit blocks and/or systems. An AXI bus is provided herein as an example of interconnect circuitry that may be used with the inventive arrangements described within this disclosure and, as such, is not intended as a limitation. Other examples of interconnect circuitry may include other types of buses, crossbars, and/or other types of switches.

In one or more embodiments. DPE interconnect 306 includes two different networks. The first network is capable of exchanging data with other DPEs of DPE array 102 and/or other subsystems of the SoC 100. For example, the first network is capable of exchanging application data. The second network is capable of exchanging data such as configuration, control, and/or debugging data for the DPE (s).

In the example of FIG. 3, the first network of DPE interconnect 306 is formed of stream switch 326 and one or more stream interfaces (not shown). For example, stream switch 326 includes a stream interface for connecting to each of core 302, memory module 304, memory mapped switch 332, a DPE above, a DPE to the left, a DPE to the right, and a DPE below. Each stream interface may include one or more masters and one or more slaves.

Stream switch 326 is capable of allowing non-neighboring DPEs and/or DPEs that are not coupled to a memory interface of memory module 304 to communicate with core 302 and/or memory module 304 via the DPE interconnect network formed by the DPE interconnects of the respective DPEs 204 of DPE array 102.

Referring again to FIG. 2 and using DPE 204-15 as a point of reference, stream switch 326 is coupled to, and capable of, communicating with another stream switch located in the DPE interconnect of DPE 204-14. Stream switch 326 is coupled to, and capable of, communicating with another stream switch located in the DPE interconnect of DPE 204-25. Stream switch 326 is coupled to, and capable of, communicating with another stream switch located in the DPE interconnect of DPE 204-16. Stream switch 326 is coupled to, and capable of, communicating with another stream switch located in the DPE interconnect of DPE 204-5. As such, core 302 and/or memory module 304 are also capable of communicating with any of the DPEs within DPE array 102 via the DPE interconnects in the DPEs.

Stream switch 326 may also be used to interface to subsystems such as PL 104 and/or NoC 108. In general, stream switch 326 is programmed to operate as a circuit-switching stream interconnect or a packet-switched stream interconnect. A circuit-switching stream interconnect is capable of implementing point-to-point, dedicated streams that are suitable for high-bandwidth communication among DPEs. A packet-switching stream interconnect allows streams to be shared to time-multiplex multiple logical streams onto one physical stream for medium bandwidth communication.

Stream switch 326 may include configuration registers (abbreviated as "CR" in FIG. 3) 334. Configuration data may be written to configuration registers 334 by way of the memory mapped network of DPE interconnect 306. The configuration data loaded into configuration registers 334 dictates which other DPEs and/or subsystems (e.g., NoC 108, PL 104, and/or PS 106) DPE 204 will communicate with and whether such communications are established as circuit-switched point-to-point connections or as packet-switched connections.

The second network of DPE interconnect 306 is formed of memory mapped switch 332. Memory mapped switch 332 includes a plurality of memory mapped interfaces (not shown). Each memory mapped interface may include one or more masters and one or more slaves. For example, memory mapped switch 332 includes a memory mapped interface for connecting to each of core 302, memory module 304, the memory mapped switch in the DPE above DPE 204, and the memory mapped switch in the DPE below DPE 204.

Memory mapped switch 332 is used to convey configuration, control, and debugging data for DPE 204. In the example of FIG. 3, memory mapped switch 332 is capable of receiving configuration data that is used to configure DPE 204. Memory mapped switch 332 may receive configuration data from a DPE located below of DPE 204 and/or from SoC interface block 206. Memory mapped switch 332 is capable of forwarding received configuration data to one or more other DPEs above DPE 204, to core 302 (e.g., to program memory 308 and/or to configuration registers 324), to memory module 304 (e.g., to memory within memory module 304 and/or to configuration registers 336), and/or to configuration registers 334 within stream switch 326.

DPE interconnect 306 is coupled to the DPE Interconnect of each neighboring DPE and/or SoC interface block 206 depending upon the location of DPE 204. Taken collectively, DPE interconnects of DPEs 204 form a DPE interconnect network (which may include the stream network and/or the memory mapped network). The configuration registers of the stream switches of each DPE may be programmed by loading configuration data through the memory mapped switches. Through configuration, the stream switches and/or stream interfaces are programmed to establish connections, whether packet-switched or circuit-switched, with other endpoints, whether in one or more other DPEs 204 and/or in SoC interface block 206.

In one or more embodiments. DPE array 102 is mapped to the address space of a processor system such as PS 106. Accordingly, any configuration registers and/or memories within DPE 204 may be accessed via a memory mapped interface. For example, memory in memory module 304, program memory 308, configuration registers 324 in core 302, configuration registers 336 in memory module 304, and/or configuration registers 334 may be read and/or written via memory mapped switch 332.

In the example of FIG. 3, memory mapped interfaces are capable of receiving configuration data for DPE 204. The configuration data may include program code that is loaded into program memory 308 (if included), configuration data for loading into configuration registers 324, 334, and/or 336, and/or data to be loaded into memory (e.g., memory banks) of memory module 304. In the example of FIG. 3, configuration registers 324, 334, and 336 are shown as being located within the particular circuit structures that the configuration registers are intended to control, e.g., core 302, stream switch 326, and memory module 304. The example of FIG. 3 is for purposes of illustration only and illustrates that elements within core 302, memory module 304, and/or stream switch 326 may be programmed by way of loading configuration data into the corresponding configuration registers. In other embodiments, the configuration registers may be consolidated within a particular region of DPE 204 despite controlling operation of components distributed throughout DPE 204.

Accordingly, stream switch 326 may be programmed by loading configuration data into configuration registers 334. The configuration data programs stream switch 326 to operate in a circuit-switching mode between two different DPEs and/or other subsystems or in a packet-switching mode between selected DPEs and/or other subsystems. Thus, connections established by stream switch 326 to other stream interfaces and/or switches are programmed by loading suitable configuration data into configuration registers 334 to establish actual connections or application data paths within DPE 204, with other DPEs, and/or with other subsystems of IC 300.

Figure 4:
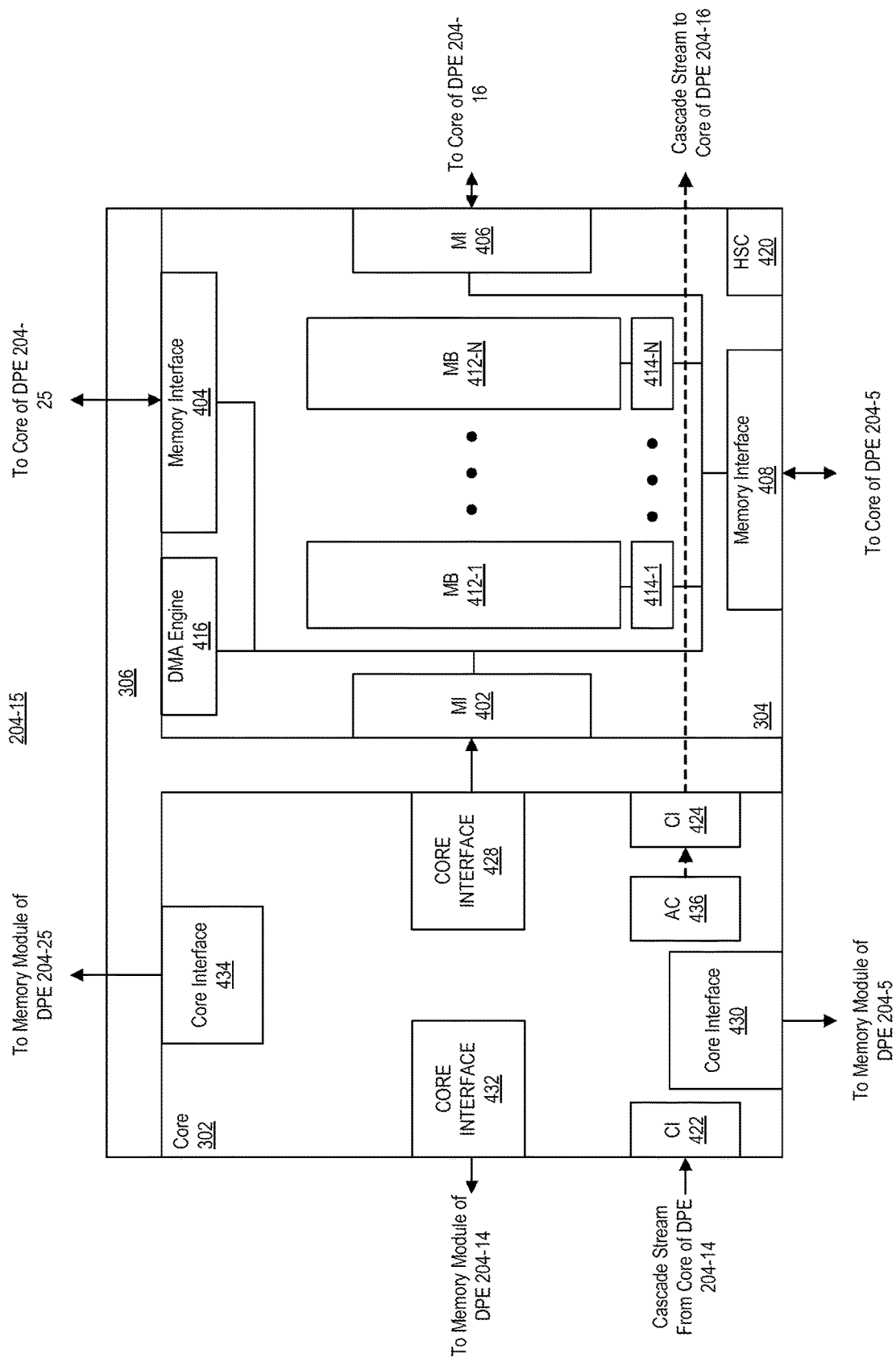
FIG. 4 illustrates further aspects of the example architecture of FIG. 3.

FIG. 4 illustrates further aspects of the example architecture of FIG. 3. In the example of FIG. 4, details relating to DPE interconnect 306 are not shown. FIG. 4 illustrates connectivity of core 302 with other DPEs through shared memory. FIG. 4 also illustrates additional aspects of memory module 304. For purposes of illustration, FIG. 4 refers to DPE 204-15.

As pictured, memory module 304 includes a plurality of memory interfaces 402, 404, 406, and 408. Within FIG. 4, memory interfaces 402 and 408 are abbreviated as "MI." Memory module 304 further includes a plurality of memory banks 412-1 to 412-N. In particular embodiments, memory module 304 includes eight memory banks. In other embodiments, memory module 304 may include fewer or more memory banks 412. In one or more embodiments, each memory bank 412 is single-ported thereby allowing up to one access to each memory bank each clock cycle. In the case where memory module 304 includes eight memory banks 412, such a configuration supports eight parallel accesses each clock cycle. In other embodiments, each memory bank 412 is dual-ported or multi-ported thereby allowing a larger number of parallel accesses each clock cycle.

In the example of FIG. 4, each of memory banks 412-1 through 412-N has a respective arbiter 414-1 through 414-N. Each arbiter 414 is capable of generating a stall signal in response to detecting conflicts. Each arbiter 414 may include arbitration logic. Further, each arbiter 414 may include a crossbar. Accordingly, any master is capable of writing to any particular one or more of memory banks 412. As noted in connection with FIG. 3, memory module 304 is connected to memory mapped switch 332 thereby facilitating reading and writing of data to memory bank 412. As such, the particular data stored in memory module 304 may be controlled. e.g., written, as part of a configuration, control, and/or debugging process through memory mapped switch 332.

Memory module 304 further includes a direct memory access (DMA) engine 416. In one or more embodiments, DMA engine 416 includes at least two interfaces. For example, one or more interfaces are capable of receiving input data streams from DPE interconnect 306 and writing the received data to memory banks 412. One or more other interfaces are capable of reading data from memory banks 412 and sending the data out via a stream interface (e.g., a stream switch) of DPE interconnect 306. For example, DMA engine 416 may include stream interface for accessing stream switch 326 of FIG. 3.

Memory module 304 is capable of operating as a shared memory that may be accessed by a plurality of different DPEs. In the example of FIG. 4, memory interface 402 is coupled to core 302 via core interface 428 included in core 302. Memory interface 402 provides core 302 with access to memory banks 412 through arbiters 414. Memory interface 404 is coupled to the core of DPE 204-25. Memory interface 404 provides the core of DPE 204-25 with access to memory banks 412. Memory interface 406 is coupled to the core of DPE 204-16. Memory interface 406 provides the core of DPE 204-16 with access to memory banks 412. Memory interface 408 is coupled to the core of DPE 204-5. Memory interface 408 provides the core of DPE 204-5 with access to memory banks 412. Accordingly, in the example of FIG. 4, each DPE that has a shared boundary with memory module 304 of DPE 204-15 is capable of reading and writing to memory banks 412. In the example of FIG. 4, the core of DPE 204-14 does not have direct access to memory module 304 of DPE 204-15.

Core 302 is capable of accessing memory modules of other neighboring DPEs via core interfaces 430, 432, and 434. In the example of FIG. 4, core interface 434 is coupled to a memory interface of DPE 204-25. Accordingly, core 302 is capable of accessing the memory module of DPE 204-25 via core interface 434 and the memory interface contained within the memory module of DPE 204-25. Core interface 432 is coupled to a memory interface of DPE 204-14. Accordingly, core 302 is capable of accessing the memory module of DPE 204-14 via core interface 432 and the memory interface contained within the memory module of DPE 204-14. Core interface 430 is coupled to a memory interface within DPE 204-5. Accordingly, core 302 is capable of accessing the memory module of DPE 204-5 via core interface 430 and the memory interface contained within the memory module of DPE 204-5. As discussed, core 302 is capable of accessing memory module 304 within DPE 204-15 via core interface 428 and memory interface 402.

In the example of FIG. 4, core 302 is capable of reading and writing to any of the memory modules of DPEs that share a boundary with core 302 in DPE 204-15 (e.g., DPEs 204-25, 204-14, and 204-5). In one or more embodiments, core 302 is capable of viewing the memory modules within DPEs 204-25, 204-15, 204-14, and 204-5 as a single, contiguous memory (e.g., as a single address space). Core 302 is capable of generating addresses for reads and writes presuming this contiguous memory model. Core 302 is capable of directing the read and/or write requests to the appropriate core interface 428, 430, 432, and/or 434 based upon the addresses that are generated.

As noted, core 302 is capable of mapping read and/or write operations in the correct direction through core interface 428, 430, 432, and/or 434 based upon the addresses of such operations. When core 302 generates an address for a memory access, core 302 is capable of decoding the address to determine the direction (e.g., the particular DPE to be accessed) and forwards the memory operation to the correct core interface in the determined direction.

Accordingly, core 302 is capable of communicating with the core of DPE 204-25 via a shared memory which may be the memory module within DPE 204-25 and/or memory module 304 of DPE 204-15. Core 302 is capable of communicating with the core of DPE 204-14 via a shared memory which is the memory module within DPE 204-14. Core 302 is capable of communicating with the core of DPE 204-5 via a shared memory which may be the memory module within DPE 204-5 and/or memory module 304 of DPE 204-15. Further, core 302 is capable of communicating with the core of DPE 204-16 via a shared memory which is memory module 304 within DPE 204-15.

As discussed, DMA engine 416 may include one or more stream-to-memory interfaces. Through DMA engine 416, application data may be received from other sources within the SoC 100 and stored in memory module 304. For example, data may be received from other DPEs that do and/or do not share a boundary with DPE 204-15 by way of stream switch 326. Data may also be received from other subsystems of the SoC (e.g., NoC 108, hardwired circuit blocks 110, PL 104, and/or PS 106) by way of SoC interface block 206 through the stream switches of the DPEs. DMA engine 416 is capable of receiving such data from the stream switches and writing the data to an appropriate memory bank or memory banks 412 within memory module 304.

DMA engine 416 may include one or more memory-to-stream interfaces. Through DMA engine 416, data may be read from memory bank or memory banks 412 of memory module 304 and sent to other destinations via the stream interfaces. For example, DMA engine 416 is capable of reading data from memory module 304 and sending such data to other DPEs that do and/or do not share a boundary with DPE 204-15 by way of the stream switches. DMA engine 416 is also capable of sending such data to other subsystems (e.g., NoC 108, hardwired circuit blocks 110, PL 104, and/or PS 106) by way of the stream switches and SoC interface block 206.

In one or more embodiments, DMA engine 416 is programmed by memory mapped switch 332 within DPE 204-15. For example, DMA engine 416 may be controlled by configuration registers 336. Configuration registers 336 may be written using memory mapped switch 332 of DPE interconnect 306. In particular embodiments, DMA engine 416 may be controlled by the stream switch 326 within DPE 204-15. For example, DMA engine 416 may include control registers that may be written by stream switch 326 connected thereto. Streams received via stream switch 326 within DPE interconnect 306 may be connected to DMA engine 416 in memory module 304 and/or directly to core 302 depending upon the configuration data loaded into configuration registers 324, 334, and/or 336. Streams may be sent from DMA engine 416 (e.g., memory module 304) and/or core 302 depending upon the configuration data loaded into configuration registers 324, 334, and/or 336.

Memory module 304 further may include hardware synchronization circuitry 420 (abbreviated as "HSC" in FIG. 4). In general, hardware synchronization circuitry 420 is capable of synchronizing operation of different cores (e.g., cores of neighboring DPEs), core 302 of FIG. 4, DMA engine 416, and other external masters (e.g., PS 106) that may communicate via DPE interconnect 306. As an illustrative and non-limiting example, hardware synchronization circuitry 420 is capable of synchronizing two different cores, stream switches, memory mapped interfaces, and/or DMAs in DPE 204-15 and/or different DPEs accessing the same, e.g., a shared, buffer in memory module 304.

In the case where two DPEs are not neighbors, the two DPEs do not have access to a common memory module. In that case, application data may be transferred via a data stream (the terms "data stream" and "stream" may be used interchangeably from time-to-time within this disclosure). As such, the local DMA engine is capable of converting the transfer from a local memory based transfer to a stream-based transfer. In that case, core 302 and DMA engine 416 are capable of synchronizing using hardware synchronization circuitry 420.

PS 106 is capable of communicating with core 302 via memory mapped switch 332. PS 106, for example, is capable of accessing memory module 304 and hardware synchronization circuitry 420 by initiating memory reads and writes. In another embodiment, hardware synchronization circuitry 420 may also send an interrupt to PS 106 when status of a lock changes to avoid polling by PS 106 of hardware synchronization circuitry 420. PS 106 is also capable of communicating with DPE 204-15 via the stream interfaces.

In addition to communicating with neighboring DPEs through shared memory modules and neighboring and/or non-neighboring DPEs via DPE interconnect 306, core 302 may include cascade interfaces. In the example of FIG. 4, core 302 includes cascade interfaces 422 and 424 (abbreviated as "CI" in FIG. 4). Cascade interfaces 422 and 424 are capable of providing direct communication with other cores. As pictured, cascade interface 422 of core 302 receives an input data stream directly from the core of DPE 204-14. The data stream received via cascade interface 422 may be provided to the data processing circuitry within core 302. Cascade interface 424 of core 302 is capable of sending an output data stream directly to the core of DPE 204-16.

In the example of FIG. 4, each of cascade interface 422 and cascade interface 424 may include a first-in-first-out (FIFO) interface for buffering. In particular embodiments, cascade interfaces 422 and 424 are capable of conveying data streams that may be hundreds of bits in width. The particular bit width of cascade interfaces 422 and 424 is not intended as a limitation. In the example of FIG. 4, cascade interface 424 is coupled to an accumulator register 436 (abbreviated as "AC" within FIG. 4) within core 302. Cascade interface 424 is capable of outputting the contents of accumulator register 436 and may do so each clock cycle. Accumulation register 436 may store data that is generated and/or being operated upon by data processing circuitry within core 302.

In the example of FIG. 4, cascade interfaces 422 and 424 may be programmed based upon configuration data loaded into configuration registers 324. For example, based upon configuration registers 324, cascade interface 422 may be activated or deactivated. Similarly, based upon configuration registers 324, cascade interface 424 may be activated or deactivated. Cascade interface 422 may be activated and/or deactivated independently of cascade interface 424.

In one or more other embodiments, cascade interfaces 422 and 424 are controlled by core 302. For example, core 302 may include instructions to read/write to cascade interfaces 422 and/or 424. In another example, core 302 may include hardwired circuitry that is capable of reading and/or writing to cascade interfaces 422 and/or 424. In particular embodiments, cascade interfaces 422 and 424 may be controlled by an entity outside of core 302.

Within the embodiments described within this disclosure, DPEs 204 do not include cache memories. By omitting cache memories, DPE array 202 is capable of achieving predictable, e.g., deterministic, performance. Further, significant processing overhead is avoided since maintaining coherency among cache memories located in different DPEs is not required.

In accordance with one or more embodiments, cores 302 of DPEs 204 do not have input interrupts. Thus, cores 302 of DPEs 204 are capable of operating uninterrupted. Omitting input interrupts to cores 302 of DPEs 204 also allows DPE array a02 to achieve predictable, e.g., deterministic, performance.

Figure 5:
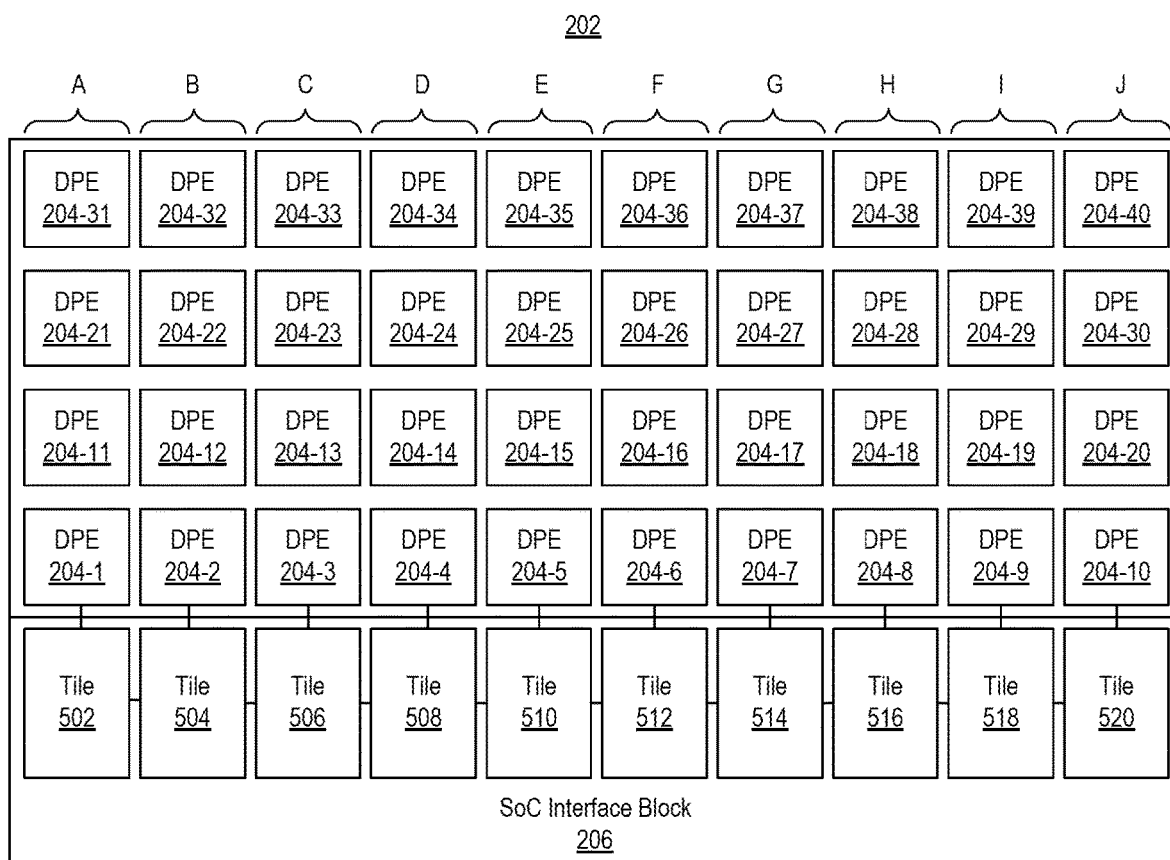
FIG. 5 illustrates another example architecture for a DPE array.

FIG. 5 illustrates another example architecture for a DPE array. In the example of FIG. 5. SoC interface block 206 provides an interface between DPEs 204 and other subsystems of the SoC 100. SoC interface block 206 integrates DPEs into the device, SoC interface block 206 is capable of conveying configuration data to DPEs 204, conveying events from DPEs 204 to other subsystems, conveying events from other subsystems to DPEs 204, generating and conveying interrupts to entities external to DPE array 102, conveying application data between other subsystems and DPEs 204, and/or conveying trace and/or debug data between other subsystems and DPEs 204.

In the example of FIG. 5, SoC interface block 206 includes a plurality of interconnected tiles. For example, SoC interface block 206 includes tiles 502, 504, 506, 508, 510, 512, 514, 516, 518, and 520. In the example of FIG. 5, tiles 502-520 are organized in a row. In other embodiments, tiles may be arranged in a column, in a grid, or in another layout. For example, SoC interface block 206 may be implemented as a column of tiles on the left of DPEs 204, on the right of DPEs 204, between columns of DPEs 204, or the like. In another embodiment, SoC interface block 206 may be located above DPE array 202. SoC interface block 206 may be implemented so that tiles are located in any combination of below DPE array 202, to the left of DPE array 202, to the right of DPE array 202, and/or above DPE array 202. In this regard, FIG. 5 is provided for purposes of illustration and not limitation.

In one or more embodiments, tiles 502-520 have a same architecture. In one or more other embodiments, tiles 502-520 may be implemented with two or more different architectures. In particular embodiments, different architectures may be used to implement tiles within SoC interface block 206 where each different tile architecture supports communication with a different type of subsystem or combination of subsystems of SoC 100.

In the example of FIG. 5, tiles 502-520 are coupled so that data may be propagated from one tile to another. For example, data may be propagated from tile 502 through tiles 504, 506, and on down the line of tiles to tile 520. Similarly, data may be propagated in the reverse direction from tile 520 to tile 502. In one or more embodiments, each of tiles 502-520 is capable of operating as an interface for a plurality of DPEs. For example, each of tiles 502-520 is capable of operating as an interface for a subset of the DPEs 204 of DPE array 102. The subset of DPEs to which each tile provides an interface may be mutually exclusive such that no DPE is provided with an interface by more than one tile of SoC interface block 206.

In one example, each of tiles 502-520 provides an interface for a column of DPEs 204. For purposes of illustration, tile 502 provides an interface to the DPEs of column A. Tile 504 provides an interface to the DPEs of column 6, etc. In each case, the tile includes a direct connection to an adjacent DPE in the column of DPEs, which is the bottom DPE in this example. Referring to column A, for example, tile 502 is directly connected to DPE 204-1. Other DPEs within column A may communicate with tile 502 but do so through the DPE interconnects of the intervening DPEs in the same column.

For example, tile 502 is capable of receiving data from another source such as PS 106, PL 104, and/or another hardwired circuit block 110, e.g., an ASIC block. Tile 502 is capable of providing those portions of the data addressed to DPEs in column A to such DPEs while sending data addressed to DPEs in other columns (e.g., DPEs for which tile 502 is not an interface) on to tile 504. Tile 504 may perform the same or similar processing where data received from tile 502 that is addressed to DPEs in column B is provided to such DPEs, while sending data addressed to DPEs in other columns on to tile 506, and so on.

In this manner, data may propagate from tile to tile of SoC interface block 206 until reaching the tile that operates as an interface for the DPEs to which the data is addressed (e.g., the "target DPE(s)"). The tile that operates as an interface for the target DPE(s) is capable of directing the data to the target DPE(s) using the memory mapped switches of the DPEs and/or the stream switches of the DPEs.

As noted, the use of columns is an example implementation. In other embodiments, each tile of SoC interface block 206 is capable of providing an interface to a row of DPEs of DPE array 102. Such a configuration may be used in cases where SoC interface block 206 is implemented as a column of tiles, whether on the left, right, or between columns of DPEs 204. In other embodiments, the subset of DPEs to which each tile provides an interface may be any combination of fewer than all DPEs of DPE array 102. For example, DPEs 204 may be apportioned to tiles of SoC interface block 206. The particular physical layout of such DPEs may vary based upon connectivity of the DPEs as established by DPE interconnects. For example, tile 502 may provide an interface to DPEs 204-1, 204-2, 204-11, and 204-12. Another tile of SoC interface block 206 may provide an interface to four other DPEs, and so forth.

Figure 6:
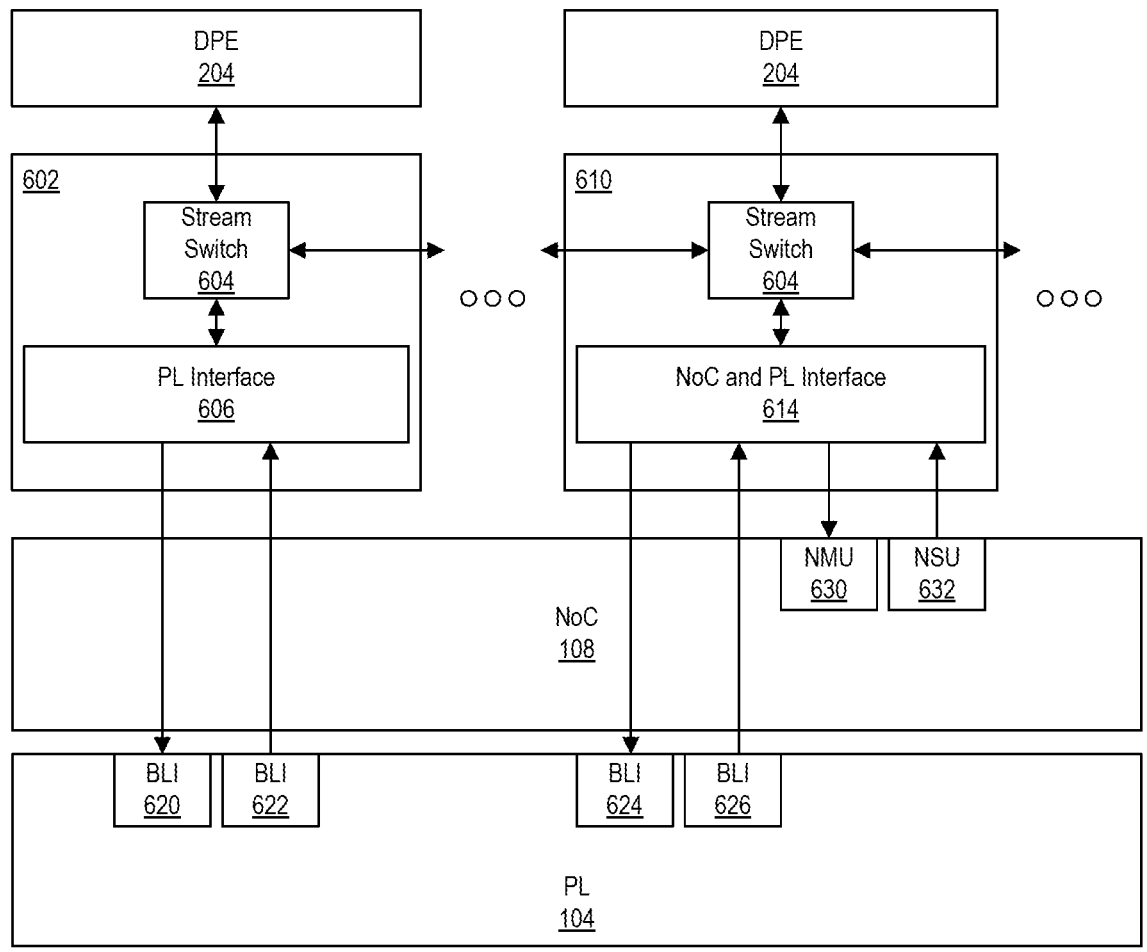
FIG. 6 illustrates an example architecture for tiles of the SoC interface block of the DPE array.

FIG. 6 illustrates an example architecture for tiles of SoC interface block 206. In the example of FIG. 6, two different types of tiles for SoC interface block 206 are shown. Tile 602 is configured to serve as an interface between DPEs and only PL 104. Tile 610 is configured to serve as an interface between DPEs and NoC 108 and between DPEs and PL 104. SoC interface block 206 may include a combination of tiles using both architectures as illustrated for tile 602 and for tile 610 or, in another example, only tiles having an architecture as illustrated for tile 610.

In the example of FIG. 6, tile 602 includes a stream switch 604 connected to a PL interface 606 and to a DPE such as DPE 204-1 immediately above. PL interface 606 connects to Boundary Logic Interface (BLI) circuit 620 and BLI circuit 622 each located in PL 104. Tile 610 includes a stream switch 612 connected to NoC and PL interface 614 and to a DPE such as DPE 204-5 immediately above. NoC and PL interface 614 connects to BLI circuits 624 and 626 in the PL 104 and also to NoC Master Unit (NMU) 630 and NoC Slave Unit (NSU) 632 of the NoC 108.

In the example of FIG. 6, each stream interface 604 is capable of outputting six different 32-bit data streams to, and receiving 4 different 32-bit data streams from, the DPE coupled thereto. Each of PL interface 606 and NoC and PL interface 614 is capable of providing 6 different 64-bit data streams to PL 104 by way of BLI 620 and BLI 624, respectively. In general, each of BLIs 620, 622, 624, and 626 provides an interface or connection point within PL 104 to which PL interface 606 and/or NoC and PL interface 614 conned. Each of PL interface 606 and NoC and PL interface 614 is capable of receiving 8 different 64-bit data streams from PL 210 by way of BLI 622 and BLI 624, respectively.

NoC and PL interface 614 is also connected to NoC 108. In the example of FIG. 6, NoC and PL interface 614 connects to one or more NMUs 630 and to one or more NSUs 632. In one example, NoC and PL interface 614 is capable of providing two different 128-bit data streams to NoC 108, wherein each data stream is provided to a different NMU 630. NoC and PL interface 614 is capable of receiving two different 128-bit data streams from NoC 108, where each data stream is received from a different NSU 632.

Stream switches 604 in adjacent tiles are connected. In an example, stream switches 604 in adjacent tiles are capable of communicating by way of four different 32-bit data streams in each of the left and right directions (e.g., so long as a tile is to the right or to the left as the case may be).

Tiles 602 and 610 each may include one or more memory mapped switches to convey configuration data. For purposes of illustration, the memory mapped switches are not shown. The memory mapped switches, for example, are capable of connecting vertically to a memory mapped switch of the DPE immediately above, to memory mapped switches in other adjacent tiles in SoC interface block 206 in the same or similar manner as stream switches 604, to configuration registers in tiles 602 and 610 (not shown), and/or to PL interface 608 or NoC and PL interface 614 as the case may be.

The various bit widths and numbers of data streams described in connection with the various switches included in the DPEs 204 and/or the tiles 602 and/or 610 of the SoC interface block 206 are provided for purposes of illustration and are not intended to be limiting of the inventive arrangements described within this disclosure.

Figure 7:
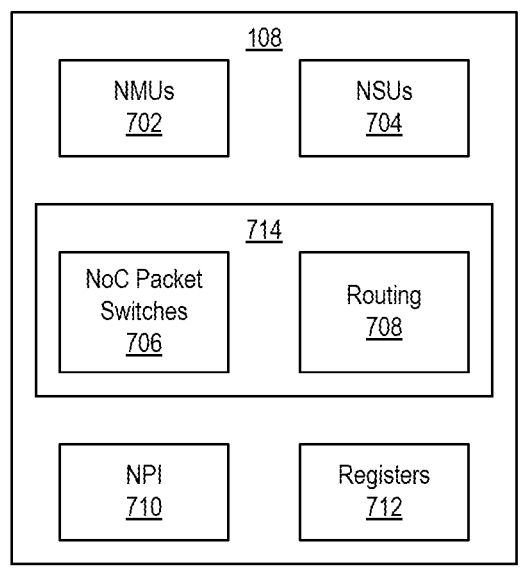
FIG. 7 illustrates an example implementation of the Network-on-Chip (NoC) of FIG. 1.

FIG. 7 illustrates an example implementation of NoC 108. NoC 108 includes NoC master units (NMUs) 702, NoC slave units (NSUs) 704, a network 714, NoC peripheral interconnect (NPI) 710, and registers 712. Each NMU 702 is an ingress circuit that connects an endpoint circuit to the NoC 108. Each NSU 704 is an egress circuit that connects the NoC 108 to an endpoint circuit. The NMUs 702 are connected to the NSUs 704 through the network 714. In an example, the network 714 includes NoC packet switches 706 (NPSs) and routing 708 between the NoC packet switches 706. Each NoC packet switch 706 performs switching of NoC packets. The NoC packet switches 706 are connected to each other and to the NMUs 702 and NSUs 704 through the routing 708 to implement a plurality of physical channels. The NoC packet switches 706 also support multiple virtual channels per physical channel.

The NPI 710 includes circuitry to program the NMUs 702, NSUs 704, and NoC packet switches 706. For example, the NMUs 702, NSUs 704, and NoC packet switches 706 can include registers 712 that determine functionality thereof. The NPI 710 includes a peripheral interconnect coupled to the registers 712 for programming thereof to set functionality. The registers 712 in the NoC 108 support interrupts. Quality of Service (QoS), error handling and reporting, transaction control, power management, and address mapping control. The registers 712 can be initialized in a usable state before being reprogrammed, such as by writing to the registers 712 using write requests. Configuration data for the NoC 108 can be stored in a non-volatile memory (NVM), e.g., as part of a programming device image (PDI), and provided to the NPI 710 for programming the NoC 108 and/or other endpoint circuits.

The NMUs 702 are traffic ingress points. The NSUs 704 are traffic egress points. Endpoint circuits coupled to the NMUs 702 and NSUs 704 can be hardened circuits (e.g., hardwired circuit blocks 110) or circuits implemented in PL 104. A given endpoint circuit can be coupled to more than one NMU 702 or more than one NSU 704.

Figure 8:
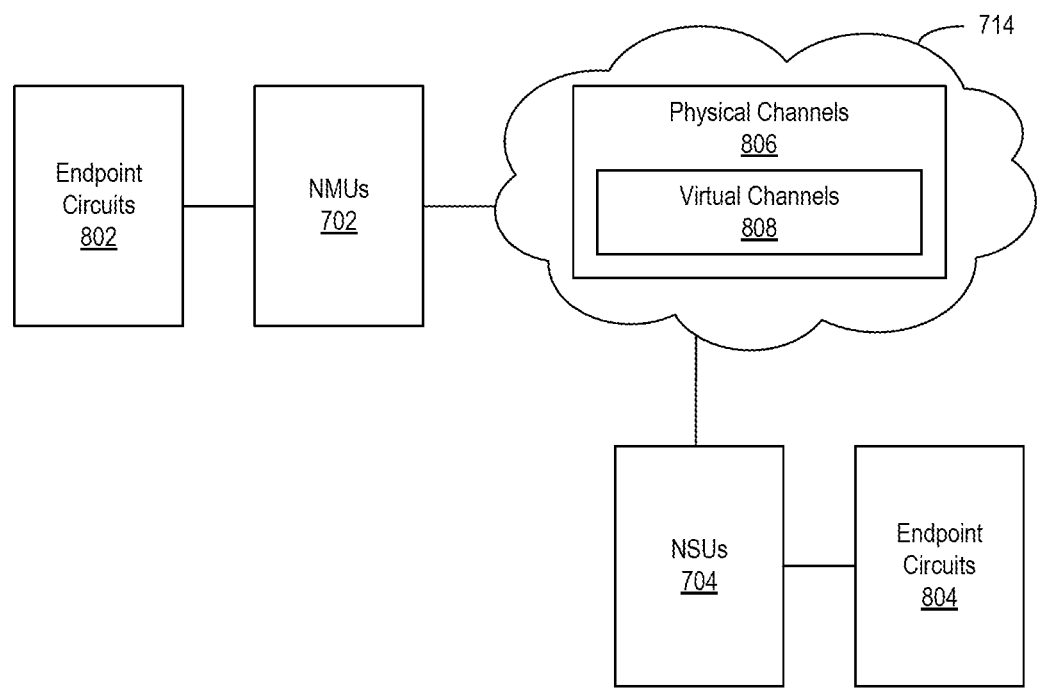
FIG. 8 is a block diagram depicting connections between endpoint circuits in the SoC of FIG. 1 through the NoC.

FIG. 8 is a block diagram depicting connections between endpoint circuits in the SoC 100 through the NoC 108 according to an example. In the example, endpoint circuits 802 are connected to endpoint circuits 804 through the NoC 108. The endpoint circuits 802 are master circuits, which are coupled to NMUs 702 of the NoC 108. The endpoint circuits 804 are slave circuits coupled to the NSUs 704 of the NoC 108. Each endpoint circuit 802 and 804 can be a circuit in the PS 106, a circuit in a PL region 104, or a circuit in another subsystem (e.g., hardwired circuit blocks 110).

The network 714 includes a plurality of physical channels 806. The physical channels 806 are implemented by programming the NoC 108. Each physical channel 806 includes one or more NoC packet switches 706 and associated routing 708. An NMU 702 connects with an NSU 704 through at least one physical channel 806. A physical channel 806 can also have one or more virtual channels 808.

Connections through the network 714 use a master-slave arrangement. In an example, the most basic connection over the network 714 includes a single master connected to a single slave. However, in other examples, more complex structures can be implemented.

Figure 9:
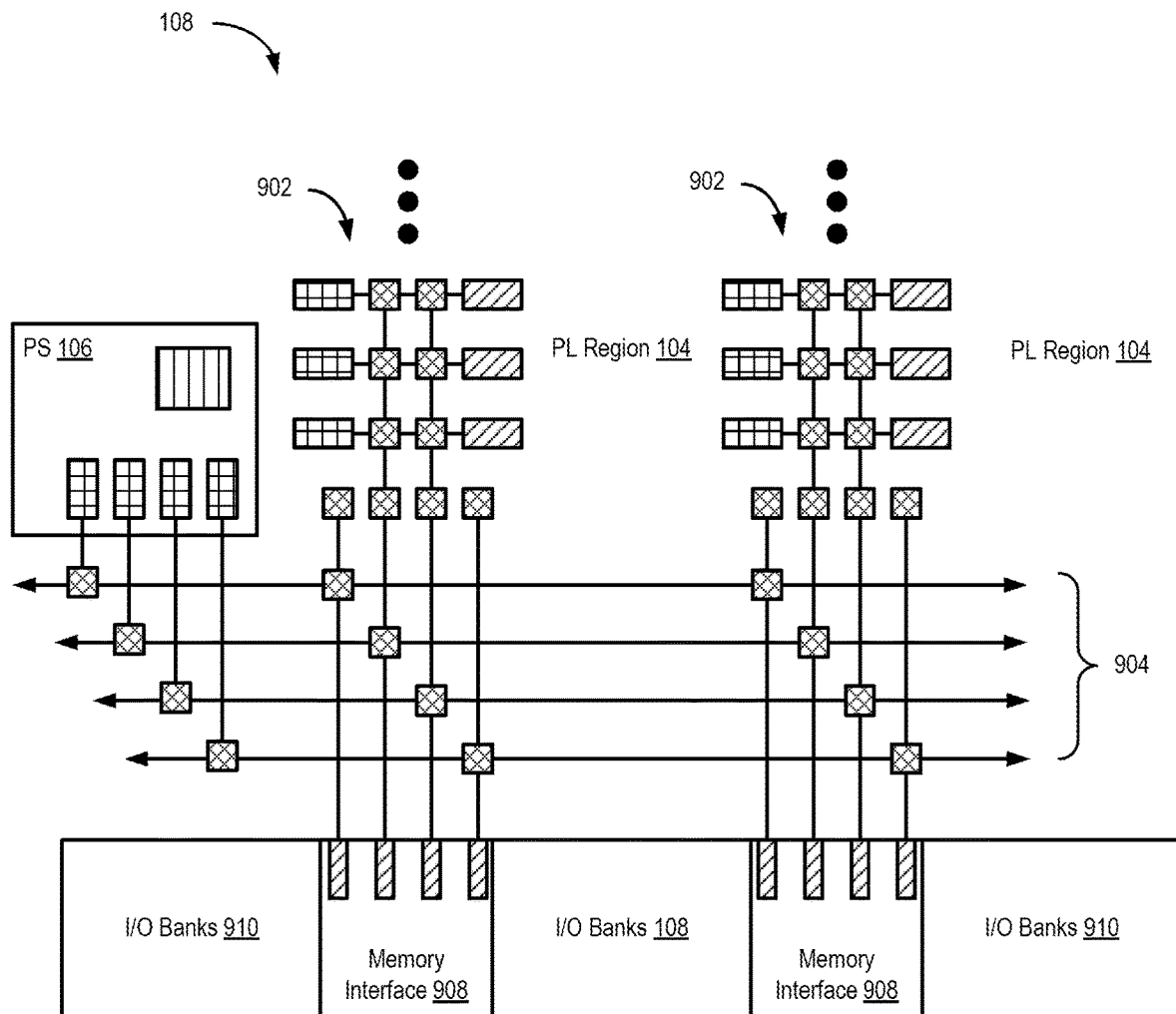
FIG. 9 is a block diagram depicting the NoC according to another example.

FIG. 9 is a block diagram depicting the NoC 108 according to another example. In the example, the NoC 108 includes vertical portions 902 (VNoC) and horizontal portion 904 (HNoC). Each VNoC 902 is disposed between PL regions 104. The HNoC 904 is disposed between the PL regions 104 and the I/O banks 910 (e.g., I/O blocks and/or transceivers corresponding to hardwired circuit blocks 110). The NoC 108 is connected to the memory interfaces 908 (e.g., other hardwired circuit blocks 110). The PS 106 is coupled to the HNoC 904.

In the example, the PS 106 includes a plurality of NMUs 702 coupled to the HNoC 904. The VNoC 902 includes both NMUs 702 and NSUs 704, which are disposed in the PL regions 104. The memory interfaces 908 include NSUs 704 coupled to the HNoC 904. Both the HNoC 904 and the VNoC 902 include NPSs 706 connected by routing 708. In the VNoC 902, the routing 708 extends vertically. In the HNoC 904, the routing extends horizontally. In each VNoC 902, each NMU 702 is coupled to an NPS 706. Likewise, each NSU 704 is coupled to an NPS 706. NPSs 706 are coupled to each other to form a matrix of switches. Some NPSs 706 in each VNoC 902 are coupled to other NPSs 706 in the HNoC 904.

Although only a single HNoC 904 is shown, in other examples, the NoC 108 can include more than one HNoC 904. In addition, while two VNoCs 902 are shown, the NoC 108 can include more than two VNoCs 902. Although memory interfaces 908 are shown by way of example, it is to be understood that other hardwired circuit blocks 110 can be used in place of, or in addition to, the memory interfaces 908.

Figure 10:
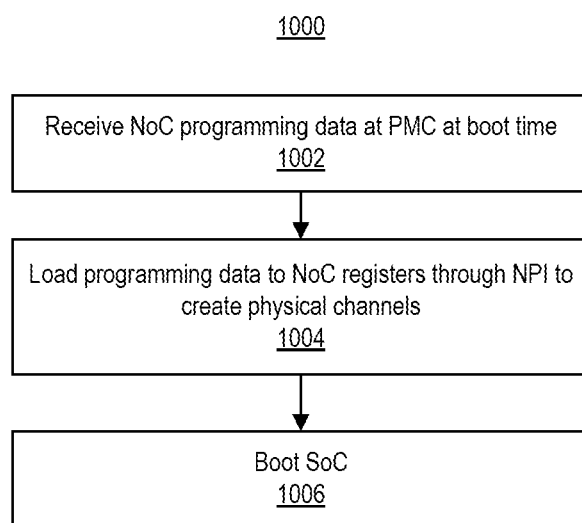
FIG. 10 illustrates an example method of programming the NoC.

FIG. 10 illustrates an example method 1000 of programming the NoC 108. Though described independently of the other subsystems of the SoC 100, method 1000 may be included and/or used as part of a larger boot or programming, process for SoC 100.

At block 1002, a Platform Management Controller (PMC) implemented in the SoC 100 receives NoC programming data at boot time. The NoC programming data may be a part of a PDI. The PMC is responsible for managing the SoC 100. The PMC is capable of maintaining a safe and secure environment, booting the SoC 100, and managing the SoC 100 during normal operations.

At block 1004, the PMC loads the NoC programming data to the registers 712 through the NPI 710 to create physical channels 806. In an example, the programming data can also include information for configuring routing tables in the NPSs 706. At block 1006, the PMC boots the SoC 100. In this manner, the NoC 108 includes at least configuration information for the physical channels 806 between NMUs 702 and NSUs 704. Remaining configuration information for the NoC 108 can be received during runtime, as described further below. In another example, all or a portion of the configuration information described below as being received during runtime can be received at boot time.

Figure 11:
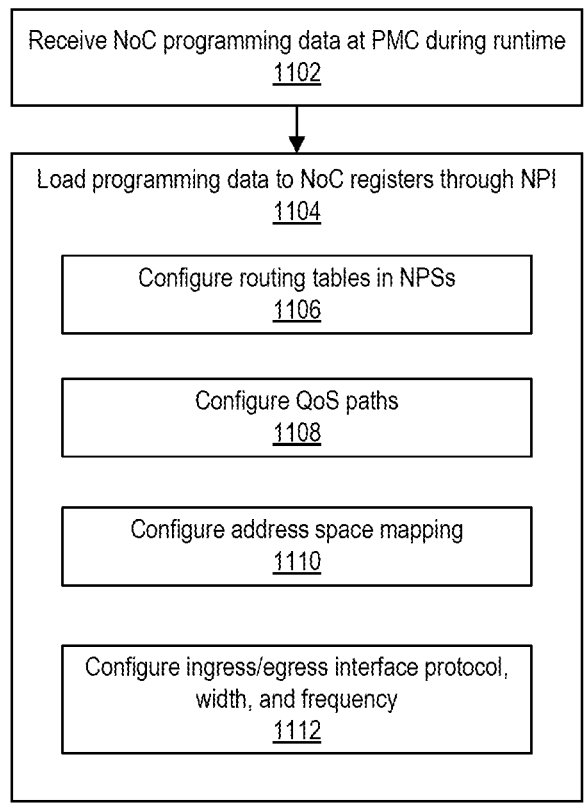
FIG. 11 illustrates another example method of programming the NoC.

FIG. 11 illustrates an example method 1100 of programming the NoC 108. At block 1102, the PMC receives NoC programming data during runtime. At block 1104, the PMC loads the programming data to NoC registers 712 through the NPI 710. In an example, at block 1106, the PMC configures routing tables in the NPSs 706. At block 1108, the PMC configures QoS paths over the physical channels 806. At block 1110, the PMC configures address space mappings. At block 1112, the PMC configures ingress\legress interface protocol, width, and frequency. The QoS paths, address space mappings, routing tables, and ingress\legress configuration are discussed further below.

Figure 12:
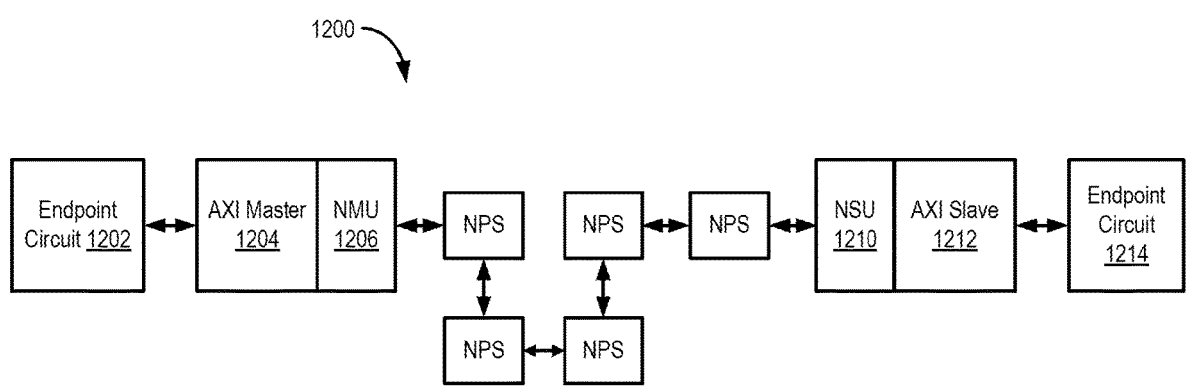
FIG. 12 illustrates an example data path through the NoC between endpoint circuits.

FIG. 12 illustrates an example data path 1200 through the NoC 108 between endpoint circuits. The data path 1200 includes an endpoint circuit 1202, an AXI master circuit 1204, an NMU 1206, NPSs 1208, an NSU 1210, an AXI slave circuit 1212, and an endpoint circuit 1214. The endpoint circuit 1202 is coupled to the AXI master circuit 1204. The AXI master circuit 1204 is coupled to the NMU 1206. In another example, the AXI master circuit 1204 is part of the NMU 1206.

The NMU 1206 is coupled to an NPS 1208. The NPSs 1208 are coupled to each other to form a chain of NPSs 1208 (e.g., a chain of five NPSs 1208 in the present example). In general, there is at least one NPS 1208 between the NMU 1206 and the NSU 1210. The NSU 1210 is coupled to one of the NPSs 1208. The AXI slave circuit 1212 is coupled to the NSU 1210. In another example, the AXI slave circuit 1212 is part of the NSU 1210. The endpoint circuit 1214 is coupled to the AXI slave circuit 1212.

The endpoint circuits 1202 and 1214 can each be a hardened circuit (e.g., a PS circuit, a hardwired circuit 110, one or more DPEs 204) or a circuit configured in the PL 104. The endpoint circuit 1202 functions as a master circuit and sends read/write requests to the NMU 1206. In the example, the endpoint circuits 1202 and 1214 communicate with the NoC 108 using an AXI protocol. While AXI is described in the example, it is to be understood that the NoC 108 may be configured to receive communications from endpoint circuits using other types of protocols known in the art. For purposes of clarity by example, the NoC 108 is described as supporting the AXI protocol herein. The NMU 1206 relays the request through the set of NPSs 1208 to reach the destination NSU 1210. The NSU 1210 passes the request to the attached AXI slave circuit 1212 for processing and distribution of data to the endpoint circuit 1214. The AXI slave circuit 1212 can send read/write responses back to the NSU 1210. The NSU 1210 can forward the responses to the NMU 1206 through the set of NPSs 1208. The NMU 1206 communicates the responses to the AXI master circuit 1204, which distributes the data to the endpoint circuit 1202.

Figure 13:
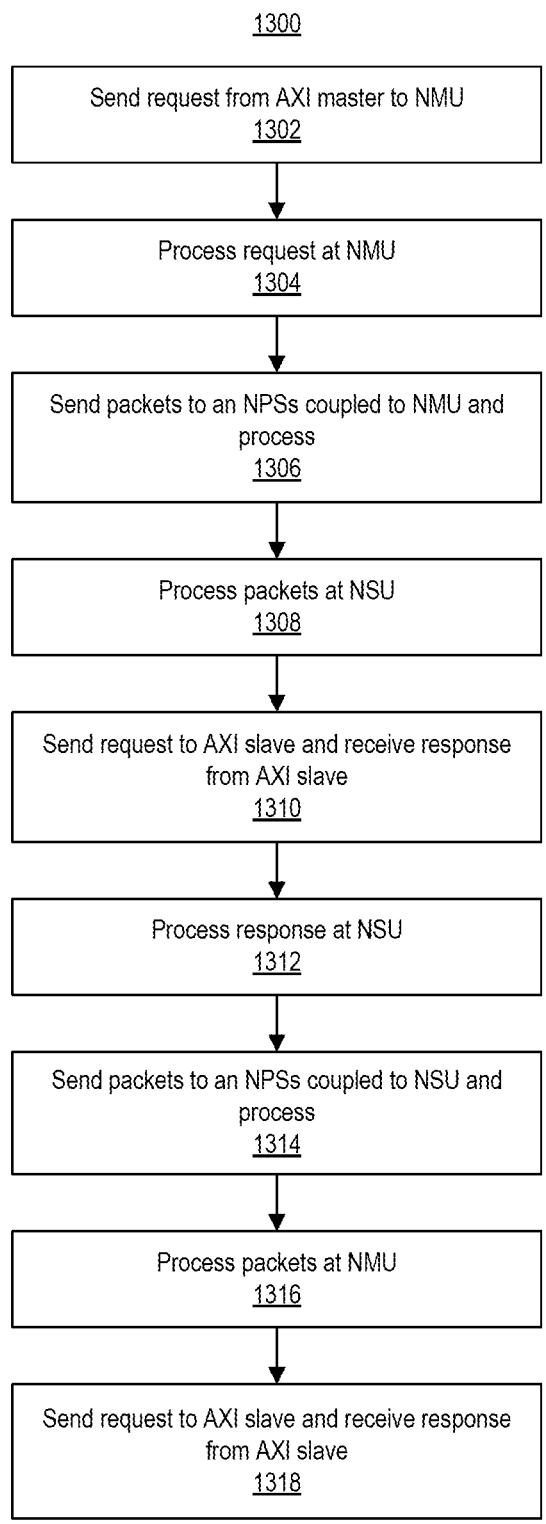
FIG. 13 illustrates an example method of processing read/write requests and responses relating to the NoC.

FIG. 13 illustrates an example method 1300 of processing read/write requests and responses. The method 1300 begins at block 1302, where the endpoint circuit 1202 sends a request (e.g., a read request or a write request) to the NMU 1206 through the AXI master 1204. At block 1304, the NMU 1206 processes the response. In an example, the NMU 1206 performs asynchronous crossing and rate-matching between the clock domain of the endpoint circuit 1202 and the NoC 108. The NMU 1206 determines a destination address of the NSU 1210 based on the request. The NMU 1206 can perform address remapping in case virtualization is employed. The NMU 1206 also performs AXI conversion of the request. The NMU 1206 further packetizes the request into a stream of packets.

At block 1306, the NMU 1206 sends the packets for the request to the NPSs 1208. Each NPS 1208 performs a table lookup for a target output port based on the destination address and routing information. At block 1308, the NSU 1210 processes the packets of the request. In an example, the NSU 1210 de-packetizes the request, performs AXI conversion, and performs asynchronous crossing and rate-matching from the NoC clock domain to the clock domain of the endpoint circuit 1214. At block 1310, the NSU 1210 sends the request to the endpoint circuit 1214 through the AXI slave circuit 1212. The NSU 1210 can also receive a response from the endpoint circuit 1214 through the AXI slave circuit 1212.

At block 1312, the NSU 1210 processes the response. In an example, the NSU 1210 performs asynchronous cross and rate-matching from the clock domain of the endpoint circuit 1214 and the clock domain of the NoC 108. The NSU 1210 also packetizes the response into a stream of packets. At block 1314, the NSU 1210 sends the packets through the NPSs 1208. Each NPS 1208 performs a table lookup for a target output port based on the destination address and routing information. At block 1316, the NMU 1206 processes the packets. In an example, the NMU 1206 de-packetizes the response, performs AXI conversion, and performs asynchronous crossing and rate-matching from the NoC clock domain to the clock domain of the endpoint circuit 1202. At block 1318, the NMU 1208 sends the response to the endpoint circuit 1202 through the AXI master circuit 1204.

Figure 14:
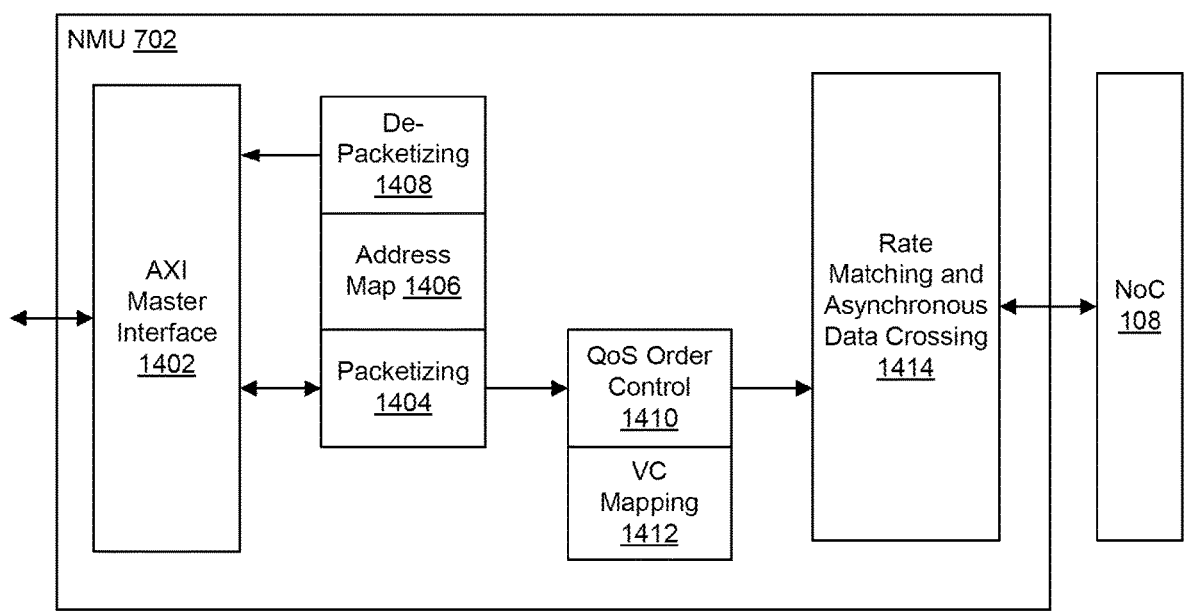
FIG. 14 illustrates an example implementation of a NoC master unit.

FIG. 14 illustrates an example implementation of an NMU 702. The NMU 702 includes an AXI master interface 1402, packetizing circuitry 1404, an address map 1406, de-packetizing circuitry 1408, QoS circuitry 1410, VC mapping circuitry 1412, and clock management circuitry 1414. The AXI master interface 1402 provides an AXI interface to the NMU 702 for an endpoint circuit. In other examples, a different protocol can be used and thus the NMU 702 can have a different master interface that complies with a selected protocol. The NMU 702 routes inbound traffic to the packetizing circuitry 1404, which generates packets from the inbound data. The packetizing circuitry 1404 determines a destination ID from the address map 1406, which is used to route the packets. The destination ID is used inside the NoC 108 and is used to specify the destination interface to which a packet is being sent. The QoS circuitry 1410 can provide ingress rate control to control the injection rate of packets into the NoC 108. The VC mapping circuitry 1412 manages QoS virtual channels on each physical channel. The NMU 702 can be configured to select which virtual channel the packets are mapped to. The clock management circuitry 1414 performs rate matching and asynchronous data crossing to provide an interface between the AXI clock domain and the NoC clock domain. The de-packetizing circuitry 1408 receives return packets from the NoC 108 and is configured to de-packetize the packets for output by the AXI master interface 1402.

Figure 15:
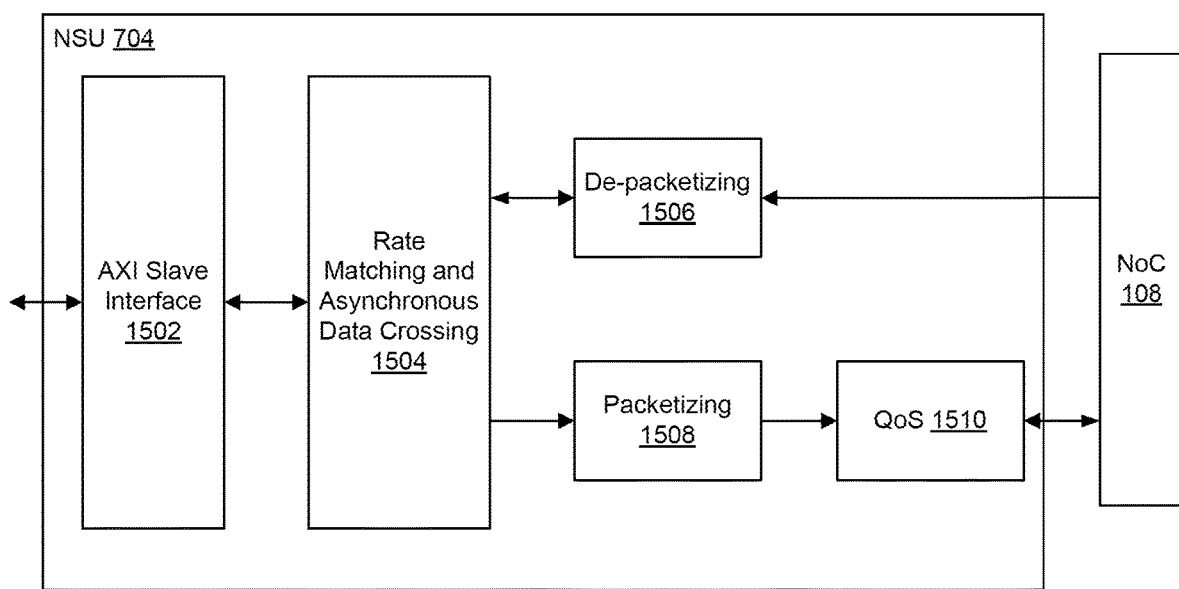
FIG. 15 illustrates an example implementation of an NoC slave unit.

FIG. 15 illustrates an example implementation of an NSU 704. The NSU 704 includes an AXI slave interface 1502, clock management circuitry 1504, packetizing circuitry 1508, de-packetizing circuitry 1506, and QoS circuitry 1510. The AXI slave interface 1502 provides an AXI interface to the NSU 704 for an endpoint circuit. In other examples, a different protocol can be used and thus the NSU 704 can have a different slave interface that complies with a selected protocol. The NSU 704 routes inbound traffic from the NoC 108 to the de-packetizing circuitry 1506, which generates de-packetized data. The clock management circuitry 1504 performs rate matching and asynchronous data crossing to provide an interface between the AXI clock domain and the NoC clock domain. The packetizing circuitry 1508 receives return data from the slave interface 1502 and is configured to packetize the return data for transmission through the NoC 108. The QoS circuitry 1510 can provide ingress rate control to control the injection rate of packets into the NoC 108.

Figure 16:
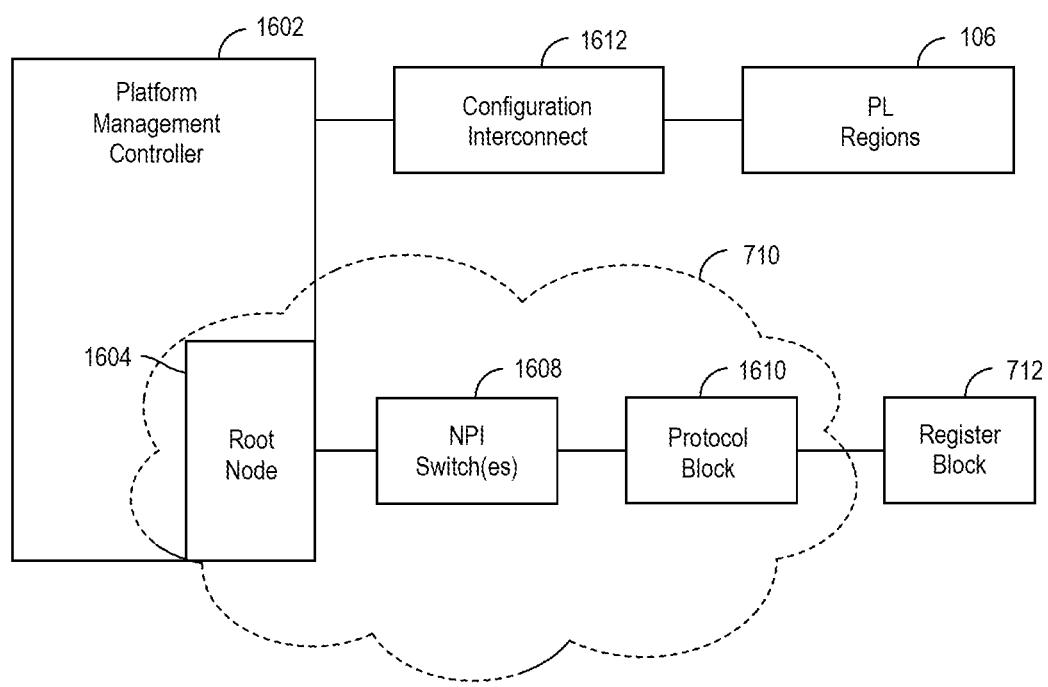
FIG. 16 illustrates example connections to a register block of the NoC through the NoC peripheral interconnect.

FIG. 16 illustrates example connections to a register block 712 of NoC 108 through the NPI 710. To connect to a register block 712, the NPI 710 includes a root node 1604, one or more NPI switches 1608, and a protocol block 1610. The root node 1604, in some examples, resides in a PMC 1602. In some examples, PMC 1602 resides in the PS 106, although in other examples, the root node 1604 and PMC 1602 can be an independent circuit or reside on another system or circuit. Generally, the root node 1604 can packetize a transaction request into a format implemented by the NPI 710 and can transmit a memory mapped transaction request to an NPI switch 1608, which can further transmit the memory mapped transaction request to other NPI switches 1608 or to a protocol block 1610 based on a destination identification of the memory mapped transaction request. The NPI switches 1608 can be interconnected in any appropriate topology. In some examples, the NPI switches 1608 are interconnected as a tree topology to the root node 1604. The protocol block 1610 can then translate the memory mapped transaction request into a format implemented by the register block 712. The register block 712 is illustrated in FIG. 16 as an example of a slave endpoint circuit to which the NPI 710 can be connected. The NPI 710 can further be connected to other slave endpoint circuits.

The PMC 1602 is further connected to the configuration interconnect 1612, which is in turn connected to the PL regions 104. The PMC 1602 is configured to program the fabric of the PL regions 104 through the configuration interconnect 1612. The configuration interconnect 1612 is a delivery mechanism for programming programmable units on the SoC 100 that is independent of the delivery mechanism of the NPI 710 for programming other programmable units (e.g., slave endpoint circuits) on the SoC 100.

As previously stated, the register blocks 712 include registers that are programmed to create a corresponding routing table of an NPS 706. FIG. 17 illustrates a routing table 1700, according to an example. The routing table 1700 packs the registers according to destination identifications. Each packet that is received and subsequently transmitted by the NPS 706 includes a destination identification that is used by the routing table 1700 to transmit and route the packet. For this example, the NPS 706 has four ports (Ports 0 through 3) and eight virtual channels (VC 0 through 7). The rows of the routing table correspond to a port-virtual channel combination (Port-VC) on which a packet is received. The columns of the routing table correspond to destination identifications (IDy) contained in the received packet. The entries of the routing table indicate an outgoing port on which the packet will be transmitted based on the Port-VC and IDy. In some examples, the entries for a given IDy are packed in one or more register of the register block 712. Pre-defined bits of the one or more registers are the entries of the routing table, and the pre-defined bits correspond with a Port-VC. The NPS 706 is configured to receive a packet, determine on which port the packet is received, determine the virtual channel of the packet, determine the destination identification contained in the packet, identify the outgoing port of the NPS 706 based on the receiving port, virtual channel, and destination identification as programmed in the registers that form the routing table, and transmit the packet on the outgoing port of the NPS 706.

In this example, there are thirty-two Port-VC combinations based on the four ports and eight virtual channels, and each entry for the outgoing port is at least two bits based on the four ports. Hence, in this example, two thirty-two bit registers are implemented for each IDy. Other examples, can implement registers for a routing table differently.

In some examples, by packing registers based on a destination identification, a routing table may be more easily reconfigured when a path is to be altered in a partial reconfiguration without having to reconfigure or interrupt other paths that are not to be reconfigured.

In other examples, other features may be implemented for the routing table. For example, multiple destination identifications can be segmented in the routing table, e.g., multiple destination identifications can be packed into one or more registers, to reduce overhead and/or processing of packets. In such examples, the segmenting may affect an ability to reconfigure a path. For example, if a part of a path that is to persist during partial reconfiguration corresponds to an entry in a segment of the routing table, the presence of the path that is to persist may prevent reconfiguring another path in the same segment.

Figures 18, 19:
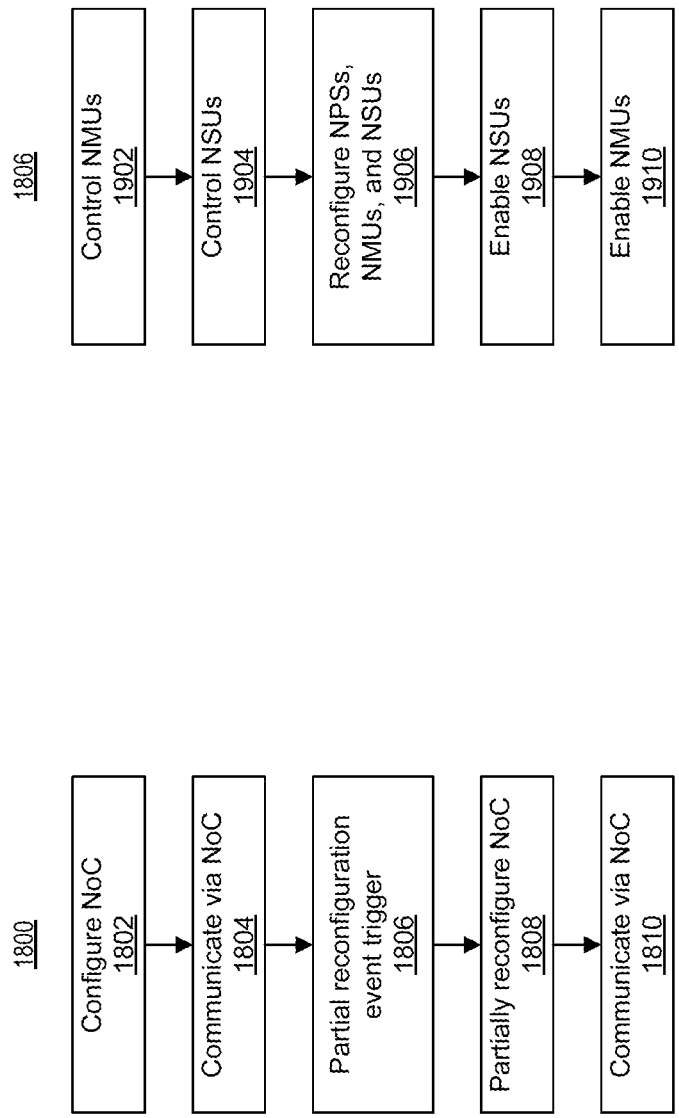
FIG. 18 illustrates an example method for operating an SoC.
FIG. 19 is an example method of partially reconfiguring the NoC.

FIG. 18 illustrates an example method 1800 for operating an SoC such as SoC 100. In block 1802, the NoC 108 is configured. More generally, the NoC 108 can be configured as part of a system-level configuration and/or any reconfiguration (e.g., partial or whole) thereof. Other subsystems of the SoC 100 can also be configured during operation 1802. For example, the PL regions 104 and/or the DPE array 102 can be configured. The NoC 108 can be configured via memory mapped transactions through the NPI 710 to write to register blocks 712 of NMUs 702, NSUs 704, and NPSs 706, as described above. The PL regions 104 can be configured via the configuration interconnect 1612. The DPE array 102 can be configured after the NoC 108 is configured and via the NoC 108 and SoC interface block 206 of the DPE array 102. The configuration of the PL regions 104 and/or DPE array 102 can instantiate one or more applications, or any subset thereof, on the PL regions 104 and/or DPE array 102. Configuring the NoC 108 and any other components can be under the control of the PMC 1602. The PMC 1602, for example, can obtain a PDI from memory, and the PDI can include the configuration data of the NoC 108, the configuration bitstream for the PL regions 104, and/or configuration data of the DPE array 102. The PMC 1602 can thereafter coordinate and control the configuring of the components based on the PDI.

In block 1804, communications occur via the NoC 108. More generally, the SoC 100 is operated based on the configuration of the SoC 100, including the configuration of the NoC 108. Once configured, the PMC 1602 can enable components for operation and initiate the operation. Various subsystems on the SoC 100 communicate, for example, application data with each other via the NoC 108. For example, applications, or subsets thereof, instantiated on the PL regions 104 and/or DPE array 102 can communicate with each other or other subsystems (e.g., the PS 106 and/or a memory controller) via the NoC 108.

In block 1806, a partial reconfiguration event trigger occurs. The partial reconfiguration event trigger may be use specific. For example, an application, or subset thereof, instantiated on the PL regions 104 and/or DPE array 102 may conclude its task and generate an interrupt to trigger the partial reconfiguration. The interrupt can be communicated to the PMC 1602 via the NoC 108, a dedicated interconnect, or another interconnect, and in response to receiving the interrupt, the PMC 1602 takes control for partial reconfiguration.

In block 1808, the NoC 108 is partially reconfigured. More generally, the NoC 108 can be configured as part of a larger partial reconfiguration. Other subsystems of the SoC 100 can also be partially reconfigured during block 1808. Instances of circuit components of the NoC 108 and any other subsystem to be reconfigured during partial reconfiguration are referred to herein as a reconfiguration partition (RP). The circuit components or regions of the RP can be reconfigured during partial reconfiguration to transition from an unused to used state, used to unused state, and/or used to a different use state. Referring to the other subsystems, such as the PL regions 104 and DPE array 102, various applications can be disabled and/or overwritten and different applications, or any subset thereof, can be instantiated on those subsystems by the partial reconfiguration. Partially reconfiguring the NoC 108 and any other subsystem can be under the control of the PMC 1602. The PMC 1602 can obtain a PDI from memory, and the PDI can include the configuration date and/or configuration bitstream of the reconfiguration partition. The PMC 1602 can thereafter coordinate and control the partial configuration of the circuit components based on the PDI.

The partial reconfiguration can reconfigure components in RP while other components outside of the RP are not reconfigured. Additionally, with respect to the NoC, communications (e.g., as occurring in block 1804) may continue via paths of the NoC that are not to be reconfigured (e.g., paths outside of the RP). Accordingly, a subset of resources of the NoC can be modified while another subset of resources of the NoC can remain active and undisturbed. Additional detail of the partial reconfiguration of the NoC 108 is described with respect to FIG. 19 below.

In block 1810, communications occur via the NoC 108. More generally, the SoC 100 is operated based on the configuration, with the partial reconfiguration, of the SoC 100. Once partial reconfiguration is complete, the PMC 1602 can enable components for operation and initiate the operation. Various subsystems on the SoC 100 communicate, for example, application data with each other via the NoC 108, as described previously.

FIG. 19 is an example implementation of block 1808 of FIG. 18 to partially reconfigure the NoC 108. As stated previously, in block 1808, the partial reconfiguration of the NoC 108 is under the control of the PMC 1602. In block 1902, the PMC 1602 controls the NMUs 702 in the RP that are to be reconfigured. The PMC 1602 obtains, from the PDI, addresses or identifications of the NMUs 702 in the RP that are to be reconfigured. The PMC 1602 then sends transaction requests through the NPI 710 to register blocks 712 of the NMUs 702 in the RP to control the NMUs 702.

The transaction requests write to the register blocks 712 of the NMUs 702 values that cause the NMUs 702 to halt transmitting further packets to the NoC 108 and to clear any pending packets. The PMC 1602 can then wait a predetermined amount of time to allow the packets to be cleared. After the predetermined amount of time, the PMC 1602 can read, via a transaction request through the NPI 710, a status register of each NMU 702 to determine whether any NMU 702 still has a pending packet. If an NMU 702 still has a pending packet, an error can be generated. If no NMU 702 has a pending packet, the PMC 1602, via transaction requests through the NPI 710, disables or halts operation of the NMUs 702.

In block 1904, the PMC 1602 controls the NSUs 704 in the RP that are to be reconfigured. The PMC 1602 obtains, from the PDI, addresses or identifications of the NSUs 704 in the RP that are to be reconfigured. The PMC 1602 then sends transaction requests through the NPI 710 to register blocks 712 of the NSUs 704 in the RP to control the NSUs 704. The transaction requests write to the register blocks 712 of the NSUs 704 values that cause the NSUs 704 to reject subsequently received packets from the NoC 108 and to clear any pending packets. The PMC 1602 can then wait a predetermined amount of time to allow the packets to be cleared. After the predetermined amount of time, the PMC 1602 can read, via a transaction request through the NPI 710, a status register of each NSU 704 to determine whether any NSU 704 still has a pending packet. If an NSU 704 still has a pending packet, an error can be generated. If no NSU 704 has a pending packet, the PMC 1602, via transaction requests through the NPI 710, disables or halts operation of the NSUs 704.

With the NMUs 702 and NSUs 704 controlled as described in connection with blocks 1902 and 1904, traffic on paths in the NoC 108 in the RP is quiesced. With the traffic quiesced, the RP can be reconfigured. In block 1906, the PMC 1602 reconfigures the NPSs 706, NMUs 702, and NSUs 704 in the RP. The PMC 1602 reconfigures the NPSs 706, NMUs 702, and NSUs 704 according to the configuration data contained in the PDI. The PMC 1602 reconfigures the NPSs 706, NMUs 702, and NSUs 704 via memory mapped transactions through the NPI 710 as previously described. Traffic can continue on paths that do not enter and do not exit, or are independent of, the NoC 108 that is in the RP during the reconfiguration. Since NPSs 706, NMUs 702, and NSUs 704 that are not part of the RP are not reconfigured and not affected by the reconfiguration, paths among and between these NPSs 706, NMUs 702, and NSUs 704 may continue operation during the reconfiguration of the NPSs 706, NMUs 702, and NSUs 704 in the RP.

In block 1908, the PMC 1602 enables the NSUs 704 that have been reconfigured into a used state. After the reconfiguration, the NSUs 704 that were disabled or halted before the reconfiguration are enabled and enter into normal operation. In block 1910, the PMC 1602 enables the NMUs 702 that have been reconfigured into a used state. After the reconfiguration, the NMUs 702 that were disabled or halted before the reconfiguration are enabled and enter into normal operation. Hence, communication via the NPSs 706, NMUs 702, and NSUs 704 in the RP that was reconfigured is permitted to occur in block 1810 of FIG. 18.

Figure 20:
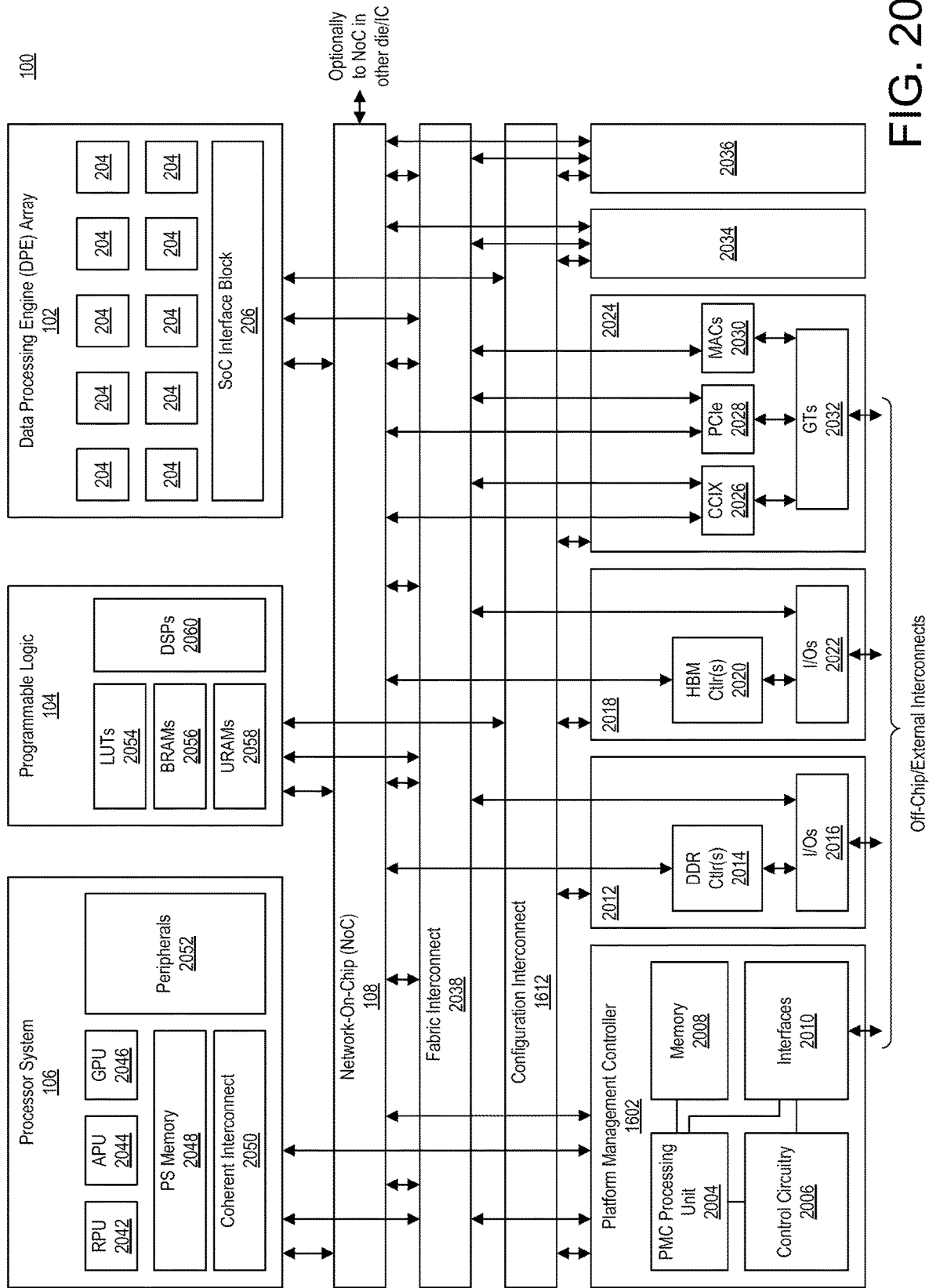
FIG. 20 illustrates another example implementation of the SoC of FIG. 1.

FIG. 20 illustrates another example implementation of the SoC 100. FIG. 20 illustrates a logical view of the various components and/or subsystems of SoC 100. In the example of FIG. 20, the SoC 100 includes DPE array 102, PL 104, PS 106, and NoC 108. SoC 100 further includes a PMC 1602, one or more hardwired circuit blocks 2012, 2018, 2024, 2034, and 2036, a fabric interconnect 2038, and a configuration interconnect 1612.

Fabric interconnect 2038 represents the interconnect circuitry used in the PL regions 104. As shown, the various different subsystems such as the DPE array 102, the PL regions 104, the PS 106, the PMC 1602, the hardwired circuit blocks 2034 and 2036, and selected components within the hardwired circuit blocks 2012, 2018, and 2024 are connected to the fabric interconnect 2038. The configuration interconnect 1612 is used to program (e.g., configure) the DPE array 102, the PL regions 104, the PS 106, the PMC 1602, and the hardwired circuit blocks 2034 and 2036. For example, the configuration interconnect 1612 can enable frame-based programming of the PL regions 104 by the PMC processing unit 2004 of the PMC 1602.

The PMC 1602 operates as the root of trust for the SoC 100. In the example of FIG. 20, the PMC processing unit 2004 may include one or more processors that are capable of executing program code. The PMC 1602 further includes control circuitry 2006, a memory 2008, and one or more interfaces 2010. PMC processing unit 2004 is capable of executing control software from memory 2008, which may include RAM and/or ROM. PMC processing unit 2004 is capable of performing various security and safety functions within the SoC 100. For example, PMC processing unit 2004 is capable of booting SoC 100, performing partial reconfiguration of SoC 100, configuring the DPE array 102, configuring the PL regions 104, configuring the PS 106, and configuring the NoC 108 by way of the configuration interconnect 1612, the fabric interconnect 2038, and/or the NoC 108 (e.g., once initially configured as described in connection with FIG. 10).

The PMC processing unit 2004 is capable of communicating with the control circuitry 2006. The control circuitry 2006 may include security circuitry, safety circuitry, system monitor circuitry, e-fuse circuitry, and power management circuitry for the entire SoC 100. In this regard, PMC processing unit 2004 is capable of writing to control registers in the circuitry for setting the various functions and configurations for SoC 100 on a chip-wide basis. Interfaces 2010 can include any of a variety of flash memory interfaces (e.g., for reading configuration data such as a PDI for SoC 100 from an external source), memory card interfaces for receiving one or more different varieties of memory cards, a SelectMAP configuration interface, a JTAG interface, and one or more other off-chip connections and/or interfaces.

Hardwired circuit block 2012 includes one or more configurable memory (e.g., DDR) controllers 2014 connected to NoC 108 and to configurable I/Os 2016. Hardwired circuit block 2018 includes one or more configurable high bandwidth memory (HBM) controllers 2020 connected to NoC 108 and to configurable I/Os 2022. Hardwired circuit block 2024 includes a Cache Coherent Interconnect for Accelerators (CCIX) block 2026, one or more configurable Peripheral Component Interconnect Express (PCIe) blocks 2028, one or more configurable Media Access Control (MAC) blocks 2030 each coupled to configurable gigabit transceivers (GTs) 2032. Hardwired circuit blocks 2034 and 2036 may implement one or more of a configurable video codec block, a configurable forward error correcting block, a configurable cryptographic block, and a configurable analog mixed signal block (e.g., including one or more configurable digital-to-analog converters (DACs) and/or analog-to-digital converters (ADCs)). It should be appreciated that SoC 100 may include fewer or more hardwired circuit blocks than illustrated in FIG. 20.

The PS 106 is connected to the NoC 108, the fabric interconnect 2038, and to the configuration interconnect 1612. As shown, the PS 106 can include one or more real-time processing units (RPUs) 2042, one or more application processing units (APUs) 2044, and one or more graphics processing units (GPUs) 2046. The PS 106 further may include a PS memory 2048 that may include a level 2 cache and a system memory management unit (SMMU). The PS 106 further can include a coherent interconnect 2050, a snoop control unit (SCU—not shown), and one or more peripherals 2052. The coherent interconnect 2050 and the SCU enable other masters to read and/or write to the level 2 cache memory. For example, the RPUs 2042 and master circuit blocks in the PL 104 are able to snoop the level 2 cache memory. The peripherals 2052 may include one or more different I/O interfaces including, but not limited to, Universal Serial Bus (USB), Ethernet. Universal Asynchronous Receiver-Transmitter (UART), Controller Area Network Flexible Data Rate (CAN FD). Serial Peripheral Interface, DisplayPort, High-Definition Multimedia Interface (HDMI), I2C interface, and Serial ATA interface.

The PL regions 104, as previously described, can include LUTs 2054, BRAMs 2056, URAMs 2058, and DSPs 2060 interconnected by the fabric interconnect 2038. As shown, the PL regions 104 are connected to the NoC 108, to the fabric interconnect 2038, and to the configuration interconnect 1612. The DPE array 102 may include a plurality of hardwired and programmable DPEs 204 that are interconnected. The DPEs 204 connect to the NoC 108, the fabric interconnect 2038, and to the configuration interconnect 1612 through SoC interface block 206.

In the example of FIG. 20, the NoC 108 may also be connected or coupled to another NoC located in another die and/or IC. For example, in the case where the SoC 100 is formed of a plurality of dies interconnected by way of an interposer or other carrier, the NoC 108 can be coupled through the interposer or carrier with the NoC in other ones of the dies.

In the example of FIG. 20, the CCIX 2026, or other multi-chip cache-coherent equivalent, may also be connected or coupled to another CCIX located in another die and/or IC. For example, in the case where the SoC 100 is formed of a plurality of SoCs interconnected by way of a multi-chip cache-coherency protocol, the CCIX 2026 can be coupled through the GTs 2032 in other ones of the SoCs.

FIG. 20 illustrates different structural and functional aspects of the programmable device platform implemented by SoC 100. In this regard, SoC 100 provides a flexible platform where different functions may be remapped from one subsystem to another. For example, a particular function may be remapped from the DPE array 102 to the PL regions 104, from PL regions 104 to the DPE array 102, from the DPE array 102 to a hardwired circuit block, from a hardwired circuit block to the DPE array 102, from the PL regions 104 to a hardwired circuit block, and/or from a hardwired circuit block to the PL regions 104. This remapping may be performed without disrupting the users application in other portions of the SoC 100.

While SoC 100 has been largely described according to the different subsystems contained therein, e.g., PL 104, PS 106, DPE array 102, NoC 108, and/or hardwired circuit blocks, the platform also provides resources in the form of "compute engines", "hardware acceleration engines", "memory resources", "external interfaces", and "pervasive interconnects" that extend across the different subsystems described.

The term "compute engine", as defined herein, refers to a processor that is capable of executing program code. Compute engines are also referred to as "group A" type circuit blocks. Various types of compute engines have been described in connection with the SoC 100 such as any of the various processors implemented in the PS 106 (e.g., RPUs 2042, APUs 2044, and/or GPUs 2046). Other examples of compute units that can be implemented in SoC 100 include soft-processors implemented within the PL regions 104. An illustrative and non-limiting example of a soft-processor is the MicroBlazem Soft processor core available from Xilinx, Inc. of San Jose, Calif. It should be appreciated that custom soft-processors also may be implemented in PL regions 104.

The term "hardware acceleration engine", as defined herein, refers to special-purpose or application-specific circuitry that may be implemented as a hardwired circuit block 110 or as a circuit block in the PL regions 104. Hardware acceleration engines are also referred to as "group B" type circuit blocks. Examples of hardware acceleration engines include, but are not limited to, DPEs, ADCs, DACs. DSPs, video codecs, cryptographic engines, and custom circuit blocks implemented in the PL regions 104.

The term "memory resources", in reference to the SoC 100, includes any memory structures available in the PS 106 and/or the PL regions 104. Memory resources are also referred to as "group C" type circuit blocks. For example, memory resources may include on-chip memory (OCM) and cache memories available in the PS 106 (e.g., illustrated as PS memory 2048) and/or LUTs (e.g., LUTRAM), URAM, and/or BRAM available in the PL regions 104. Memory resources may also include off-chip or external memories such as DDR, HBM, or other memory that may be accessible using hardwired memory controllers and/or custom memory controllers implemented in the PL regions 104.

The term "external interfaces", in reference to the SoC 100, refers to controllers for industry standard protocols and communications with circuits and/or systems located off-chip. External interfaces are also referred to as "group D" type circuit blocks. Examples of external interfaces of SoC 100 include, but are not limited to, CCIX 2026, PCIe 2028, MACs 2030, Ethernet (in the PS 106), and custom controllers implemented in the PL regions 104 for standard and/or non-standard protocols.

The term "pervasive interconnects", in reference to SoC 100, refers to common infrastructure that is used to convey information such as data and interrupts or other control signals, and also enables the flexible platform such that different functions can be remapped from one subsystem to another. Pervasive interconnects are also referred to as "group E" type circuitry or circuit blocks. Examples of the common infrastructure included in pervasive interconnects includes the NoC 108, the coherent interconnect 2050 of PS 106, and custom signal pathways implemented in PL regions 104. The pervasive interconnects of SoC 100 are used for configuration, connectivity, configurability, firewalling, and communication among the various subsystems described herein.

For purposes of illustration, the coherent interconnect 2050 is capable of establishing connections with hardwired circuit blocks 110 (e.g., 2012, 2018, 2024, 2034, and/or 2036), circuit blocks implemented in PL regions 104, and/or DPEs 204 of DPE array 102 via NoC 108 and/or fabric interconnect 2038. For example, compute units of PS 106 and compute units implemented in PL regions 104 are capable of accessing the coherent interconnect 2050. Similarly, hardware accelerator engines, whether hardwired or implemented in PL regions 104, are capable of accessing the coherent interconnect 2050. Memory resources, whether external, in the PL regions 104, or in the PS 106 are connected to the coherent interconnect 2050.

NoC 108 is capable of implementing data pathways and messaging between compute engines, hardware acceleration engines, memory resources, external interfaces, and the coherent interconnect 2050 for pervasive data and messaging pathways between any and all of such components.

PL regions 104 are capable of implementing customized data pathways for user-defined, custom, hardware accelerator engines, peripherals, and/or other compute blocks that may be implemented in PL regions 104.

Figure 23:
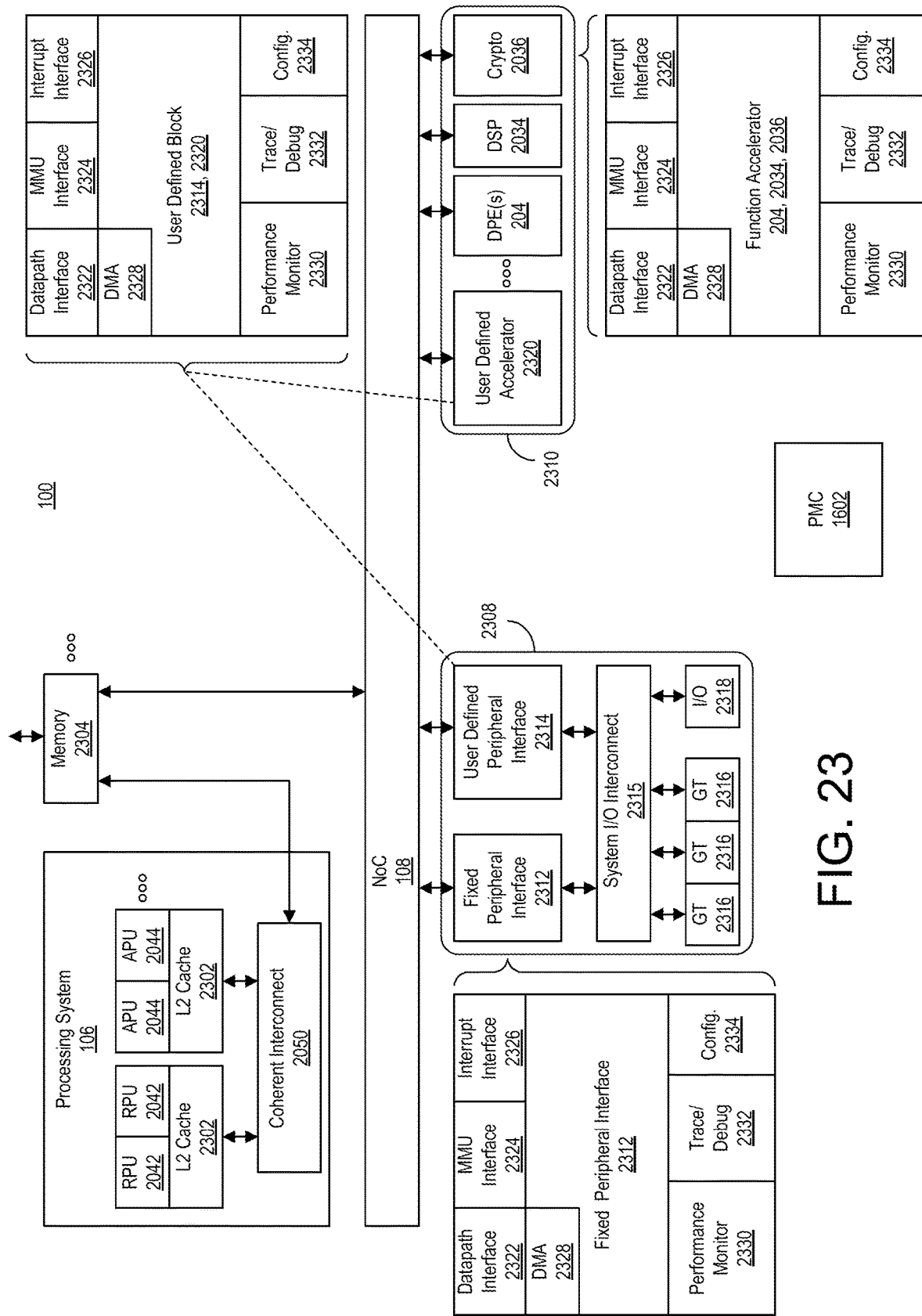
FIG. 23 illustrates further structural and functional aspects of the SoC of FIG. 1.

FIG. 20 illustrates the use of pervasive configuration and interrupt pathways for static and dynamic configuration, control, and status of components in groups A, B, C, D, and E. The pervasive configuration may be achieved using the PMC 1602 accessing a common set of configuration, control, and status registers (CCSRs) across the set of heterogenous components (e.g., in the various subsystems) of the SoC 100 whether such components perform the same function or different functions. FIG. 23, for example, illustrates that components, whether performing the same function or a different function, and being implemented in different subsystems of the SoC 100, may have commonly configurable interrupt status registers, error control and status registers, and/or performance control and status registers.

The pervasive configuration illustrated for the SoC 100 can be used to enable a higher level of compound or macro functions. An example of a macro function that can be enabled is a DMA data movement between components on the SoC 100. Another type of macro function is a pipeline of tasks. The pipeline of tasks may be a pipeline stage of acceleration (e.g., a hardwired circuit block or a user defined accelerator in the PL) followed by a pipeline stage of computation (e.g., processing performed by a compute device in the PS or DPE(s) of the DPE array).

In one example, pervasive configuration for both the DMA type macro function and pipelined task execution type macro function may be implemented in the SoC 100 using a common descriptor definition. The common descriptor definition is interpreted universally across the set of heterogenous components of the SoC 100 (e.g., whether circuitry in the PL, one or more DPEs, a PS processor, or a hardwired circuit block).

As an illustrative example, one component in the SoC 100 interprets an inbound descriptor for performing a pipeline stage function. Based on the results of that function, the component generates an outbound descriptor for the next heterogenous component to interpret to perform the next pipeline stage function. This common descriptor approach also allows for intermixing of the types of heterogenous components that may be used in performing the task. As noted, a PL element interpreting the descriptor and communicating with other components on the SoC 100 can be replaced with a hardware acceleration engine interpreting the same descriptor and communicating with the same adjacent components when implemented in a different SoC 100 that uses the same platform architecture or by a different application in the same SoC 100.

Figure 21:
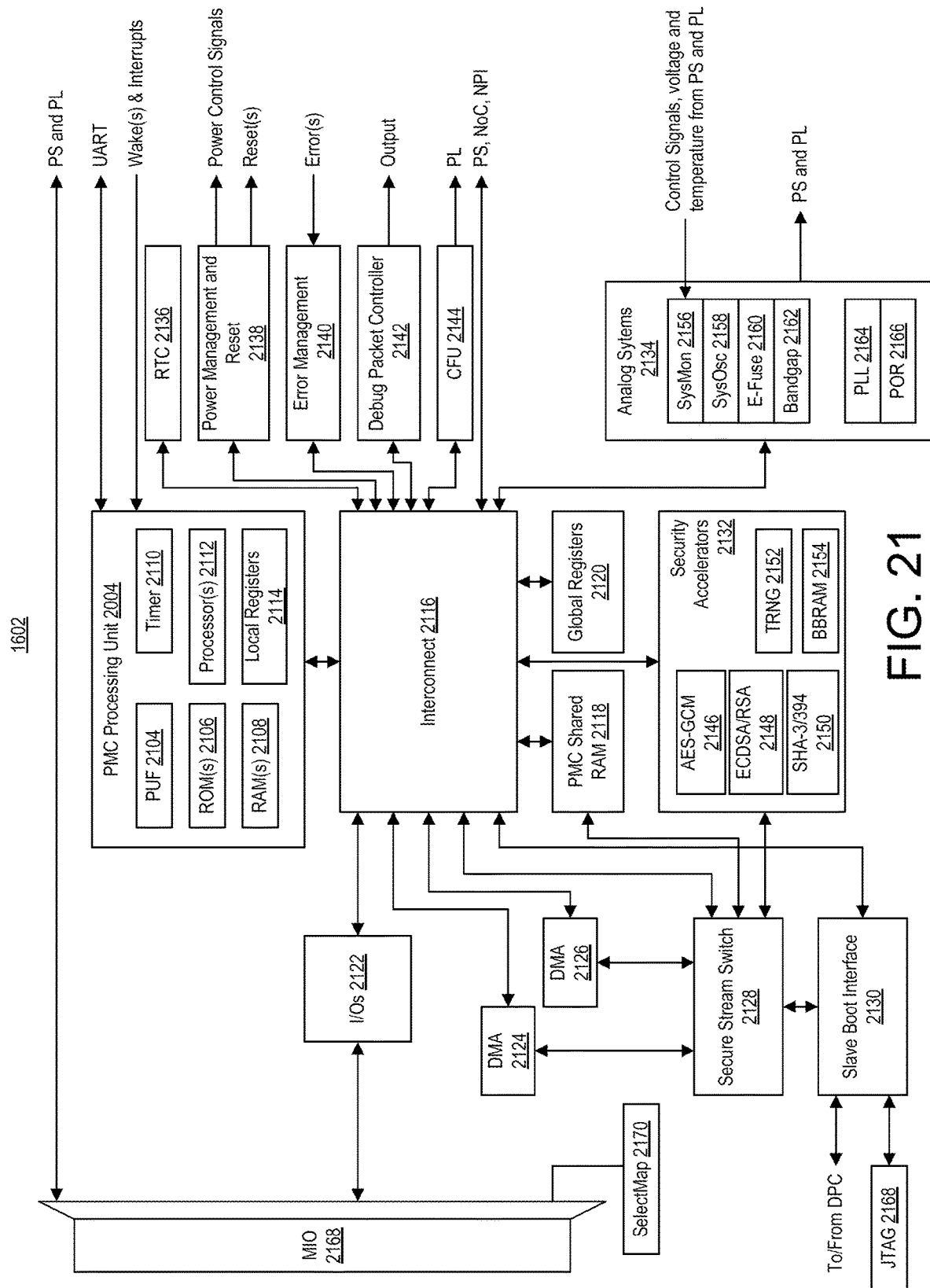
FIG. 21 illustrates an example implementation of the Platform Management Controller (PMC).

FIG. 21 illustrates an example implementation of PMC 1602. PMC 1602 is a hardwired circuit block on the SoC 100. In the example of FIG. 21, the PMC 1602 includes the PMC processing unit 2004 (being separate and distinct from PS 106). PMC processing unit 2004 can include a physically unclonable function (PUF) 2104, one or more ROMs 2106, one or more RAM(s) 2108, one or more timer(s) 2110, one or more processors 2112, and local registers 2114. In an example implementation, the PMC 1602 is on a separate power domain (e.g., has a separate and independent power source) that is independent of the PL 104, the DPE array 102, and/or the PS 106.

In an aspect, PMC processing unit 2004 includes a plurality of processors 2112 operating in lockstep using appropriate voting circuitry. In another aspect, PMC processing unit 2004 includes a plurality of processors 2112 where one or more processors 2112, which may operate in lockstep, are dedicated to accessing (e.g., executing code stored in) RAM(s) 2208 and one or more other processors 2112, which also may operate in lockstep, that are dedicated to accessing (e.g., executing code stored in) ROM(s) 2206.

For example, one or more processors 2112 are dedicated to executing code stored in ROMs 2106. The ROM dedicated processor(s) 2112 are the first processors active out of reset during boot of SoC 100. The ROM dedicated processor(s) 2112, in executing code stored in ROM(s) 2106, are capable of performing operations such as device initialization, boot interface validation, release of further processors 2112 of the PMC 1602 from reset, and load a PMC platform loader and manager into the RAM(s) 2108. The ROM dedicated processor(s) 2112 are also capable of performing secure boot, post-boot security monitoring, and PUF management. The RAM dedicated processor(s) 2112 are capable of executing code stored in RAM(s) 2108 once released from reset.

In any case, ROM(s) 2106 and RAM(s) 2108 are accessible only by processor(s) 2112. In another aspect, each processor 2112 has a ROM 2106 and a RAM 2108 so that each processor 2112 has an independent and dedicated ROM 2106 and an independent and dedicated RAM 2108. RAM 2108 may be protected with error correction coding (ECC) circuitry. Processors 2112 may be used to power up and configure SoC 100 by executing code stored in ROM(s) 2106 and executing firmware loaded from a main boot device into RAM(s) 2108 by way of executing the code stored in ROM(s) 2106. Local registers 2114 are configuration registers for PMC processing unit 2004 and may only be accessed by PMC processing unit 2004.

Post boot, processor(s) 2112 are capable of performing a variety of different functions using the various components contained in PMC 1602. For example, processors 2112 are capable of performing power-management, voltage and temperature monitoring, safety and security event response, and the like for the SoC 100. As pictured, processors 2112 are capable of receiving interrupt and wake signals for these purposes.

PMC processing unit 2004 is connected to interconnect 2116. PMC processing unit 2004 is capable of communicating with other components within PMC 1602 and SoC 100 by way of interconnect 2116. Interconnect 2116 may include a plurality of memory mapped switches and interfaces and a plurality of stream switches and interfaces. Interconnect 2116 is connected to PMC shared RAM 2118, global registers 2120, I/Os 2122. DMAs 2124 and 2126, secure stream switch 2128, slave boot interface 2130, security accelerators 2132, analog systems 2134, Real-time Clock (RTC) 2136, power management and reset 2138, error management 2140, debug packet controller 2142, and Configuration Frame Unit (CFU) 2144.

PMC shared RAM 2118 may be used to store configuration data for the SoC 100 during processing and as general-purpose data-processing RAM for PMC 1602. Global registers 2120 are configuration registers that are accessible by any (e.g., all) masters in the PMC 1602. The global registers 2120 may include general-purpose, power control, error management registers, and a service interrupt request interface. I/Os 2122 may include one or more I/Os coupled to a multiplexed input/output (MIO) 2168. As shown, MIO 2168 further connects to PS 106 and PL 104. Examples of I/O circuit blocks that can be included in I/Os 2122 include, but are not limited to, I2C and one or more flash interfaces such as SPI and/or SD/eMMC.

DMAs 2124 and 2126 are used for transferring data within the PMC 1602 for configuration of SoC 100 and processing of the configuration data. Secure stream switch 2128 ensures that data streams provided to security accelerators 2132 for processing are secure. The slave boot interface (SBI) 2130 facilitates slave boot and/or configuration in multi-die SoC configurations. Though not shown, SBI 2130 may be connected to SelectMap 2170 and NoC 108.

Security accelerators 2132 can include an AES-GCM circuit block 2146, an Elliptic Curve Digital Signature Algorithm/Rivest-Shamir-Adleman (ECDSA/RSA) circuit block 2148, a Secure Hash Algorithm 3/394 (SHA-3/394) circuit block 2150, a true random number generator (TRNG) circuit 2152, and a battery-backed RAM (BBRAM) 2154 circuit block. AES-GCM circuit block 2146 is a symmetric key cryptography engine that is capable of performing encryption and/or decryption. ECDSA/RSA circuit block 2148 is a public-key cryptography engine that is capable of performing authentication. SHA-3/394 circuit block 2150 is capable of performing secure hash operations. TRNG circuit 2152 is capable of generating random numbers.

Analog systems 2134 can include a system monitor 2156 capable of monitoring voltage and temperature from one or more remote system monitor circuits that may be located at various places and/in various subsystems around the SoC 100; system oscillator(s) 2158 capable of generating the clock signal for PMC 1602; e-fuse controller 2160 capable of maintaining and/or managing e-fuse circuitry on the SoC 100; bandgap circuitry 2162 capable of generating one or more reference voltages for analog devices in the SoC 100 such as DACs and/or ADCs that may be implemented on the SoC 100 as hardwired and programmable circuit blocks; one or more phase lock-loops (PLLs) 2164 capable of generating clock signals for the PMC 1602, the NoC 108, the NPI 710, and the PS 106; and a Power-On-Reset (POR) circuit 2166.

The e-fuse controller 2160 is capable of reading the e-fuse circuitry. The e-fuse circuitry (e.g., e-fuse memory elements) may be used to store design information such as device DNA and security keys. The e-fuse circuitry further may control features such as disabling JTAG 2168.

RTC 2136 is a clock circuit that is capable of operating on a highly accurate crystal oscillator. The RTC 2136 may be used to measure current time and generate alarms at specific times for various operating system and device management functions within SoC 100. Power management and reset circuitry 2138 implements the logic and interfaces necessary to control power-islands, power domains, and resets to other circuit blocks on the SoC 100. The power management and reset circuitry 2138 further connects to the PS 106 to control power-islands implemented in the PS 106. Error management circuitry 2140 is capable of receiving, recording, and responding to errors from other subsystems within the SoC 100. Debug packet controller 2142 is a packet controller for a high-speed debug port (HSDP) that processes packets passed thereto from other interfaces on the SoC 100 such as high-speed serial interfaces and/or PCIe blocks.

CFU 2144 is capable of performing configuration and readback of configuration data provided or loaded into configuration registers of the PL 104. The PMC 1602, for example, transfers the PL bitstream (e.g., configuration data) through CFU 2144 to configure the PL 104.

The SoC 100 may be implemented to include several major power domains that are controlled by the power management and reset circuitry 2138. The power domains include a low power domain that includes the RPU and OCM; a full power domain that includes the APUs and high speed I/Os; a NoC and system double data rate (DDR) power domain; and a PL power domain.

Other power domains may be created within the SoC 100 that can be controlled via the circuit board on which the SoC 100 is disposed. These other power domains may include, but are not limited to, further I/O power domains, a battery power domain, a PMC power domain (e.g., where the PMC has its own power domain and supply), a PL RAM power domain, and a DPE array power domain.

Figure 22:
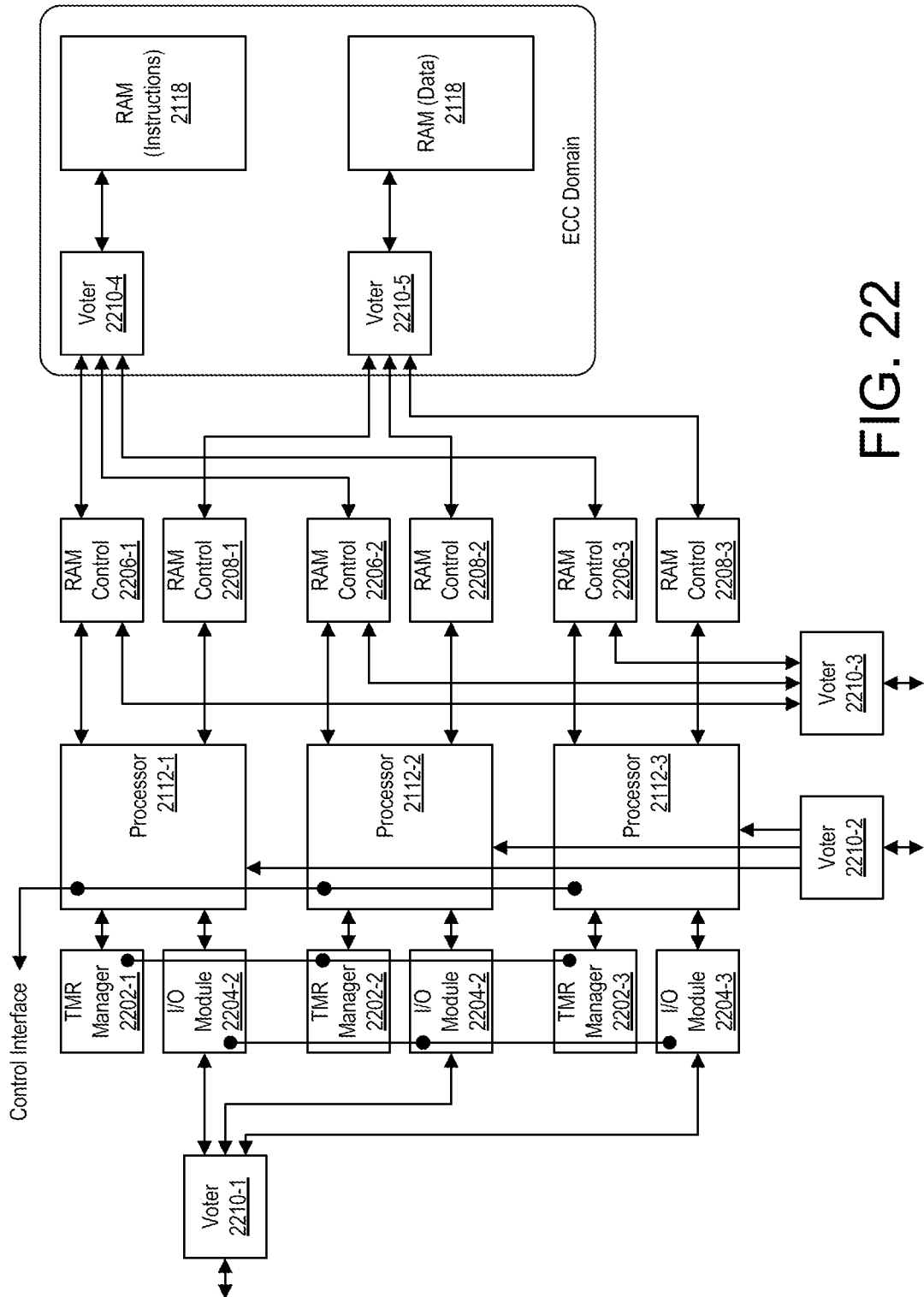
FIG. 22 illustrates an example implementation of the processors of the PMC of FIG. 21.

FIG. 22 illustrates an example arrangement of the processors 2112 of the PMC processing unit 2004. In the example of FIG. 22, the processors 2112 are arranged in a triple-redundant architecture. In one example implementation, processors 2112 are implemented as hardwired Microblaze processors, though other types of processors may be used.

Each processor 2112 is connected to a Triple Modulo Redundancy (TMR) manager 2202 and an I/O module 2204. TMR managers 2202-1, 2202-2, and 2202-3 are interconnected. I/O modules 2204-1, 2204-2, and 2204-3 are also interconnected. Voter circuit 2210-1 is coupled to each of the I/O modules 2204. Each I/O module 2204 may include an interrupt controller, a timer, a General Purposes I/O (GPIO), and/or a UART. Each TMR manager 2202 is capable of managing the state of a respective one of processors 2112, including fault detection and error recovery.

Each voter circuit 2210 is capable of comparing the received input signals. Each voter circuit 2210 is capable of detecting mismatches in the received signals and accepting the majority result and continue to operate. The particular processor 2112 that provides the mismatched (e.g., losing result) is placed into reset while the other two remaining processors 2112 continue to operate in lockstep. If all three processors 2112 mismatch, each of the processors 2112 are reset.

Each processor 2112 is also connected to a RAM control circuit 2206 and a RAM control circuit 2208. RAM control circuits 2206 are connected to voter circuit 2210, which connects to an instruction RAM, e.g., RAM 2118. RAM control circuits 2208 are connected to voter circuit 2210-5, which connects to a data RAM, e.g., RAM 2118. As shown, RAM 2118 and voter circuits 2110-4 and 2110-5 are part of the ECC domain. In the example of FIG. 22, each RAM control circuit 2206 for the instruction RAM (e.g., 2206-1, 2206-2, and 2206-3) is connected to voter circuit 2210-3. Each of processors 2112-1, 2112-2, and 2112-3 is connected to voter circuit 2210-2. A control interface such as AXI4-Lite or other suitable control interface is connected to each of processors 2112-1, 2112-2, and 2112-3.

FIG. 22 illustrates an example of triple modular redundancy where processors 2112 are dedicated to accessing the RAM 2118. A similar architecture may be used for the ROM dedicated processors within the PMC 1602 as previously discussed. In another example, fewer than three processors 2112 may be used where one or two processors (in lockstep) 2112 are dedicated to executing code stored in the ROM 2106 and one or two other processors (in lockstep) 2112 are dedicated to executing firmware stored in RAM 2108.

The PMC 1602 is the root of trust within the SoC 100. The PMC 1602 is capable of building a chain of trust by ensuring that any external code loaded by the PMC 1602 for configuring any portion of SoC 100 is authenticated and decrypted (if required). For example, PMC 1602 is capable of performing authentication using the ECDSA/RSA circuit block 2148 and performing decryption using the AES-GCM circuit block 2146. In general, configuration data is authenticated and decrypted, the PMC 1602 may load the configuration data into the appropriate configuration registers of the appropriate subsystems and/or circuit blocks of SoC 100.

FIG. 23 illustrates further structural and functional aspects of SoC 100. FIG. 23 illustrates an example configuration where different types of compute engines and hardware acceleration engines are implemented across different ones of the subsystems of the SoC 100. In the example of FIG. 23, the compute engines, the hardware acceleration engines, the memory resources, and the external interfaces are implemented using standardized, or common, interfaces to other components and/or subsystems in SoC 100. These common interfaces allow the components shown to couple to a global interconnect resource on the SoC 100 which, in this example, is the NoC 108.

In the example of FIG. 23, the PS 106 includes a plurality of RPUs 2042 and a plurality of APUs 244, each coupled to coherent interconnect 2050 via a level 2 cache 2302 (e.g., part of PS memory 2048). Coherent interconnect 2050 is further connected to a memory 2304. Memory 2304 may be memory located in the PL regions 104, an external memory, or memory within PS 106 that is accessible by other circuit blocks in other subsystems, As shown, memory 2304 is also connected to NoC 108. Various other types of circuit blocks are connected to NoC 108 such as one or more external I/Os 2308 and one or more hardware acceleration engines 2310.

External I/Os 2308 include a fixed peripheral interface 2312 and a user defined peripheral interface 2314. Fixed peripheral interface 2312 is implemented as a hardwired circuit block, while user defined peripheral interface 2314 is implemented in the PL regions 104. Both fixed peripheral interface 2312 and user defined peripheral interface 2314 are connected to a system I/O interconnect 2315 (e.g., a local interconnect) and to GTs 2316 and/or I/Os 2318.

Hardware acceleration engines 2310 include a user defined accelerator 2320 implemented in PL regions 104, one or more (e.g., a group or groups) of DPEs 204 of the DPE array 102 where each group of one or more DPEs 204 is configured to perform particular function(s), a DSP hardwired circuit block 2334, and a cryptographic hardwired circuit block 2336.

In the example of FIG. 23, the fixed peripheral interface 2312, the user defined peripheral interface 2314, the user defined accelerator 2320, the DPE(s) 204, the DSP 2334, and the cryptographic engine (crypto) 2336 utilize a common interface despite performing different operations and being implemented across different subsystems. For example, each of the noted components may include a data path interface 2322, an MMU interface 2324, an interrupt interface 2326, a DMA 2328, a performance monitor 2330, a trace/debug interface 2332, and a configuration interface 2334. As such, despite the various components belonging to different groups as described above and/or being implemented across different subsystems of the SoC 100, each may have a same or common interface. The common interface supports the remapping of a function from one subsystem to another within the SoC 100 since the signaling for the function block remains constant despite being moved from the PL regions 104 to a hardwired circuit block or to DPEs, etc.

The data path interface 2322 is the interface circuitry that is capable of connecting to the global interconnect which is the NoC 108 in this example. The data path interface 2322, for example, may provide a standard interface for connecting to NMUs and/or NSUs of the NoC 108. The memory management unit (MMU) interface 2324 is capable of performing address translations between virtual addresses and physical addresses within the SoC 100. For example, the MMU interface 2324 is capable of accessing page tables stored in memory and/or maintaining locally cached copies of such tables for performing the address translations that may be used for transactions received and/or sent via the data path interface 2322. MMU interface 2324 is also capable of enforcing read/write permission and authorization to prevent the circuit block containing the MMU interface 2324 from performing unauthorized reads and/or writes to memory address.

The interrupt interface 2326 implements a standard interrupt or a user-defined and/or unique interrupt for the circuit block. In some cases, the interrupt for two or more circuit blocks may be shared, for example, when such circuit blocks are located in a same partition within the SoC 100. In that case, the destination of the interrupt may be shared among the circuit blocks. Further description relating to partitioning within the SoC 100 is described in greater detail with reference to the remaining figures.

The DMA 2328 is capable of performing data transfers via the NoC 108 and the data path interface 2322. The performance monitor 2330 can be coupled to other circuits and/or interfaces throughout the SoC 100. The performance monitor 2330 is capable of measuring quantities such as bandwidth and latency of the circuit block to which the performance monitor 2330 belongs, In one aspect, the performance monitor 2330 can filter and measure data signals flowing into and out from the circuit block to measure the number of transactions sent to a particular address range in a fixed period of time or other quantities. The performance monitor 2330 may communicate any measured data to a programmed destination via the NoC 108 (e.g., the PS 106 or the PMC 1602). The trace/debug interface 2332 is capable of sending and receiving trace and/or debug data over the NoC 108 for receipt by the PMC 1602. For example, the debug/trace interface is capable of receiving commands and sending trace/debug data to the debug packet controller 2142 in PMC 1602.

The configuration interface 2334 is connected to the NoC 108 and/or to other interconnects (e.g., configuration interconnect 1612 or fabric interconnect 2038) depending upon the particular subsystem in which the circuit block is located. For example, the PMC 1602 is capable of configuring the circuit block by providing configuration data to the configuration interface 2334. The configuration interface 2334, for example, allows the PMC 1602 to read and/or write to configuration registers located in the circuit block (not shown).

In another aspect, different circuit blocks may include fewer or any combination of the data path interface 2322, the MMU interface 2324, the interrupt interface 2326, the DMA 2328, the performance monitor 2330, the trace/debug interface 2332, and/or the configuration interface 2334. In one aspect, interrupt interface 2326 is configured to receive and/or generate interrupts. In an example implementation, the interrupt interface 2326 is implemented as a memory mapped interface. Interrupts may be received from other circuit blocks connected to the interrupt interface 2326 and/or provided to other circuits connected to the interrupt interface 2326. The interrupt signaling may be routed through the NoC 108 to particular hardwired circuit blocks 110, PS 106, or any other circuit blocks illustrated in FIG. 23.

In an illustrative example, the interrupt interface 2326 is capable of generating and/or receiving doorbell interrupts. A doorbell interrupt is an interrupt that traverses from one domain, e.g., one partition, to another within the SoC 100. For example, through two partitions may be isolated from one another, one or more interrupts may be permitted to pass into and/or out from the partitions to other partitions and/or the PMC 1602 to communicate a message or trigger/initiate a predetermined action. The doorbell interrupts may traverse from one domain or partition to another by way of the NoC 108.

In one example, a PCIe controller may be implemented in the PL 104. The PCIe controller is coupled to DDR memory through the NoC 108. In this example, the PCIe controller may use the common interface and, as such, include the interrupt interface 2326. A host system in communication with the SoC 100 may generate new jobs for the PCIe controller to perform and submit the new jobs (e.g., memory accesses) to the PCIe controller in the PL 104 of the SoC 100. The host system would, for example, cause an interrupt to be generated to the PCIe controller causing the PCIe controller to program one or more DMAs to perform the memory accesses.

FIG. 23 illustrates the modularity of functions and services across the components in groups A, B, and C of the SoC 100. The components may maintain this modularity even when the components serve distinct functions from one another. For example, the components implemented in the PL regions 104 are modularized such that the PL components have a standard interface to the components in groups D, E. and F. Each PL component can be deployed in the service of any one of the other functions implemented as a component in group A, B. or C. Each component of group A, B, or C also has communication and data pathways to either another PL component or a different component in group A, B. and C.

In another example of the modularity that is achieved using SoC 100, a particular function deployed as a PL component can be deployed in other portions of the PL 104 to implement multiple concurrent instances of the same function. The common interface provides for a common interrupt, address translation, debug, and performance monitoring scheme being deployed across components in the SoC 100 whether in group A, B, or C. Despite providing for the common interface, in another aspect, components implemented in groups A, B, or C can be implemented with a unique or custom set of interrupts, address translation, debug, and performance monitoring schemes.

Figure 24:
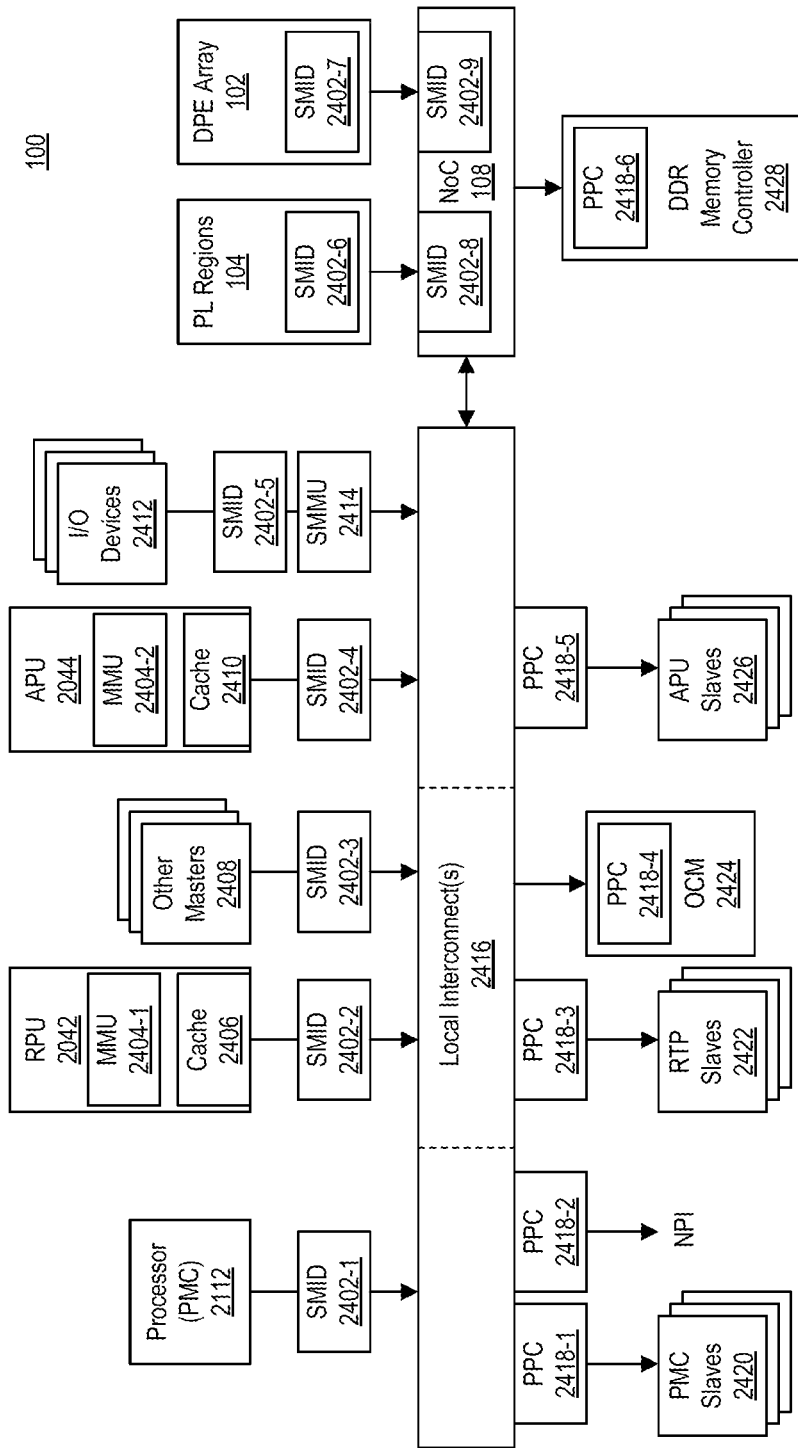
FIG. 24 illustrates further structural and functional aspects of the SoC of FIG. 1.

FIG. 24 illustrates further structural and functional aspects of the SoC 100. In the example of FIG. 24, SoC 100 includes a variety of additional circuits that are capable of implementing security features. These additional circuits may be used to create different and independent partitions in the SoC 100 and firewalling among the different partitions. Each partition may execute its own application therein. In the example of FIG. 24, a plurality of System Management Identifier (SMID) circuits 2402 and Programmable Protection Circuits (PPCs) 2418 are included.

Processor 2112, RPU 2042, APU 2044, other masters 2408, and I/O devices 2412 are connected to local interconnects 2416 via SMID circuits 2402. I/O devices 2412 are further connected to local interconnects 2416 via SMMU 2414. Local interconnect 2416 is connected to the NoC 108. PL 104 and/or DPE array 102 are connected to the NoC 108. RPU 2042 includes an MMU 2404-1 and a cache 2406. APU 2044 includes an MMU 2404-2 and a cache 2410.

Each SMID circuit 2402 is programmable to use a particular SMID. During configuration, the PMC 1602 is capable of assigning and writing an SMID to the configuration registers in each of the various SMID circuits 2402 or at least those SMID circuits 2402 that are being used. The SMID circuit 2402 for each of the various components, e.g., processor 2112, RPU 2042, APU 2044, other masters 2408, I/O devices 2412. PL 104, and/or DPE array 102, is capable of attaching or inserting a SMID into the transactions initiated by the respective components. As such, each transaction originating from processor 2112, for example, will include an SMID in the transaction that has been inserted by SMID 2402-2 as assigned by the PMC 1602. Similarly, each transaction originating from RPU 2042 will have an SMID that has been inserted by SMID 2402-2 as assigned by the PMC 1602. In this manner, the source of the transactions from the various components in the SoC 100 may be identified by the particular SMID within that transaction. The SMIDs assigned to the SMID circuits 2402 may be unique across the SoC 100.

The PPCs 2418 are capable of protecting access to slave circuits within the SoC 100. Each of the PPCs 2418 is capable of checking the particular SMID of each transaction entering the circuit block. Each of the PPCs 2418 is capable of checking whether the SMID of the transactions is an allowed SMID, e.g., on a list of allowed SMIDs maintained by the respective PPCs 2418. Each of the PPCs 2418 is also capable of checking that the address or address range to be accessed by a transaction is an address range for which the SMID is authorized to access. In this regard, the PPCs 2418 are capable of enforcing access privileges by ensuring that only authorized circuit blocks (based on SMID) are able to access other circuit blocks and further only access those address ranges for which the particular SMIDs are permitted.

In one aspect, PPCs 2418 includes a first type that is configured to protect configuration registers of circuit blocks. Such PPCs 2418 are capable of allowing only authorized SMIDs to access the configuration registers and only those particular configuration registers having an address specified on the list of allowed address(es) for the respective allowed SMID(s). Examples of such PPCs 2418 include, but are not limited to, PPCs 2418-1, 2418-2, 2418-3, and 2418-5. These PPCs 2418 provide fine-grained protection. PPCs 2418 may also include a second type that is configured to protect memories. The second type of PPC 2418 provides memory protection and isolation. Examples of such PPCs 2418 include, but are not limited to 2418-4 and 2418-6.

The SMID circuits 2402 and the PPCs 2418 are configured by the PMC 1602. For example, the PMC 1602 is capable of writing to the configuration registers in each of the SMID circuits 2402 and each of the PPCs 2418 used by a given design (e.g., per the PDI loaded into the SoC 100). The PMC 1602, for example, assigns the SMIDs to the various circuit components of the SoC 100 and configures the SMID circuits 2402 accordingly. The PMC 1602 further writes the list of allowed SMIDs and/or the permitted addresses and/or address ranges that each SMID is permitted to access into the configuration registers of the PPCs 2418. These operations, at least in part, are capable of creating two or more partitions that are isolated from one another.

In this regard, PPC 2418-1 is capable of allowing only authorized transactions from authorized sources to access PMC slaves 2420. PPC 2418-2 is capable of allowing only authorized transactions from authorized sources to access the NPI 710. PPC 2418-3 is capable of allowing only authorized transactions from authorized sources to access RTP slaves 2422. PPC 2418.4 is capable of allowing only authorized transactions from authorized sources to access OCM 2424. PPC 2418-5 is capable of allowing only authorized transactions from authorized sources to access APU slaves 2426. PPC 2418-6 is capable of allowing only authorized transactions from authorized sources to access DDR memory controller 2428.

In the example of FIG. 24, the particular location of the SMID circuits 2402 and the PPCs 2418 is shown for purposes of illustration. The SMID circuits 2402 and the PPCs 2418 may be implemented within circuit blocks as part of an interface, within the signal path between circuit blocks, or the like. The SMID circuits 2402 and PPCs 2418 may be implemented in different physical locations that provide logical equivalency. For example, a plurality of blocks may have an aggregated intermediary that attaches to a global pathway such as the NoC 108. In that case, the aggregated intermediary may include the SMID circuit 2402 and/or the PPC 2418 as the case may be rather than each of the individual circuit blocks that aggregates through the intermediary. This may be true for both ingress and egress points in the NoC 108.

In the example of FIG. 24, local interconnects 2416 may represent one physical circuit block that is capable of merging multiple logical functions. In another example, the NoC 108 may be implemented to include one or more SMID attach points. In other words, SMID circuits 2402 (e.g., 2402-8 and 2402-9) may be implemented in the NoC 108 as opposed to within PL region 104 and/or DPE array 102. The SMID circuits 2402 may be implemented in the NoC 108 at ingress points, at egress points, or at a combination of ingress and egress points.

In the example of FIG. 24, the various connections to local interconnect 2416 enter and exit the NoC 108 by way of one gateway. Each port of the NoC 108 is capable of receiving transactions from one logical source or from a plurality of logical sources. Similarly, each port of the NoC 108 is capable of receiving transactions from one physical source or from a plurality of physical sources. A physical source may be a circuit block in a particular subsystem, while a different physical source is a different circuit block in a different subsystem.

For example, processor 2112, RPU 2042, and APU 2044 each have an SMID circuit 2402. Each of the processor 2112. RPU 2042, and APU 2044 is capable of initiating transactions with the unique SMID assigned thereto based on the configuration performed by the PMC 1602. The transactions flow through to the NoC 108 with their respective SMIDs to their destinations. Similarly, transactions from the PL region 104 or the DPE array 102 each have the SMID inserted by SMID 2402-6 or SMID 2402-7, as the case may be. The transactions from the PL regions 104 and the DPE array 102 carry the SMIDs through to the destinations.

As an illustrative example, consider the case where a circuit block implemented in the PL region 104 initiates transactions A, B, and C. Each of transactions A, B. and C carries the SMID assigned by SMID circuit 2402-6 (or SMID circuit 2402-8 if implemented in the NoC 108). If transaction A is directed to DDR memory controller 2428, the NoC 108 functions as both the ingress and egress pathway. PPC 2418-6 is capable of checking that the circuit block in PL region 104 has the right to access DDR memory controller 2428 (e.g., based on SMID) and has the right to access the particular address(es) of memory specified by the transaction. PPC 2418-6 is capable of rejecting transaction A when the source of transaction A does not have adequate rights.

Transaction B may be directed to a PMC slave 2420, while transaction C is directed to an RTP slave 2422. In the case of transaction B, PPC 2418-1 checks whether the source of transaction B (based on the SMID) is permitted to access the particular PMC slave 2420 specified by the transaction. In the case of transaction C, PPC 2418-3 checks whether the source of transaction C (based on the SMID) is permitted to access the particular RTP slave 2422 specified by the transaction. Each PPC 2418.1 and PPC 2418-3 permits the respective transaction or rejects the respective transaction based on the SMID and the particular target (e.g., particular PMC slave 2420 or particular RTP slave 2422) of the transaction. Thus, the logical functioning of the SMID attachment and the egress checking (e.g., as performed by PPUs 2418) may be physically distributed within the SoC 100.

In another example, an I/O device 2412 may be an external flash device from which a boot image is loaded into a first PMC slave 2420. In this example, PMC slaves 2420 may be memory slaves such as memories in which boot code Is stored or registers for programming or configuring other blocks in the SoC 100 such as a register set for configuring the PL regions 104 and/or the DPE array 102. In another example, the boot image may be program code from which the processor 2112 will boot. In this example, the various gateways, e.g., PPUs 2418 and SMID circuits 2402 have been configured by the PMC 1602 to only allow the boot image to be loaded into one particular PMC slave 2420. Accordingly, the Y/O device 2412 is only permitted to write the contents of the image file to the designated, e.g., the first, PMC slave 2420 as regulated by PPU 2418-1. The I/O device 2412 is not permitted to read or write to other PMC slaves 2420.

Continuing with the example, processor 2112 is authorized through the authentication scheme (to be described herein in greater detail) to load the boot image. For example, PPC 2418-1 may be configured to permit, based on the SMID corresponding to SMID circuit 2402-1, to permit processor 2112 to read the PMC slave 2420 to which the boot image was stored by the I/O device 2412 (which only had write access). Processor 2112 is only able to read the boot image and decrypt the boot image into a second PMC slave 2420, e.g., a working memory for processor 2112. Processor 2112 may then use the decrypted boot image stored in the second PMC slave 2420 to program other configuration registers, e.g., by writing to a third PMC slave 2420. The third PMC slave 2420 may be configuration registers for PL regions 104 or configuration registers for other circuit blocks.

In another aspect, the RPU 2042 may have a separate local interconnect than the PMC 1602 and/or the other processors of the PS 106 (e.g., the APUs 2044). The RPU 2042, being suited for real-time operations, may operate on the low power domain previously described and, as such, have a separate local interconnect from the local interconnect of the PMC 1602 and/or the APUs 2044. This allows the RPU 2042 to react quickly to different events, e.g., real-time sensor data that may be received and/or processed by RPU 2042.

Figure 25:
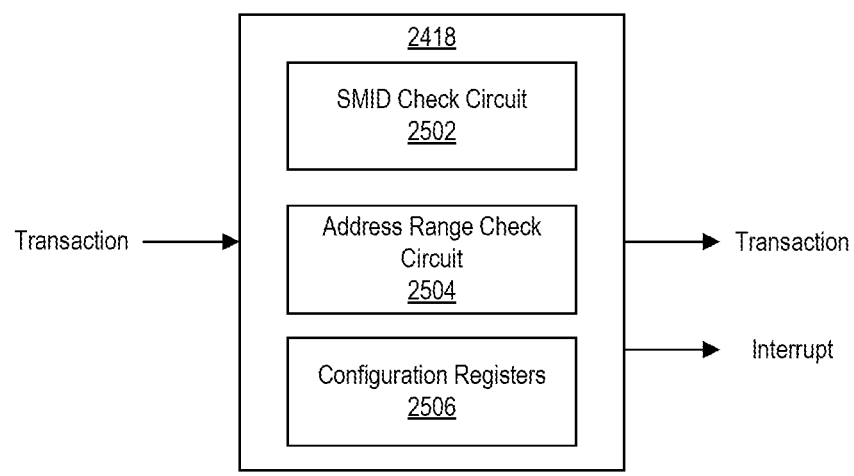
FIG. 25 illustrates an example implementation of a programmable protection circuit of FIG. 24.

FIG. 25 illustrates an example implementation of a PPC 2418. PPC 2418 includes an SMID check circuit 2502, an address range check circuit 2504, and configuration registers 2506.

The SMID check circuit 2502 is capable of checking the SMID of a received transaction. The SMID check circuit 2502 determines the SMID within the received transaction and compares the SMID with a list of allowed SMIDs specified in the configuration registers 2506. Address range check circuit 2504 determines the particular address(es) that are to be accessed in the destination as specified by the transaction. The address range check circuit 2504 checks whether the address(es) specified in the received transaction are within an allowed set or range of addresses for the SMID of the transaction per the configuration registers 2506.

PPC 2418 is capable of disallowing (e.g., rejecting) any transaction that does not meet the checks performed by SMID check circuit 2502 and address range check circuit 2504. PPC 2418 is further capable of generating an interrupt signal in response to determining that a received transaction is rejected based on the checks performed by the SMID check circuit 2502 and/or the address range check circuit 2504.

Figure 26:
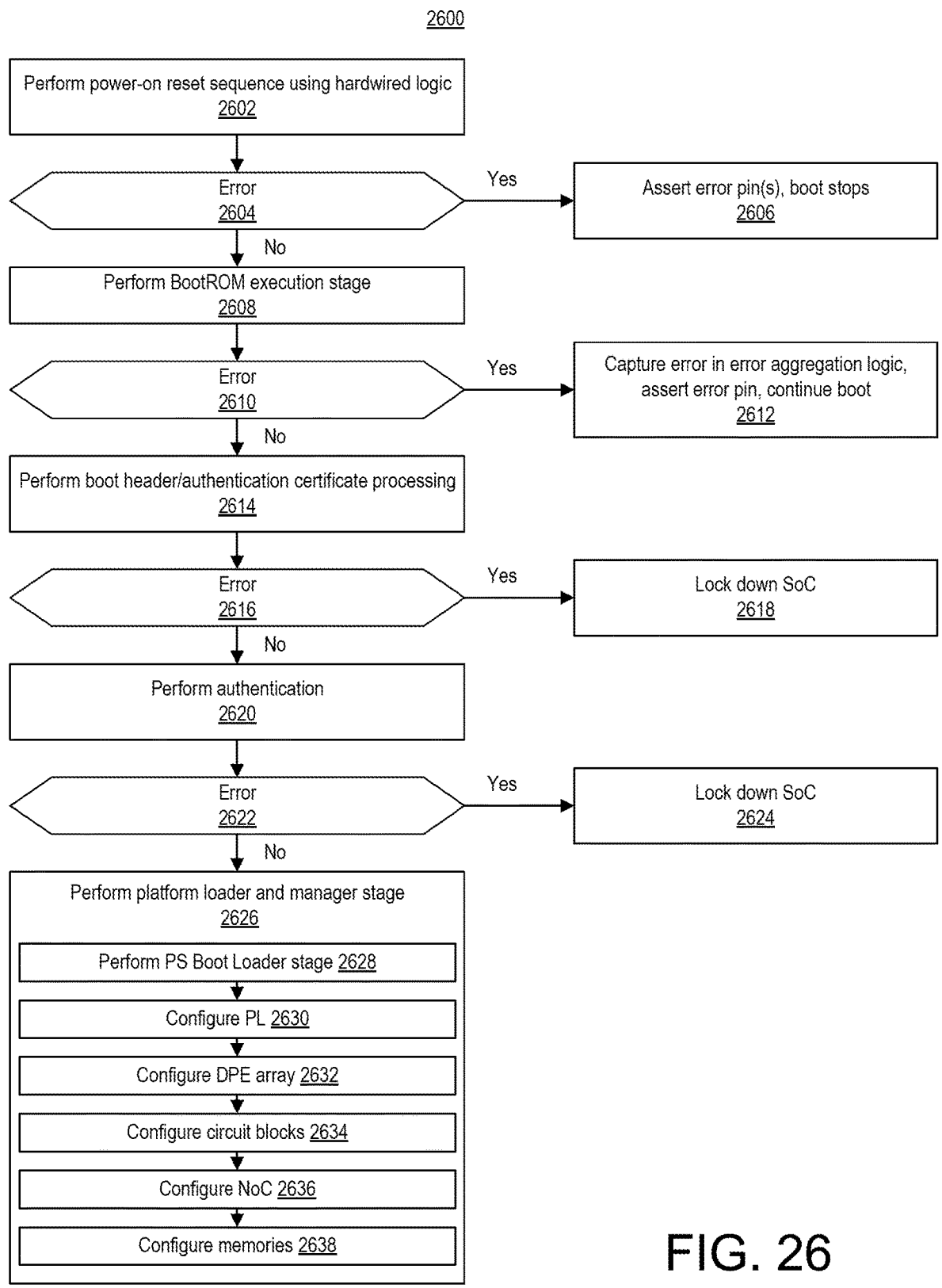
FIG. 26 illustrates an example method of booting the SoC of FIG. 1.

FIG. 26 illustrates an example method 2600 of booting the SoC 100. Method 2600 may be performed to implement an application within the SoC 100 that utilizes the various subsystems described herein.

In block 2602, hardwired logic within the SoC 100 performs a power-on reset sequence. In one aspect, the hardwired logic is the POR circuit 2166 described in connection with FIG. 21. The power-on reset sequence refers to initial operations performed after power-up of the SoC 100. In general, the power-on reset sequence, as performed by the SoC 100 performs initial steps prior to handing off control to the processor(s) of the PMC 1602 to execute the BootROM code. The power-on reset sequence may include analog components detecting whether the voltage supply is powered up and qualifying the power-on reset de-assertion. Further, boot-mode pins that specify a boot-mode for the SoC 100 may be captured. E-fuse bits may be read and cached by the e-fuse controller 2160. A state-clear operation is performed on the PMC 1602. The POR circuit 2166 is capable of authenticating the BootROM. The BootROM may be authenticated using the SHA-3/384 circuit block 2150 of the PMC 1602, for example. The end of the power-on reset releases the remainder of the PMC 1602 from reset.

In block 2604, the POR circuit 2166 determines whether an error condition occurred. If so, method 2600 continues to block 2606 where error pin(s) are asserted and the boot process for the SoC 100 stops.

In block 2608, the PMC 1602 performs the BootROM execution stage. The BootROM execution stage may be performed by one or more of processors 2112 of the PMC 1602. For example, the BootROM execution stage may be performed by the ROM dedicated processors 2112 of the PMC 1602. In one aspect, the BootROM execution stage is uninterruptable. In block 2608, the processor(s) 2112 clear the PMC shared RAM 2118. The processor(s) 2112 initialize the System Monitor 2156 and voltages therein are checked. The processor(s) 2112 initialize the PLL 2164. The processor(s) 2112 tests the PMC RAM 2118. The processor(s) 2112 further disable (power down) the power islands that are disabled by virtue of the e-fuses based on the e-fuse data read by the e-fuse controller 2160.

In block 2610, the PMC processor(s) 2112 determine whether an error condition occurred. If so, method 2600 continues to block 2612 where the error is captured in error aggregation logic, the error pin(s) are asserted, and the boot of the SoC 100 continues.

In block 2614, the PMC 1602 performs boot header/authentication certificate processing. In general, the processor(s) 2112 execute the BootROM code, load the Boot Header from the boot source, and authenticate the Boot Header. The processor(s) 2112 are capable of authenticating and decrypting (if required) the main PMC firmware. The processor(s) 2112 load the Boot Header and the authentication certificate into the PMC shared RAM 2118 from the external boot device. The processor(s) 2112 are capable of determining how the remainder of the PDI image is authenticated, decrypted if necessary, and interpreted based on the Boot Header. The Boot Header may include an initialization vector to be used with the device-key and a PUF encrypted black key. The authentication certificate may include the ECDSA/RSA primary public key and the secondary public key. The primary key is used to authenticate the secondary public key and for subsequent stages of authentication.

In block 2616, the processor(s) 2112 determine whether an error condition occurred. If so, method 2600 continues to block 2618 where the SoC 100 is locked down, e.g., boot discontinues.

In block 2620, the processor(s) 2112, in executing the BootROM, are capable of loading, authenticating, and decrypting the programming partitions of the PDI. In block 2622, the processor(s) 2112 determine whether an error condition occurred. If so, method 2600 continues to block 2624 where the SoC 100 is locked down, e.g., boot discontinues.

In block 2626, the processor(s) 2112 perform the platform loader and manager stage. In one aspect, the RAM dedicated processor(s) 2112 are capable of performing the platform loader and manager stage. Depending on the instructions contained in the Boot Header, the processor(s) 2112 are capable of performing any of a variety of operations. For example, in block 2628, the processor(s) 2112 are capable of performing a PS boot loader stage. The processor(s) 2112 are capable of loading the PS boot code from the external source, authenticating the PS boot code, and copying the PS boot code to the OCM in the PS 106 for execution by the PS processor(s).

In block 2630, the processor(s) 2112 are capable of configuring the PL. For example, the processor(s) are capable of loading configuration bitstream(s) from the external source, authenticating the configuration bitstream(s), and providing the configuration bitstream(s) to the PL (e.g., writing the configuration bitstream to the configuration registers of the PL).

In block 2632, the processor(s) 2112 are capable of configuring the DPE array. The processor(s) 2112 are capable of loading the DPE array programming segment (e.g., the configuration image for the DPE array) from the external source, authenticating the DPE array programming segment, and writing the DPE programming segment to the appropriate destination (particular DPEs in the DPE array) via the NPI 710 and the NoC 108.

In block 2634, the processor(s) 2112 are capable of configuring one or more circuit blocks. The circuit blocks may be hardwired circuit blocks or circuit blocks implemented in the PL 104 that require configuration data, e.g., programming of configuration registers therein. The processor(s) 2112 are capable of loading register-programming segments from the external-source, authenticating the register-programming, and writing the register-programming to destinations via the NPI 710 and the NoC 108. As an illustrative and non-limiting example, the processor(s) 2112 are capable of writing register data to SMID circuit blocks 2402, PPCs 2418, and/or other hardwired circuit blocks (e.g., cryptographic circuit blocks. ADCs, DACs, etc.).

In block 2636, the processor(s) 2112 are capable of configuring the NoC 108. As an illustrative and non-limiting example, the processor(s) 2112 are capable of configuring the NoC 108 as described in connection with FIG. 11. In block 2638, the processor(s) 2112 are capable of configuring any memories. For example, the processor(s) 2112 are capable of writing configuration data to any memory controllers and/or interfaces to external memory accessible by the SoC 100.

The various operations performed during the platform loader and manager stage by the processor(s) 2112 may or may not be independent of one another. In some cases, the operations may be performed in a synchronized manner. For example, though not explicitly described, images for the NPI 710 may be loaded prior to being able to configure the PL 104. The particular ordering of sub-blocks within block 2626 is not intended to be limiting of the inventive arrangements.

FIG. 26 illustrates that the PMC 1602 is responsible for configuring the PS 106, the PL 104, the DPE array 102, and selected other circuit blocks. In one or more other embodiments, e.g., depending on the Boot Header, the PMC 1602 is capable of configuring the PS 106 with program code that allows the PS 106 to configure the PL 104 and the DPE array 102. In that case, in response to configuring the PS in block 2628, blocks 2630, 2632, and 2634 may be performed by the PS 106 as opposed to the processor(s) 2112 in the PMC 1602.

As method 2600 progresses, each level in the progression either enables or disables authorization for components to access other components in the SoC 100. The process described in connection with FIG. 26 is hierarchical in that authorization may be denied or granted to increasingly narrower subsets of subsystems and/or components in the SoC 100. The hierarchical aspect of the technique illustrated in FIG. 26 is able support SoC 100 configurations for use in Field Programmable Gate Array (FPGA)-as-a-Service or "FaaS" processing environments. For example, the PMC 1602 is capable of creating multiple partitions in the SoC 100. In creating the partitions, the PMC 1602 is capable of mapping many logical destinations mapped to one physical destination (e.g., to multiple circuit blocks implemented in the PL 104, multiple independent DPE clusters implemented in the DPE array 102, etc.). Similarly, the PMC 1602 is capable of creating partitions in the SoC 100 where many physical destinations are mapped to one logical destination.

At runtime of the SoC 100, the SMID circuit blocks 2402 and the PPCs 2418 are capable of supporting a plurality of different partitions based on the SMID to PPC permission bindings described. These different partitions can be serviced by particular functions and/or components available on the SoC 100. Since the SoC 100 may be configured, reconfigured, and/or partially reconfigured across different subsystems, the mapping of permissions and authorizations that create the partitions and enforce firewalling between partitions may be dynamically modified.

Figure 27:
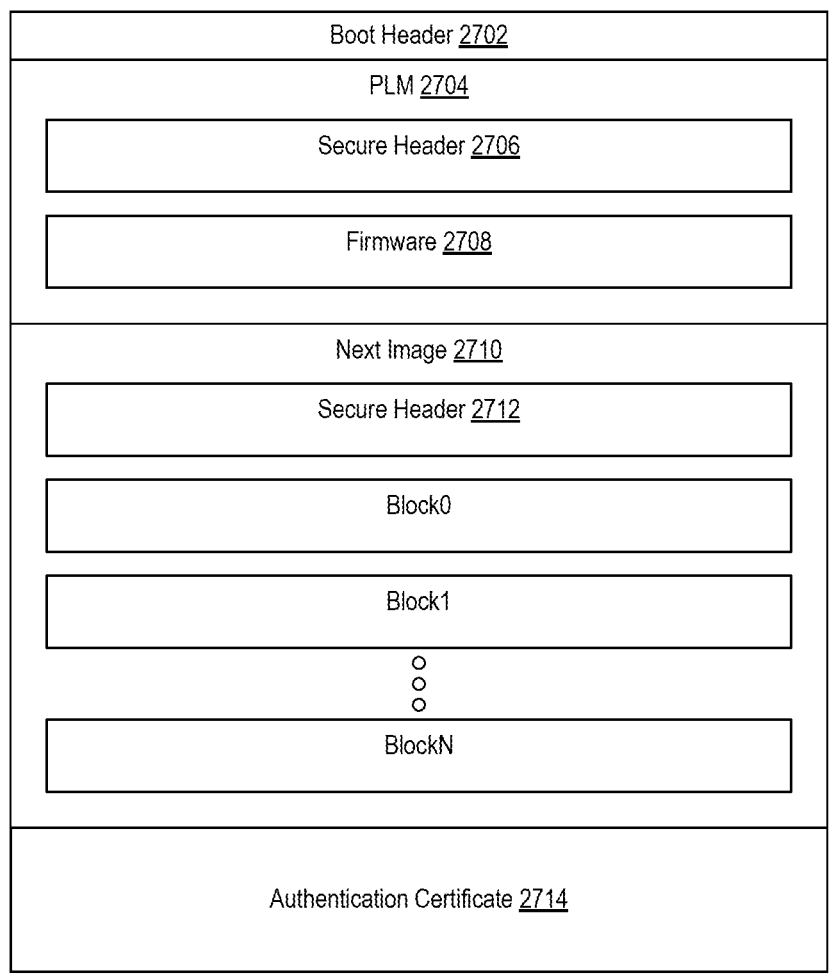
FIG. 27 illustrates an example of a programming device image that may be used to boot the SoC.

FIG. 27 illustrates an example of a PDI 2700 that may be used to boot SoC 100. In the example of FIG. 27, the PDI 2700 includes a Boot Header 2702. PDI 2700 further includes a platform loader and manager (PLM) 2704. The PLM 2704 may include a secure header 2706 and firmware 2708 that is executable by the processor(s) 2112 of the PMC 1602. PDI 2700 also includes an authentication certificate 2714.

The next image 2710 of PDI 2700 may include a plurality of different blocks shown as block0, block1, through blockN. The various blocks contained in next image 2710 may be specified in secure header 2712. In general, the various blocks0-N correspond to the PS boot code, the configuration bitstream(s) for the PL, the DPE array programming segment, and the register programming data referenced in blocks 2628, 2630, 2632, and 2634 of FIG. 26. In particular embodiments, these blocks may be organized according to application (e.g., partition) where a plurality of blocks represent one application for implementation in a first partition, while a different set of blocks represent another application that may be implemented in a second partition concurrently with the first application or in the first partition after the first application is finished executing.

Partial reconfiguration of one or more portions of the SoC 100 may be performed by the PMC 1602 selectively performing different ones of blocks 2628-2638 using available and/or different blocks or sets of blocks contained in PDI 2700 (or in different PDIs) over time and in response to particular conditions. Partial reconfiguration of the SoC 100 facilitates layering into subsets or the entirety of physical components or their logical subsets in the SoC 100. For example, the PMC 1602 is capable of controlling isolation of partitions, unloading (and loading) of software drivers (as appropriate for modified applications), delivery of programming images from any secondary boot interface, and image authentication and integrity checking before programming is done.

Figure 28:
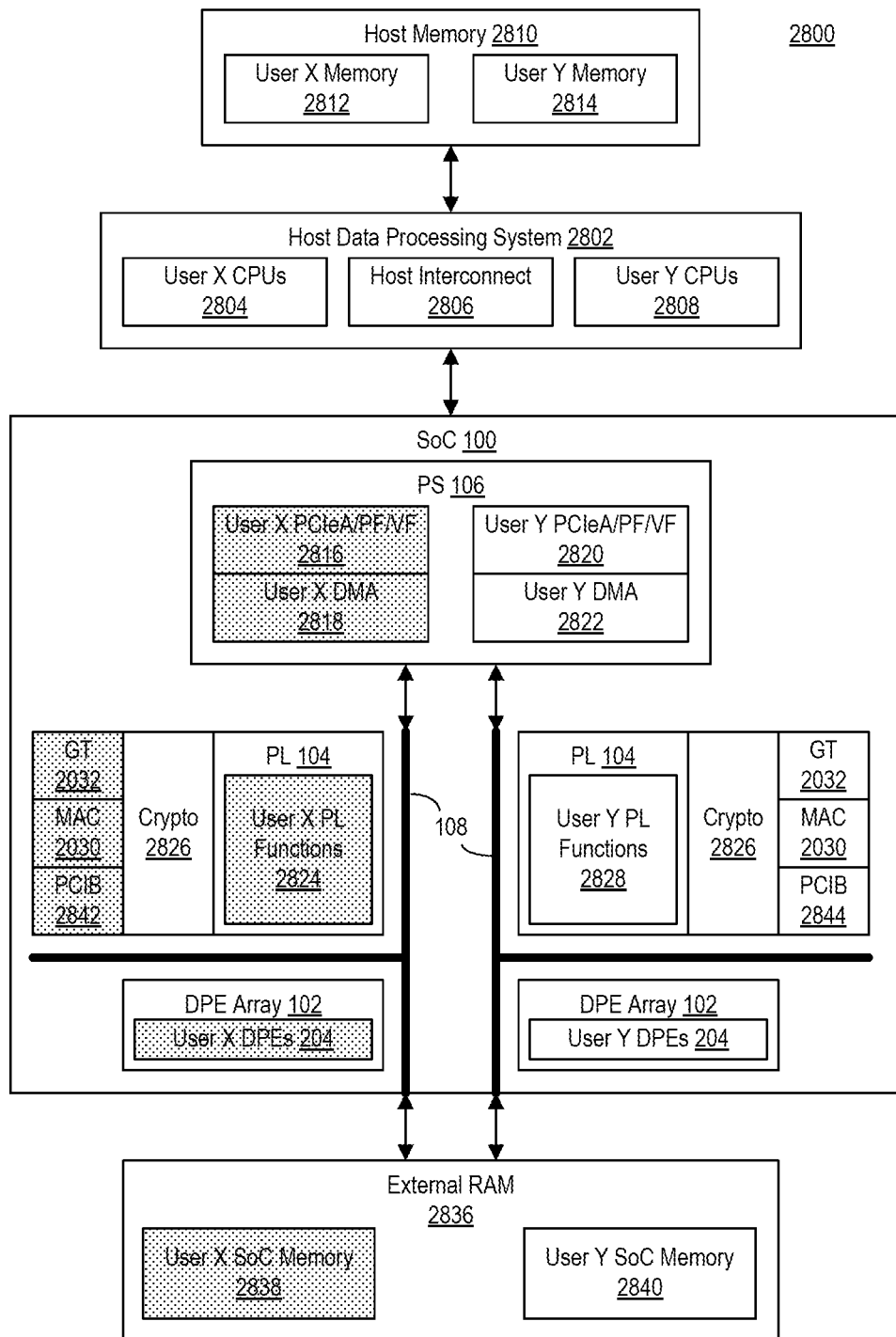
FIG. 28 illustrates an example SoC implementing different partitions.

FIG. 28 illustrates another example of SoC 100 implementing different partitions. In the example of FIG. 28, a variety of different images may be loaded sequentially into the SoC 100. These different images implement different partitions therein and are illustrative of a FaaS processing environment where the platform provider implements a "shell" design in the SoC 100 to facilitate communication with the SoC 100 within the larger system and facilitate implementation of user applications corresponding to more than one different user (e.g., a user of a host processing system coupled to the SoC 100 via a PCIe link) in the SoC 100 concurrently.

In the example of FIG. 28, a system 2800 is illustrated that includes a host data processing system 2802. The host data processing system 2802 may be implemented as a computer system such as a server. The host data processing system 2802 includes a plurality of different CPUs that may be allocated to different users (e.g., different processes, different applications, etc.). For purposes of illustration, FIG. 28 shows two different users X and Y using system 2800. As such, the CPUs of the host data processing system 2802 have been allocated among users X and Y. Accordingly, the host data processing system 2802 includes user X CPUs 2804 and user Y CPUs 2808. The host data processing system 2802 further includes a host interconnect 2806 that is capable of establishing communications with the SoC 100. For example, the host interconnect 2806 may be a PCIe node capable of communicating over a PCIe link with the SoC 100.

The host data processing system 2802 is connected to host memory 2810. Host memory 2810 may include volatile and/or non-volatile memories. As shown, the host memory 2810 is partitioned between user X and user Y. As such, host memory 2810 includes user X memory 2812 allocated to user X and user Y memory 2814 allocated to user Y.

The SoC 100 may be coupled to a circuit board or card that is connected to the host data processing system 2802 by way of the PCIe link. The circuit board may include the SoC 100 and external RAM 2838 that is local for the SoC 100. The shell design, as implemented within the SoC 100, creates a plurality of partitions within the SoC 100. The term "partition", as used herein in connection with the SoC 100, refers to a collection or set of SoC 100 resources that are allocated or reserved for use by any application that is implemented within that partition.

The shell itself may occupy a partition in that the shell includes selected components of the SoC 100 that are capable of managing resources therein. The shell provides functions such as configuration and management of the SoC 100 so that the different applications implemented in the different partitions that are created may be managed over time. As an illustrative example, the PMC 1602 and the various functions described herein in reference to the PMC 1602 may be part of the shell so that the FaaS provider is able to manage the SoC 100 and the implementation of different users or applications therein in their respective partitions. In another aspect, the PMC 1602 may be independent of the shell, but only be accessible by the shell so that the applications implemented in the various partitions are unable to access the PMC 1602. The shell may be firewalled like other partitions. The shell, however, unlike other partitions, is capable of monitoring and accessing the different partitions implemented in the SoC 100 and the particular roles/users implemented in each partition.

In one aspect, the shell (not shown) may be implemented as a static region within the SoC 100 that does not change, while the partitions may be implemented as dynamically reconfigurable regions in the SoC 100. The shell, for example, may include the PCIe node (e.g., 2816, 2820) and DMAs (2816, 2822), memory controllers, and the like. For example, the shell may include interfaces necessary for communicating with circuits located external to SoC 100. In this manner, the partitions, implemented as dynamically reconfigurable regions, may be reconfigured to implement different applications over time while the SoC 100 is able to maintain the communication link to the host data processing system, RAMs, and/or other external devices since the shell operates uninterrupted. The shell includes interfaces to the partitions so that once an application is implemented in a partition, the application may communicate with the shell and/or access devices and/or circuits through the shell (e.g., external circuits and/or devices such as the host data processing system 2802 and external RAM 2836). The shell may be implemented using portions of the PS 106, portions of the PL 104, portions of the NoC 108, and/or one or more hardwired circuit blocks 110.

In the example of FIG. 28, the SoC 100 is partitioned into two partitions (e.g., not including the shell static region). Each partition has or includes a subset of resources of the SoC 100 for use by the particular application executing in that partition. For example, the SoC 100 includes a first partition (e.g., partition X) including various resources allocated for use by user X. The SoC 100 includes a second partition (e.g., partition Y) including various resources allocated for use by user Y. The partitions and, as such, users X and Y, are capable of occupying the SoC 100 concurrently and are firewalled from one another. Partitions X and Y are dynamically reconfigurable regions.

In the example of FIG. 28, partition X and Y appear to include equivalent subsets of resources. This, however, need not be the case. One partition may have more or fewer resources allocated than the other partition. The shell, as implemented in the SoC 100, and the PMC 1602 may establish the partitions and the allocation of the SoC resources among the partitions. Once established by the shell, the shell and/or PMC 1602 and host data processing system 2802 may implement user applications within the different partitions and change the applications implemented in each of the partitions over time.

For example, the resources of the SoC 100 allocated to partition X are shaded. Partition X, corresponding to user X, includes a PCIeA/PF/VF circuit block 2816 a DMA 2818 from the PS 106; one or more PL functions 2824 (e.g., circuit blocks) implemented in PL 104; one or more GTs 2032, a MAC 2030, and a PCIPB 2842 of the available hardwired circuit blocks; one or more DPEs 204 of the DPE array 102; and a region of external RAM 2836 shown as user X SoC memory 2838. Partition Y corresponding to user Y, having resources of SoC 100 allocated thereto that are not shaded, includes a PCIeA/PF/VF circuit block 2820 and a DMA 2822 from the PS 106; one or more PL functions 2828 (e.g., circuit blocks) implemented in PL 104; one or more other GTs 2032, another MAC 2030, and another PCIPB 2842 of the available hardwired circuit blocks; one or more other DPEs 204 of the DPE array 102; and a different region of external RAM 2836 shown as user Y SoC memory 2840. In the example of FIG. 28, the cryptographic circuit block 2826 (e.g., a hardware accelerator engine) is shared among partition X and partition Y, though this need not be the case.

Each of partitions X and Y has signal paths through the NoC 108 and access to one or more memory controllers (not shown) in order to access external RAM 2836. The signal paths are established by loading the PDI for the application to be implemented in each respective partition (e.g., DPE configuration data. NoC configuration data. PL configuration data, and/or PS configuration data forming the application). PCIBs 2842 and 2844 may be used to access external storage devices.

In this example, the PMC 1602 (e.g., either in the shell or operating under control of the shell) has configured the SMID circuit blocks and the PPCs with appropriate identifiers and permission bindings to prevent resources in partition X from erroneously or maliciously accessing resources in the partition Y and vice versa. The exception being that both partitions are capable of accessing cryptographic circuit block 2826 in this example. The separation and firewalling achieved, where each has independent data paths, interrupts, controls signals, and the like, means that a malfunction or error in an application in one partition does not affect the operation of the application in the other partition.

Referring to the PCIeA and DMA resource allocation among partitions X and Y, security, performance, and error isolation of PCIe traffic between the SoC 100 and the host data processing system 2802 can be achieved with varying levels of granularity based on the FaaS multi-tenant isolation configuration implemented by the shell and/or PMC 1602. In one aspect, for example, a dual-socket host data processing system or a single socket host data processing system with multiple PCIe Root Ports can operate with the SoC 100 where SoC 100 is configured to allocate one PCIeA controller to each of partitions X and Y. Performance isolation between partitions may be achieved so that burst host data processing system to SoC traffic for one partition does not impede the bandwidth available to the other partition. Further, a PCIe Link Error or PCIe Link Down condition for one partition can be isolated to that partition. The PMC is capable of isolating power management functions of partition X from partition Y.

A host data processing system with a single host data processing system to SoC PCIe connection can have the SoC 100 configured to allocate one PCIeA Physical Function (PF) to each of partition X and partition Y. As such, a PCIe Function Level Reset (FLR) of the PF associated with one partition can isolate the error detection and recovery actions from the other partition. The PCIe PASID TLP prefix and Address Translation Cache (ATC) can be leveraged for Shared Virtual Memory interactions, concurrently and independently, between user X and user Y running on the host data processing system 2802 and the user X and user Y role functionality implemented on the SoC 100 (e.g., the applications implemented in respective partitions X and Y).

The dual-tenant example of FIG. 28 illustrates that PL 104 and memory resource allocation among the partitions may be performed. Each partition may have a portion of the PL 104 and associated memory resources available in the service of applications implemented in that partition. The shell may make available to users X and Y a standard, pre-designed library of functions with characterized PL usage and performance metrics. In an alternative example, each of users X and Y is able to deploy a custom function or functions making use of the available, per-user, partitioned resources of the SoC 100.

As illustrated in FIG. 28, external RAM 2836 (e.g., DDR) may be allocated among the partitions. The FaaS multi-tenant solution implemented by the shell is capable of achieving security, performance, and error isolation of off-chip memory resources between users. This can be achieved at varying levels of granularity. For example, the SoC 100, having multiple DDR controllers, may be configured to include a plurality of DDR controllers where one or more are allocated to user X and one or more other DDR controllers are allocated to user Y. Performance isolation may be achieved so that DDR bandwidth degradation due to either head of line blocking or page-collisions for user X, for example, do not affect user Y's bandwidth for applications executed therein.

In another example, the SoC 100 can be configured to interleave multiple DDR controllers across the SoC Address Map. Still, address spaces of off-chip memory (e.g., external RAM 2836) can be reserved and isolated on a per-user basis using a combination of the SMID and PPCs. Thus, applications executing in one partition are prevented from accessing the address space of another partition. This isolation may be achieved while also achieving the aggregate bandwidth that is possible by using multiple DDR controllers.

The NoC 108 is capable of providing security, performance, and error isolation among the partitions for data movement and communication between components on the SoC 100 allocated to partition X and the components on the SoC 100 allocated to partition Y. The isolation may be achieved at varying levels of granularity based on the FaaS multi-tenant isolation configuration. For example, circuit block to circuit block and circuit block to memory pathways that utilize the NoC 108 and the buffering resources of the NoC 108 can be assigned on a per user basis. The NoC 108, for example, can be programmed so that NoC physical pathways and their dedicated virtual channels are allocated on a per user (e.g., partition) basis. As discussed, SMIDs, whether inserted in transactions at or around the source and/or by SMID circuits implemented at NoC 108 entry points, may be used by the PPCs to enforce the firewalling between the users when transactions emerge from the NoC 108. In another example, the NoC 108 physical pathways and dedicated virtual channels may be shared between users.

The external I/O controllers and hardware acceleration blocks may also be allocated between users. For example, user X is allocated particular ones of GTs 2032, a MAC 2030, and a PCIS 2842, while user Y is allocated different GTs 2032, a different MAC 2030, and a different PCIB 2844. Thus, both user X and user Y have dedicated PCIe and Ethernet interface controllers and associated I/Os.

In other configurations, however, the SoC 100 supports user X and user Y, using the built-in firewalling capability, concurrently sharing the PCIe and Ethernet interface controllers and associated I/Os. Further, in the example shown, both user X and user Y share access to the cryptographic circuit block 2826. The block is shown in each partition only to represent shared access to the hardwired circuit block by different users. Cryptographic circuit block 2826 is capable of providing encryption/decryption services to user X and to user Y, where each user uses the cryptographic circuit block 2826 with unique cryptographic keys. Such is the case regardless of whether the data traffic is serviced by PCIe or Ethernet.

Referring to FIGS. 26, 27, and 28, in combination, the boot process for the SoC 100, being hierarchical in nature, facilitates the FaaS use cases described in connection with FIG. 28. For example, boot code for the SoC 100 may be provided initially as block0 (e.g., from the SoC 100 manufacturer) of the PDI 2700. Next, the shell, as created by the FaaS provider may be loaded as block1 of PDI 2700. The shell, as described, establishes the partitioning of the SoC 100 by allocating resources to each partition. The resources of the SoC 100, however, while partitioned, are not configured. Subsequently block2 and block3, which correspond to the applications to be implemented in partition X and partition Y, respectively, are loaded.

As implemented, each application is only aware of the resources of the SoC 100 that are allocated to the partition in which that application is implemented. As part of the firewalling, the PMC 1602 is configured to only allow each user to access the configuration space corresponding to that user's partition. In other words, the PMC 1602 only allows user X to access the configuration space (e.g., configuration registers) for SoC 100 resources allocated to partition X (whether for a particular subset of the PL, a particular subset of the DPE array, and/or particular elements in the PS). Similarly, the PMC 1602 only allows user Y to access the configuration space for SoC 100 resources allocated to partition Y (whether for a particular subset of the PL, a particular subset of the DPE array, and/or particular elements in the PS).

The PMC 1602 is capable of programming which interrupts of the various circuit blocks (e.g., referring to the common interface described in connection with FIG. 23) are enabled and disabled in each partition. The PMC 1602 further is capable of associating particular interrupts with particular SMIDs. Using this framework, user X, for example, may determine that the design (e.g., the portion of the application for partition X executing in the portion of the PS 106 allocated to partition X) need not distinguish between one or more different circuit blocks in the domain for purposes of handling interrupts. For example, the PS components in partition X may execute a same interrupt service routine regardless of whether a user-defined block in partition X or a hardware accelerator block in partition X triggered the interrupt.

As noted, in the example of FIG. 28, partition X and partition Y are illustrated as being substantially the same in terms of resource allocation. In other examples, however, the partitioning may be tailored to the needs of each user and/or application. If, for example, user Y requires fewer resources than user X, more resources and/or bandwidth may be allocated to partition X than to partition Y. The partitioning provides user X with increased bandwidth on the NoC 108, for example, to accommodate the increase in resource usage by user X. The partitions need not be symmetric in terms of resource allocation and/or usage by their respective users.

In multi-tenant FaaS use case, neither user is aware of the other user on the SoC 100. In this regard, an elevation of usage of the SoC 100 by user X is confined to partition X and does not degrade the usage of the SoC 100 by user Y. The partitions maintain independence in terms of performance, error handling, and reliability.

In the multi-tenant example, once a user has completed operation, another user may be implemented in the partition allocated to the now complete user. For example, consider the case where user X is intended to perform extended processing that may take place over many hours, while user Y is performing video processing correlated to delivering video to a particular end user. When the end user stops consuming video content, user Y may be removed from the partition on the SoC 100. Another, different user, e.g., user Z, may be implemented in partition Y previously used by user Y using partial reconfiguration. While this takes place, user X is able to continue operating in partition X uninterrupted as is the shell. The partial reconfiguration may reconfigure any of the resources and/or connectivity within the partition previously used by user Y. That is, the new user implemented in the partition may use any combination of the PL, NoC, PS, and/or DPE array previously used by user Y albeit with a different configuration and/or functionality (e.g., different configuration images loaded in each subset of resources and/or different SMIDs and permission bindings). The new user, for example, may perform audio processing as opposed to delivering video.

Figure 29:
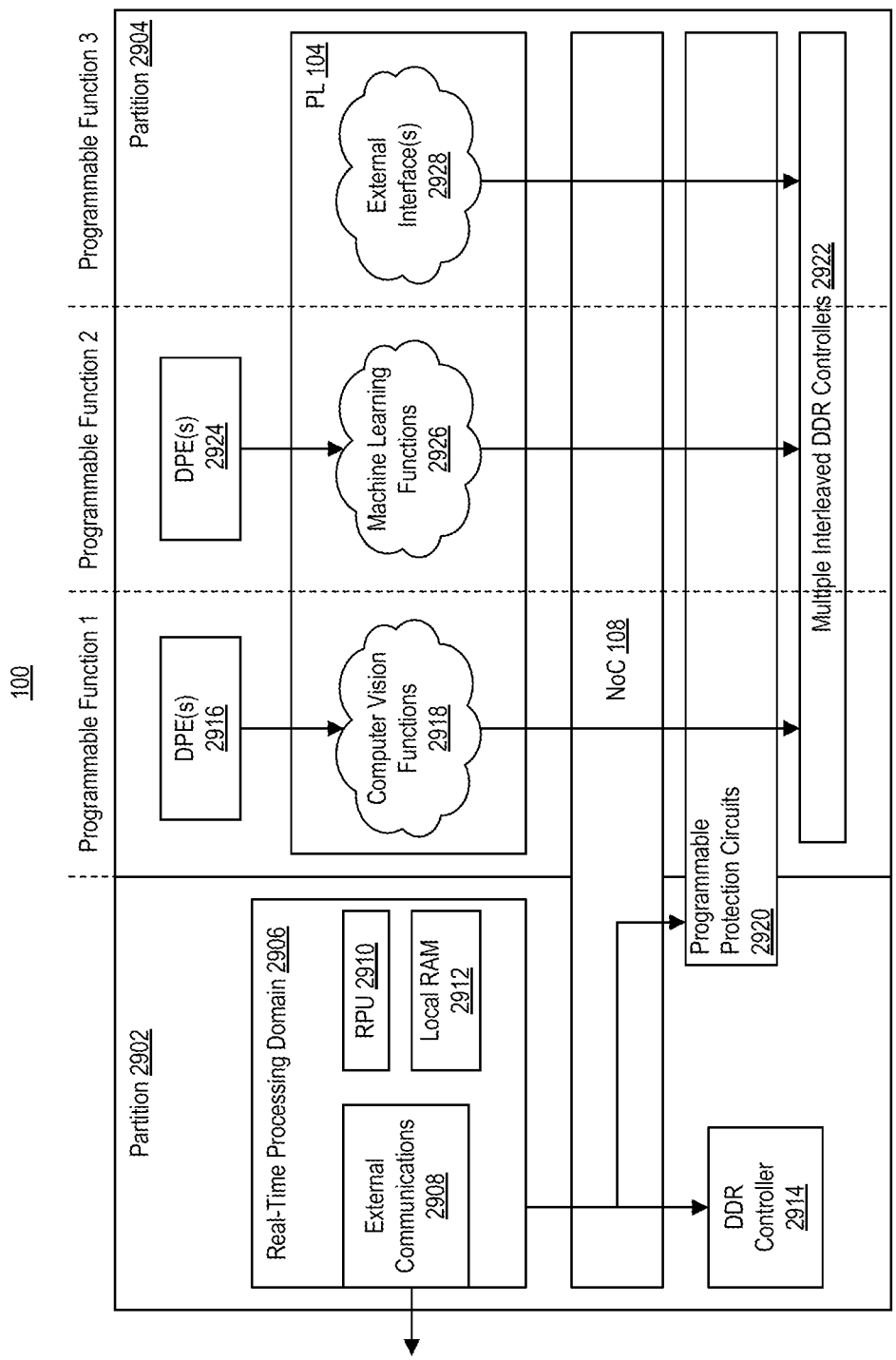
FIG. 29 illustrates another example SoC implementing different partitions.

FIG. 29 illustrates another example of SoC 100 implementing different partitions. FIG. 29 illustrates an example use case where the SoC 100 is utilized in an automobile or other vehicle. As pictured, the SoC 100 is partitioned into two different partitions 2902 and 2904. Partition 2902 implements an application that performs real-time processing. As pictured, partition 2902 includes a real-time processing domain 2902 that includes RPU 2910, one or more external communications circuit blocks (e.g., V/Os and/or interfaces) 2908, and local RAM 2912. In one aspect, the RPU 2910, external communications 2908, and local RAM 2912 may be implemented within the PS 106. Real-time processing domain 2906 is connected to a DDR controller 2914 via the NoC 108. PPCs 2920 provide memory protection and firewalling. As shown, the NoC 108 and the PPCs 2920 are global resources that may be used by both partitions 2902 and 2904.

Partition 2904 is independent of partition 2902. As such, any processing, errors, and/or performance issues in partition 2904 do not affect partition 2902. The application implemented in partition 2904 performs a plurality of different functions shown as programmable functions 1, 2, and 3. The programmable functions utilize the DPE array 102 and the PL regions 104. Programmable function 1 may perform image processing and utilize one or more DPEs 2916 connected to computer vision functions 2918 implemented in the PL 104. The computer vision functions 2918 in the PL 104 (e.g., standard cores implemented in the PL 104 and/or user defined circuit blocks in the PL 104) connect to the NoC 108 and to multiple interleaved DDR controllers 2922 via PPCs 2920. Programmable function 2 may perform machine learning and utilize one or more DPEs 2924 connected to machine learning functions 2926 implemented in the PL 104. The machine learning functions 2926 in the PL 104 (e.g., standard cores implemented in the PL 104 and/or user defined circuit blocks in the PL 104) connect to the NoC 108 and to the multiple interleaved DDR controllers 2922 via PPCs 2920. Programmable function 3 may provide interfaces to external devices and utilize external interfaces 2928 implemented in the PL 104. The external interfaces 2928 in the PL 104 (e.g., standard cores implemented in the PL 104 and/or user defined circuit blocks in the PL 104) connect to the NoC 108 and to the multiple interleaved DDR controllers 2922 via PPCs 2920.

FIG. 29 illustrates an example where partition 2904 may be used to perform image processing on video date streams obtained from one or more cameras and/or other sensors in an automobile or other vehicle. Partition 2904, for example, is capable of performing operations such as lane detection, object recognition, other computer vision tasks, and/or machine learning. Partition 2902 is capable of performing control and communication functions and may also manage other timing critical real-time tasks. Features of interest, e.g., data obtained and/or generated by each partition can be accessed from a shared area in DDR memory that is accessible by both partitions as determined by the SMIDs assigned to the respective masters in each partition and the PPCs 2920.

As noted, partitions 2902 and 2904 are separated from one another. Further, partitions 2902 and 2904 operate in a manner that is free from interference from the other. If an error, for example, is detected in partition 2904, the application implemented in partition 2902 is able to continue to operate while partition 2904 is recovered (e.g. through resetting the partition and reloading the application therein through partial reconfiguration).

The application(s) implemented in the SoC 100 may be implemented based on SoC 100 boot time allocation of resources by PMC 1602. PMC 1602, for example, uses programmable address maps to create addressability for each of the two partitions. The NoC 108 provides QoS controlled data paths through each of partitions 2902 and 2904. The data paths through the NoC 108 are programmed with isolation between the data paths to ensure freedom-from-interference. The PMC 1602 programs the memory protection circuits 2920 to provide access (and limit access) to resources such as DDR, SRAM, peripherals, and the other partition.

The PMC 1602 is also capable of dynamically reconfiguring one or both partitions (e.g., performing partial reconfiguration) during operation of SoC 100, e.g., at runtime. For example, the application executing in partition 2904 may be replaced with a different version of the application during runtime to perform different computer vision and/or machine teaming operations. As an illustrative and non-limiting example, the application executing in partition 2904 may be changed from one that performs drive assistance (e.g., for driving at higher speeds) that may use a front facing camera to one that performs parking assistance and uses a rear facing camera. The time necessary to switch from forward to reverse in the vehicle, for example, may trigger and be sufficient to partially reconfigure partition 2904. The drive assist and parking assist features are provided for purposes of illustration only. The applications implemented in each respective partition may use different sensor data and process the sensor data differently. In another example, the entire device may be reconfigured to implement a different partitioning and/or different applications in each of partitions 2902 and 2904.

The automotive use cases illustrate further features where the partitioning may include encrypted and/or non-encrypted partitions. For example, one partition may be implemented with a safe zone with high reliability for performing safety critical features, while the other partition may require less safety features in providing entertainment functions (e.g., video streaming and/or audio processing). Still, the partitions are firewalled.

In the example of FIG. 29, because one user owns both partitions 2902 and 2904, a shell need not be implemented. That is, while both FIGS. 28 and 29 illustrate partitioning examples, FIG. 28 illustrates a multi-tenant model where more than one user is capable of using the SoC 100 concurrently, whereas in FIG. 29, a single user that owns both partitions is using SoC 100. The shell described in connection with FIG. 28 is capable of managing the multi-tenant implementation in combination with the PMC 1602.

Figure 30:
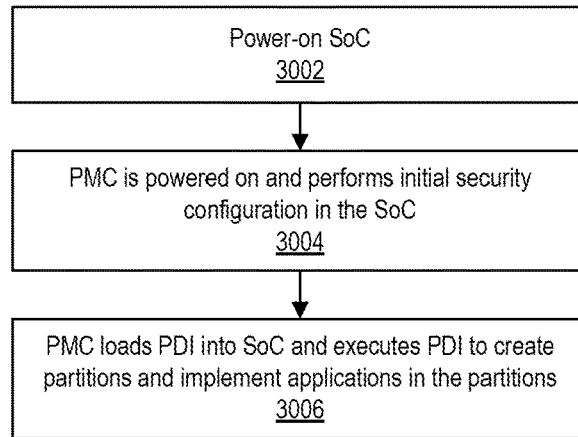
FIG. 30 illustrates an example method of implementing a programming device image (PDI) within the SoC.
Figure 31:
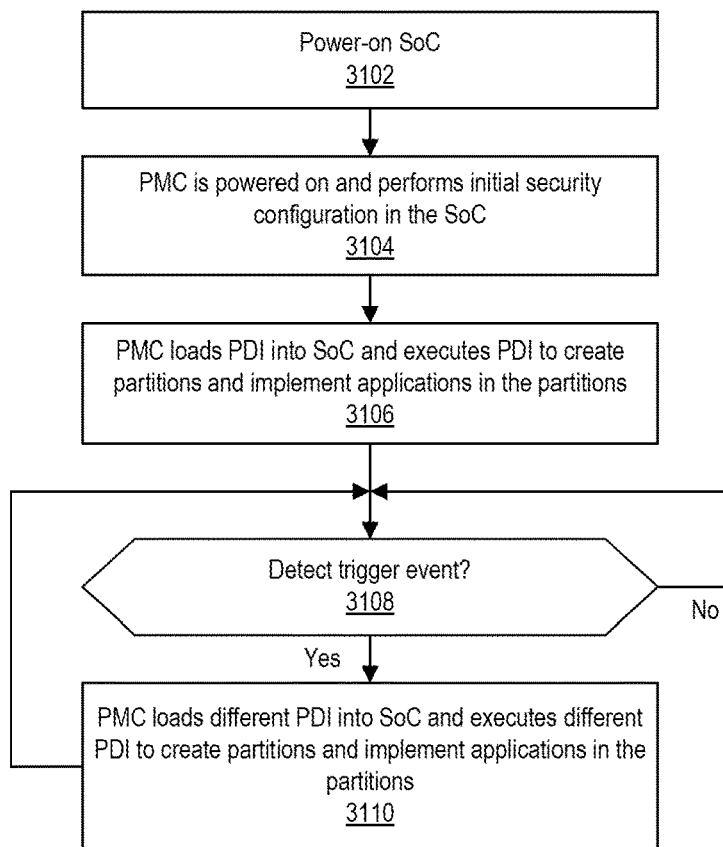
FIG. 31 illustrates another example method of implementing a PDI within the SoC and reconfiguring the SoC over time.
Figure 32:
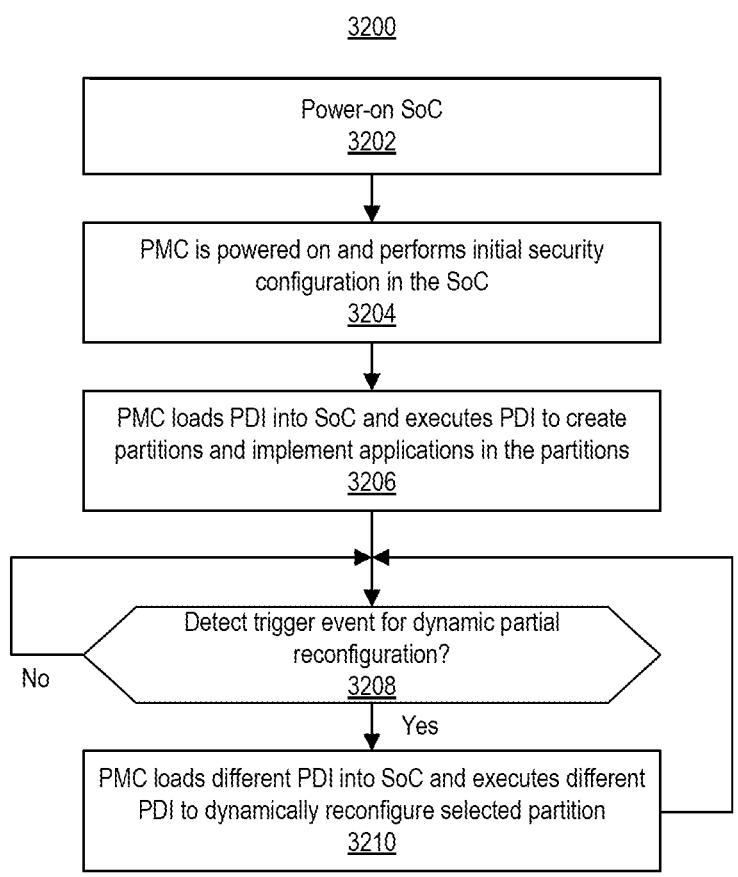
FIG. 32 illustrates another example method of implementing a PDI within the SoC and performing partial reconfiguration of the SoC over time.

FIGS. 30-32 illustrate different example use cases of implementing PDIs within the SoC 100. The examples of FIGS. 30-32 illustrate various features of the SoC 100 as previously described herein such as the ability of a centralized component such as the PMC 1602 to configure the entire device including the PL 104, the PS 106, the NoC 108, the DPE array 102, and the hardwired circuit blocks 110. As noted, in some cases the PS 106 is capable of configuring the PL 104, the NoC 108, the DPE array 102, and the hardware circuit blocks 110.

FIGS. 30-32 also illustrate use of common infrastructure of the SoC 100 such as the NoC 108 to connect various circuit components within same partitions. FIGS. 30-32 further illustrate different examples of remapping. One example of remapping refers to dynamic partial reconfiguration where resources within a partition of the SoC 100 are reconfigured for use by other, different applications over time. Another example of remapping is where the SoC 100 resources are reconfigured to create different partitions over time.

FIG. 30 illustrates an example method 3000 of implementing a PDI within the SoC 100. The PDI implemented in the SoC 100 may include configuration data for implementing a plurality of different partitions. Typically, a PDI specifying a plurality of different partitions includes one partition that functions as a primary or master partition. This partition Is capable of exercising control over the other secondary or slave partitions. As an illustrative example, a shell design as described herein in connection with the FaaS example of FIG. 28 may operate as a primary partition. In another example, the real-time processing domain illustrated in FIG. 29 may operate as the primary partition.

In block 3002, the SoC 100 is powered on. In block 3004, the PMC 1602 is powered on and performs initial security configuration n the SoC 100. The PMC 1602 may perform one or more operations as previously described herein in connection with FIG. 26, for example.

For example, in block 3004, the PMC 1602 is capable of performing an initial configuration of one or more circuit blocks in the SoC 100. The initial configuration includes, for example, setting up clocks and security settings within the SoC 100. The PMC 1602 is capable of writing configuration data to the various PPCs of the SoC 100. At this stage, the PMC 1602 is capable of writing configuration data that permits only the PMC 1602 to access the PPCs and/or the particular slaves protected by the PPCs. The PMC 1602 is further capable of configuring the SMID circuits.

In another aspect, the PMC 1602 is capable of writing initial configuration settings to global registers of the DPE array 102 (not shown). The PMC 1602, for example, is capable of writing to the NPI 710 to access these global registers. The global registers, for example, may specify how the DPEs identify themselves with the SMIDs.

By default at power-up, the NoC 108 is not configured with any data paths. No circuit blocks are able to utilize the NoC 108 for purposes of communicating with any other circuit block after power-up. The PMC 1602, however, is capable of programming the NoC 108 using the NPI 710 to establish an initial data path to the DPE array 102 for programming purposes. An example method of initially configuring the NoC 108 is described in connection with FIG. 10. The initial data paths, once configured by the PMC 1602, may then be used by the PMC 1602 to program applications into the DPE array 102 by writing to other configuration registers in the DPE array 102 (e.g., to program the core(s), memory module(s), DMAs, switches, etc. of individual DPEs 204).

In one aspect, the PMC 1602 may operate on a power domain of the SoC 100 that is independent of each other subsystem and/or component included within the SoC 100. SMID circuits and/or PPC circuits may be included in the PMC power domain. This allows the PMC 1602 to power up or power down each other subsystem independently while remaining active and the center of trust for the SoC 100. Further, security settings created by the PMC 1602 may be retained by the SMID circuits and/or the PPCs despite a particular subsystem protected by such circuits being powered down.

In block 3006, the PMC 1602 loads a PDI into the SoC 100. The PMC 1602 executes the PDI to create partitions and implement applications in the partitions. The PDI, for example, specifies a plurality of partitions and an application to be implemented in each of the different partitions in the SoC 100. The POI may specify a primary partition and one or more secondary partitions, wherein each partition implements an application. In one example, the PDI, when loaded into the SoC 100 and executed by the PMC 1602, implements partitions as described in connection with FIG. 28. The partitions may include a shell and two or more different user partitions. In another example, the POI, when loaded into the SoC 100 and executed by the PMC 1602, implements partitions as described in connection with FIG. 29.

In performing block 3006, the PMC 1602 is capable of authenticating the PDI as described in connection with block 2620 of FIG. 26. Further, the PMC 1602 is capable of executing the PDI as described in connection with block 2626 of FIG. 26. The PMC 1602 is capable of configuring portions of the PL 104, portions of the PS 106, portions of the NoC 108, portions of the DPE array 102, and/or any hardwired circuit blocks that are used by each respective partition specified by the PDI.

The PDI may be created using an electronic design automation (EDA) tool that enforces implementation rules. The implementation rules, in general, ensure that the functions (e.g., users and/or applications) will fit within the partition(s) to be created within the SoC 100. For example, based on a partitioning to be implemented in the SoC 100, the EDA tool may allocate a particular number of DPEs 204 to each of "N" different partitions, a particular amount (e.g., number of tiles) of PL 104 to each of the N partitions, particular memory controllers to each of the N partitions or only certain ones of the N partitions, certain processors in the PS 106 to the N partitions or only certain ones of the N partitions, etc. Thus, as each application is implemented, the EDA tool effectively ensures that the application is able to fit and execute in an available partition of the SoC 100.

As part of block 3006, the PMC 1602 is capable of adjusting the security configuration for the various partitions specified by the PDI to implement firewalling and isolation for the partitions. For example, the PDI includes configuration data that the PMC 1602 writes to the configuration registers, PPCs. and/or the SMID circuits of the SoC 100 to complete configuration of the circuits to enforce firewalling and prevent circuits within partitions from crossing partition boundaries and accessing circuit resources of other partitions. For example, the PMC 1602 is capable of configuring a memory controller to allocate a pool of external memory for use only by a particular partition within the SoC 100, and another pool of external memory (e.g., non-overlapping memory) for use only by a different partition within the SoC 100.

Once the SoC 100 is configured, the application implemented in each partition is capable of operating. As discussed, the SoC 100, subsequent to block 3006, may implement partitions and applications as described in connection with FIG. 28 or FIG. 29.

FIG. 31 illustrates another example method 3100 of implementing a PDI within the SoC 100 and reconfiguring the SoC 100 over time. In the example of FIG. 31, the SoC 100 may be configured by loading a first PDI. The first PDI may specify a particular partitioning of the SoC 100. Subsequently, in response to a trigger event, the SoC 100 may be reconfigured with a different PDI that specifies a different partitioning of the SoC 100. The PMC 1602, for example, may execute a control program that is responsible for loading different PDIs into the SoC 100 over time in response to different trigger events (e.g., signals and/or interrupts).

Accordingly, in block 3102, the SoC 100 is powered on. In block 3104, the PMC is powered on and performs initial security configuration in the SoC 100. In block 3106, the PMC loads an application into the SoC 100 to create a plurality of partitions and implements an application in each partition. Blocks 3102, 3104, and 3106 may be performed substantially as described in connection with blocks 3002, 3004, and 3006, respectively, of FIG. 30.

In block 3108, the PMC 1602 determines whether a trigger event has been detected. The trigger event may be detected by any of a variety of different circuits implemented within the SoC 100. Such circuits may detect trigger events within the SoC 100 itself and/or detect a trigger event from an external source. Such circuits, in response to detecting the trigger event, are capable of generating an interrupt that may be provided to the PMC 1602 and/or the primary partition. In some example implementations, the PMC 1602 may be included within the primary partition.

In response to detecting a trigger event, method 3100 continues to block 3110 to load a different PDI into the SoC 100 and execute the different PDI to create partitions and implement applications in the partitions. In the example of FIG. 31, the different PDI may configure the entirety of the SoC 100. While the partitions specified by the different PDI may be the same as those that existed prior to block 3108, the partitions may be entirely different. The applications implemented in the partition may also be different than those initially implemented in block 3106.

In loading the different PDI, the PMC 1602 is capable of performing blocks 2620 and 2626 of FIG. 26, for example. In illustration, the PMC 1602 authenticates the different PDI. The PMC 1602 then loads the different blocks of configuration data from the different PDI to allocate DPEs 204, tiles of PL 104, routes in the NoC 108, components of the PS 106, and/or hardwired circuit blocks 110 to the different partitions specified by the different PDI. Loading the different PDI in block 3110 illustrates an example of remapping where resources of the SoC 100 are effectively re-allocated to different partitions. Further, the resources in each partition may be reconfigured to implement different applications.

If a trigger event is not detected in block 3108, method 3100 may continue to loop through block 3108 to monitor for the occurrence of a trigger event. While looping, the partitioning implemented initially in block 3106 and the applications implemented in the respective partitions continue to operate.

Method 3100 may continue to iterate. The example of FIG. 31 illustrates the case where a plurality of different PDIs are available and the PMC 1602 loads different PDIs over time in response to different triggering events. It should be appreciated that each different type of triggering event that may be detected in block 3108 may be associated with a particular PDI. This allows the SoC 100 to be reconfigured as needed in response to different conditions. As noted, the reconfiguration extends across all subsystems of the SoC 100.

FIG. 32 illustrates another example method 3200 of implementing a PDI within the SoC 100 and performing partial reconfiguration of the SoC 100 over time. In the example of FIG. 32, the SoC 100 may be configured by loading a first PDI. The first PDI may specify a particular partitioning of the SoC 100. Subsequently, in response to a trigger event, the SoC 100 may undergo partial reconfiguration where the functions (e.g., applications) in one or more of the partitions are dynamically reconfigured. Whereas partial reconfiguration in conventional FPGA type devices involves only modifying the functions implemented in some portions of the PL 104 while other portions continue to operate uninterrupted, in the example of FIG. 32, partial reconfiguration is extended to any type of circuit and/or subsystem that is included in the partition undergoing partial reconfiguration.

Accordingly, in block 3202, the SoC 100 is powered on. In block 3204, the PMC is powered on and performs initial security configuration in the SoC 100. In block 3206, the PMC 1602 loads a PDI into the SoC 100 and executes the PDI to create a plurality of partitions and implement an application in each partition. The plurality of partitions include a primary partition (e.g., a shell or real-time processing domain) and one or more secondary partitions. Blocks 3202, 3204, and 3206 may be performed substantially as described in connection with blocks 3002, 3004, and 3006, respectively, of FIG. 30.

In block 3208, the PMC 1602 determines whether a trigger event has been detected for performing dynamic partial reconfiguration. The trigger event may be detected by any of a variety of different circuits implemented within the SoC 100. Such circuits may detect trigger events within the SoC 100 itself and/or detect a trigger event from an external source. Such circuits, in response to detecting the bigger event, are capable of generating an interrupt that may be provided to the PMC 1602 and/or the primary partition. In some example implementations, the PMC 1602 may be included within the primary partition. In response to detecting a trigger event, method 3200 continues to block 3210 to load a different PDI into the SoC 100 to reconfigure one or more partitions therein.

In the example of FIG. 32, the different PDI reconfigures a partition of the SoC 100 referred to as the "selected partition." The selected partition may be a secondary partition initially implemented in block 3206. Accordingly, whereas FIGS. 30 and 31 illustrate reconfiguration of the entire SoC 100, FIG. 32 illustrates partial reconfiguration for a single partition. That is, the different PDI includes only the configuration data for configuring (or reconfiguring) the particular portions of the PL 104, the portions of the PS 106, the portions of the NoC 108, the portions of the DPE array 102, and any hardwired circuit blocks 110 that are part of the selected partition.

In block 3210, the PMC 1602 loads the different PDI and executes the different PDI to dynamically reconfigure the selected partition. The different PDI includes the configuration data necessary for the PMC 1602 to configure any circuitry included in the selected partition that is being dynamically reconfigured. In performing block 3210, the PMC 1602 is capable of authenticating the different PDI as described in connection with block 2620 of FIG. 26. The PMC 1602 is further capable of performing block 2626 of FIG. 26 for those portions of the PL 104, the PS 106, the NoC 108, hardwired circuit blocks 110, and/or DPEs 204 that are part of the selected partition. The PMC 1602, for example, does not overwrite any other configuration data for any portions of the PL 104, the PS 106, the NoC 108, hardwired circuit blocks 110, and/or DPEs 204 that are not part of the selected partition.

It should be appreciated that while method 3200 describes partial reconfiguration of SoC 100 in connection with reconfiguring a single partition, in another aspect, partial reconfiguration may include reconfiguring more than one partition but fewer than all partitions in the SoC 100.

For purposes of illustration, consider an example where the PMC 1602 initially implements the architecture of FIG. 28 including a shell (not shown) in block 3206. In the FaaS example of FIG. 28, the PMC 1602 may be incorporated into the shell. The shell may be implemented as a static, unchanging region, that is capable of creating the partitions and controlling the applications implemented in the partitions, which are dynamically reconfigurable. Thus, the shell may include the PMC 1602 and is capable of controlling partial reconfiguration of each secondary partition. The shell may include external VOs and/or other support circuitry that remain active and connected to a host processing system while one or more or all of the secondary partitions are reconfigured. In still another example, the PMC 1602 may be separate from the shell, but only accessible by the shell.

Continuing with the FaaS example of FIG. 28, in block 3210, the PMC 1602 may reconfigure partition Y for use by user Z (e.g., another application or role). In reconfiguring the selected partition, the PMC 1602 is capable of performing processes similar to those described in connection with blocks 2620 and 2626 of FIG. 26. Rather than configuring the entirety of the SoC 100, however, the different PDI that is loaded and executed only causes the PMC 1602 to reconfigure those DPEs 204 of DPE array 102 of partition Y that are now used by user Z, those tiles of the PL 104 of partition Y that are now used by user Z, and those portions of the NoC 108 of partition Y that are now used by user Z to establish data paths among the circuitry for user Z. The PMC 1602 may also load configuration data (e.g., executable code and/or register settings) for portions of the PS 106 of partition Y to be used by user Z and/or for any hardwired circuit blocks of partition Y to be used by user Z.

It should be appreciated that the PMC 1602 does not write to configuration registers corresponding to resources (e.g., portions of PL 104, portions of PS 106, particular DPEs 204, portions of NoC 108, and/or hardwired circuit blocks 110) that are allocated to partition X. As such, the application implemented in partition X continues to operate uninterrupted while a different application corresponding to user Z is implemented in partition Y.

In another example, consider the case of FIG. 29. In that case, in block 3206, the PMC 1602 initially implements partitions 2902 and 2904. Partition 2902 implements an application corresponding to the low power domain (e.g., the RPU, a memory controller allocated thereto, and a pool of external RAM with connections established through the NoC 108 corresponding to partition 2902). The PMC 1602 further implements functions in partition 2904 which implements an application that utilizes one or more DPEs, implements one or more circuit blocks in the PL 104, and uses a memory controller and another pool of external RAM with connections established in the NoC 108 (e.g., corresponding to partition 2904).

Accordingly, in block 3210, the PMC 1602 loads the different PDI into the SoC 100 and executes the different PDI. The PMC 1602, for example, may implement a different application in partition 2904 to implement different functions therein depending upon the particular trigger event that is detected. Referring to the prior example, partition 2904 may be dynamically reconfigured from implementing a driving application to a parking application and vice versa. In the example of FIG. 32, while the SoC 100 undergoes dynamic partial reconfiguration to implement a different application in partition 2904, the resources allocated to partition 2904 remain unchanged.

In some cases, depending upon the security that is needed and degree of isolation between partitions, memory controllers and/or other circuit blocks may be shared among partitions. A shared memory controller still may enforce memory separation so that each partition is only able to access that partitions own pool of memory which is independent from the other partitions. In other cases, however, the partitions may have some shared memory.

In the automotive example, the SoC 100 implements applications that correspond to one user. That is, a particular entity may develop a plurality of applications that are to run concurrently in different partitions of the SoC 100. Though each of the applications may be owned by a same user, each application is to execute in a different isolated partition to meet safety requirements. The application using the low power domain and RPU, for example, may have these safety requirements requiring isolation from other applications. Further, in the automotive example, the PMC 1602 may operate at a level above the partitions that are implemented in the SoC 100 and provide the control necessary for the applications to execute concurrently and swap different applications in and out of the partitions (e.g., through partial reconfiguration).

If a trigger event is not detected, method 3200 continues to loop until a trigger event is detected. The SoC 100 continues to operate with each of the partitions operating as currently configured. The applications implemented in each of the partitions are capable of operating independently since each partition is isolated from the other. As noted, in some cases, doorbell interrupts may be used to cross from one partition to another to provide signaling and/or messaging between partitions.

It should be appreciated that while FIGS. 30-32 are described using the PMC 1602 to load different PDIs within the SoC 100, once the SoC 100 is booted and the PS 106 configured, a processor in the PS 106 may be used to control the loading of PDIs to reconfigure the SoC 100 in whole or in part (e.g., perform partial reconfiguration).

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at feast one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting (the stated condition or event)" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "real-time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A device can include programmable logic circuitry, a processor system coupled to the programmable logic circuitry, and a network-on-chip coupled to the programmable logic circuitry and the processor system. The network-on-chip is programmable to establish user specified data paths communicatively linking a circuit block implemented in the programmable logic circuitry and the processor system. The device can include a platform management controller that configures the programmable logic circuitry, the network-on-chip, and the processor system.

In another aspect, the programmable logic circuitry, the network-on-chip, and the processor system each is configured to implement a portion of a user application having a master node and a slave node, wherein the user application specifies the data paths and an implementation for each node within the programmable logic circuitry or the processor system.

In another aspect, the device includes a data processing engine array coupled to the network-on-chip, wherein the user specified data paths further communicatively link a data processing engine of the data processing engine array to at least one of the circuit block implemented in the programmable logic circuitry or the processor system.

In another aspect, the data processing engine array is configured to implement a portion of the user application, wherein the user application specifies an implementation of at least one of the nodes within the data processing engine array.

In another aspect, the device includes an application specific, hardwired circuit block coupled to the network-on-chip. The application specific, hardwired circuit block and the circuit block implemented in the programmable logic circuitry have common interfaces.

In another aspect, the network-on-chip and the programmable logic circuitry are configured to implement a plurality of independent partitions.

In another aspect, each partition implements a different application and the applications are isolated from one another.

In another aspect, the device includes programmable protection circuits configured to compare identifiers of transaction sources within received transactions with a list of authorized transaction sources.

In another aspect, the programmable protection circuits further compare addresses specified in the received transactions with allowed addresses for the identifier of the transaction source.

In another aspect, the processor system and the circuit block implemented in the programmable circuitry use a common descriptor format for communicating.

A method can include providing a device including programmable logic circuitry, a processor system coupled to the programmable logic circuitry, and a network-on-chip coupled to the programmable logic circuitry and the processor system. The network-on-chip is programmable to establish user specified data paths communicatively linking a circuit block implemented in the programmable logic circuitry and the processor system. The method can include configuring the programmable logic circuitry, the network-on-chip, and the processor system using a platform management controller disposed in the device.

In another aspect, the method includes configuring each of the programmable logic circuitry, the network-on-chip, and the processor system to implement a portion of a user application having a master node and a slave node, wherein the user application specifies the data paths and an implementation for each node within the programmable logic circuitry or the processor system.

In another aspect, the device includes a data processing engine array coupled to the network-on-chip. The user specified data paths communicatively link a data processing engine of the data processing engine array to at least one of the circuit block implemented in the programmable logic circuitry or the processor system.

In another aspect, the method includes configuring the data processing engine array to implement a portion of the user application, wherein the user application specifies an implementation of at least one of the nodes within the data processing engine array.

In another aspect, the device includes an application specific, hardwired circuit block coupled to the network-on-chip. In that case, the method can include providing a common interface for the application specific, hardwired circuit block and the circuit block implemented in the programmable logic circuitry.

In another aspect, the method includes configuring the network-on-chip and the programmable logic circuitry to implement a plurality of independent partitions.

In another aspect, the method includes dynamically reconfiguring at least one of the plurality of independent partitions.

In another aspect, the method includes implementing a different application in each partition and isolating the applications from one another.

In another aspect, the method includes providing programmable protection circuits in the device and configuring the programmable protection circuits to compare identifiers of transaction sources within received transactions with a list of authorized transaction sources.

In another aspect, the method includes configuring the programmable protection circuits to compare addresses specified in the received transactions with allowed addresses for the identifier of the transaction source.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A System-on-Chip, comprising:
    a first partition configured to implement a first application using at least a first portion of one or more of a plurality of subsystems of the System-on-Chip; and
    a second partition configured to implement a second application concurrently with the first partition, wherein the second application uses at least a second portion of the one or more of the plurality of subsystems;
    wherein the first partition is isolated from the second partition;
    wherein the first partition is firewalled from the second partition; and
    wherein memory protection circuitry prevents each partition from accessing portions of memory allocated to the other partition.

2. The System-on-Chip of claim 1, wherein the first application and the second application are automotive applications.

3. The System-on-Chip of claim 1, wherein the first partition is implemented as an encrypted partition and the second partition is implemented as an unencrypted partition.

4. The System-on-Chip of claim 3, wherein the first application is configured to perform safety critical features.

5. The System-on-Chip of claim 3, wherein the first application is configured to perform one or more real-time functions.

6. The System-on-Chip of claim 1, wherein the first partition includes a real-time processor and the second partition includes programmable circuitry.

7. The System-on-Chip of claim 6, wherein the first application is configured to perform one or more real-time functions using the real-time processor.

8. The System-on-Chip of claim 6, wherein the programmable circuitry includes programmable logic coupled to a plurality of data processing engines of a data processing engine array.

9. The System-on-Chip of claim 8, wherein the second application is configured to perform at least one of a computer vision function or a machine learning function.

10. The System-on-Chip of claim 1, wherein:
    one of the plurality of subsystems is a Network-on-Chip;
    the Network-on-Chip implements a plurality of data paths including first data paths used by the first application and second data paths used by the second application, wherein the first data paths are isolated from the second data paths; and
    each data path of the plurality of data paths is controlled by a Quality of Service parameter for the Network-on-Chip.

11. The System-on-Chip of claim 1, wherein at least one of the first partition or the second partition is dynamically reconfigured to implement a different application configured to perform a different function.

12. The System-on-Chip of claim 1, wherein the second application is configured to process a first set of signals from a first set of sensors, and wherein the second partition is dynamically reconfigured to implement a third application configured to process a second set of signals from a second and different set of sensors.

13. The System-on-Chip of claim 1, wherein the second application is configured to process a first set of signals from a first set of sensors, and wherein the second partition is dynamically reconfigured to implement a third application configured to implement a different function using the first set of signals from the first set of sensors.

14. The System-on-Chip of claim 1, wherein the second application performs a plurality of functions and is dynamically reconfigured to change at least one of the plurality of functions.

15. A System-on-Chip, comprising:
- a first partition configured to implement a first application using at least a first portion of one or more of a plurality of subsystems of the System-on-Chip; and
- a second partition configured to implement a second application concurrently with the first partition, wherein the second application uses at least a second portion of the one or more of the plurality of subsystems;
- wherein the first partition is isolated from the second partition;
- wherein one of the plurality of subsystems is a Network-on-Chip;
- wherein the Network-on-Chip implements a plurality of data paths including first data paths used by the first application and second data paths used by the second application, wherein the first data paths are isolated from the second data paths; and
- wherein each data path of the plurality of data paths is controlled by a Quality of Service parameter for the Network-on-Chip.

16. A System-on-Chip, comprising:
- a first partition configured to implement a first application using at least a first portion of one or more of a plurality of subsystems of the System-on-Chip; and
- a second partition configured to implement a second application concurrently with the first partition, wherein the second application uses at least a second portion of the one or more of the plurality of subsystems;
- wherein the first partition is isolated from the second partition; and
- wherein:
  - the second application is configured to process a first set of signals from a first set of sensors, and wherein the second partition is dynamically reconfigured to implement a third application configured to process a second set of signals from a second and different set of sensors; or
  - the second application is configured to process a first set of signals from a first set of sensors, and wherein the second partition is dynamically reconfigured to implement a third application configured to implement a different function using the first set of signals from the first set of sensors.

* * * * *